US009613975B2

(12) United States Patent
Huang et al.

(10) Patent No.: US 9,613,975 B2
(45) Date of Patent: Apr. 4, 2017

(54) BRIDGE LINE STRUCTURE FOR BIT LINE CONNECTION IN A THREE-DIMENSIONAL SEMICONDUCTOR DEVICE

(71) Applicant: SANDISK TECHNOLOGIES INC., Plano, TX (US)

(72) Inventors: Chenche Huang, Campbell, CA (US);
Chun-Ming Wang, Fremont, CA (US);
Yuki Mizutani, San Jose, CA (US);
Hiroaki Koketsu, Yokkaichi (JP);
Masayuki Hiroi, Yokkaichi (JP);
Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/675,162

(22) Filed: Mar. 31, 2015

(65) Prior Publication Data
US 2016/0293621 A1    Oct. 6, 2016

(51) Int. Cl.
| | | |
|---|---|---|
| *H01L 29/76* | (2006.01) | |
| *H01L 27/11578* | (2017.01) | |
| *H01L 27/02* | (2006.01) | |
| *H01L 27/11524* | (2017.01) | |
| *H01L 27/11551* | (2017.01) | |

(Continued)

(52) U.S. Cl.
CPC .... *H01L 27/11578* (2013.01); *H01L 27/0207* (2013.01); *H01L 27/1157* (2013.01); *H01L 27/11524* (2013.01); *H01L 27/11551* (2013.01); *H01L 27/11582* (2013.01)

(58) Field of Classification Search
CPC ............... H01L 27/11582; H01L 27/1157
USPC .......................... 257/314; 438/268
See application file for complete search history.

(56) References Cited

U.S. PATENT DOCUMENTS

| | | | |
|---|---|---|---|
| 5,915,167 A | 6/1999 | Leedy | |
| 2010/0177566 A1* | 7/2010 | Kim ................. | G11C 16/0483 365/185.17 |
| 2010/0213526 A1 | 8/2010 | Wada et al. | |

(Continued)

OTHER PUBLICATIONS

U.S. Appl. No. 14/620,593, filed Feb. 12, 2015, SanDisk Technologies Inc.

(Continued)

*Primary Examiner* — Jami M Valentine
(74) *Attorney, Agent, or Firm* — The Marbury Law Group PLLC

(57) ABSTRACT

A structure is formed on a substrate, which includes a stack of alternating layers comprising insulating layers and electrically conductive layers and a plurality of memory stack structures extending through the stack. At least one bridge line structure is formed on top surfaces of a respective subset of the plurality of memory stack structures to provide local lateral electrical connection. At least one dielectric material layer is formed over the at least one bridge line structure and the plurality of memory stack structures. A plurality contact via structures is formed through the dielectric material layer. The plurality of contact via structures includes at least one first contact via structure contacting a top surface of a respective bridge line structure, and second contact via structures contacting a top surface of a respective memory stack structure.

23 Claims, 74 Drawing Sheets

(51) Int. Cl.
*H01L 27/1157* (2017.01)
*H01L 27/11582* (2017.01)

(56) References Cited

U.S. PATENT DOCUMENTS

| | | | | |
|---|---|---|---|---|
| 2010/0244119 | A1* | 9/2010 | Fukuzumi | H01L 27/11578 257/324 |
| 2011/0299314 | A1* | 12/2011 | Samachisa | G11C 13/003 365/51 |
| 2013/0210211 | A1* | 8/2013 | Vereen | H01L 45/1233 438/382 |
| 2015/0054058 | A1 | 2/2015 | Seol et al. | |
| 2015/0318298 | A1* | 11/2015 | Matsudaira | H01L 27/1157 257/314 |
| 2016/0056210 | A1* | 2/2016 | Takaki | H01L 21/32139 257/5 |

OTHER PUBLICATIONS

U.S. Appl. No. 14/498,033, filed Sep. 26, 2014, SanDisk Technologies Inc.
Notification of Transmittal of the International Search Report and the Written Opinion of the International Searching Authority for International Application No. PCT/US2015/062765, dated May 23, 2016, 20 pages.
Invitation to Pay Additional Fees and, Where Applicable, Protest Fee for International Application No. PCT/US2015/062765, dated May 11, 2016, 10 pages.

* cited by examiner

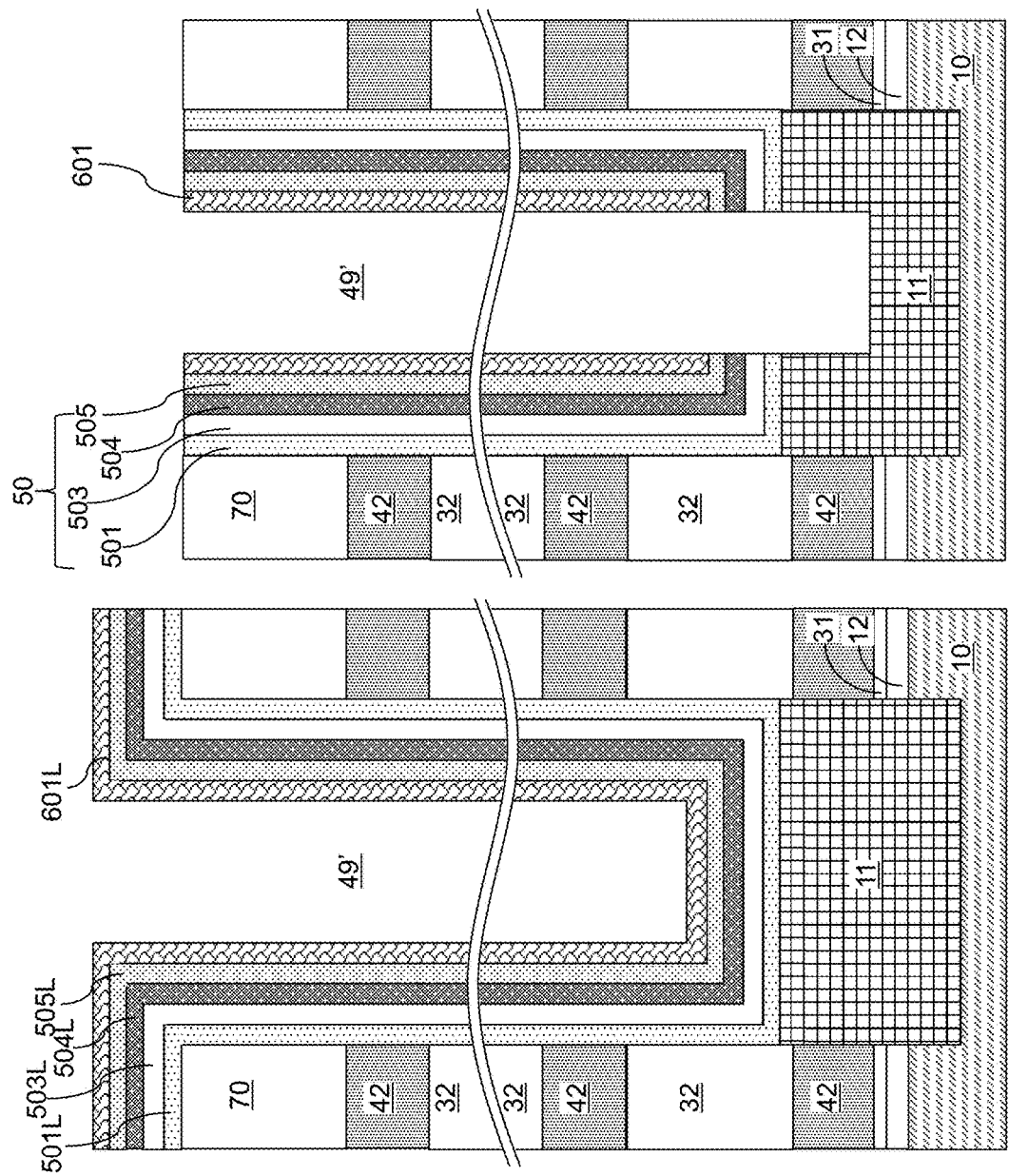

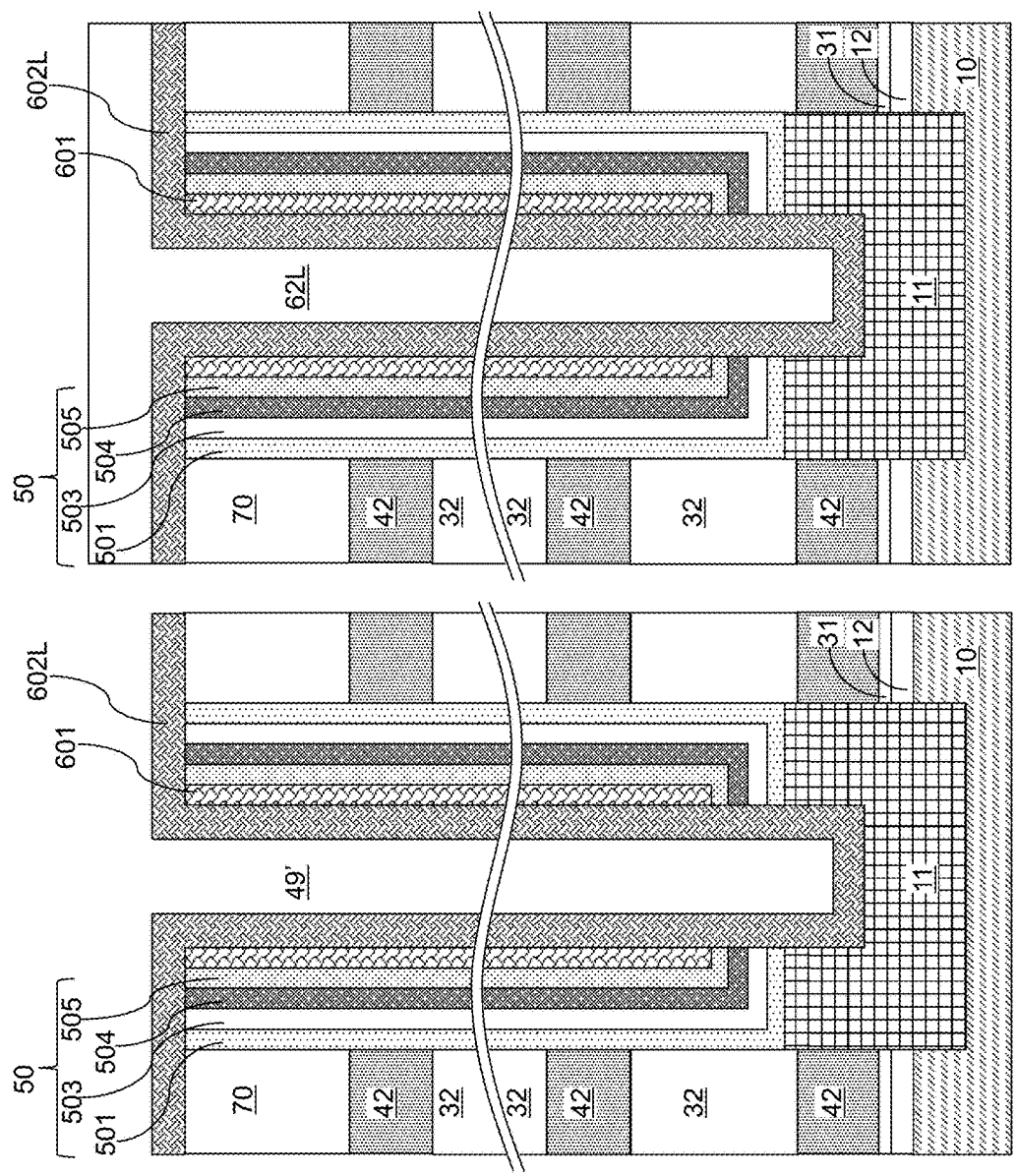

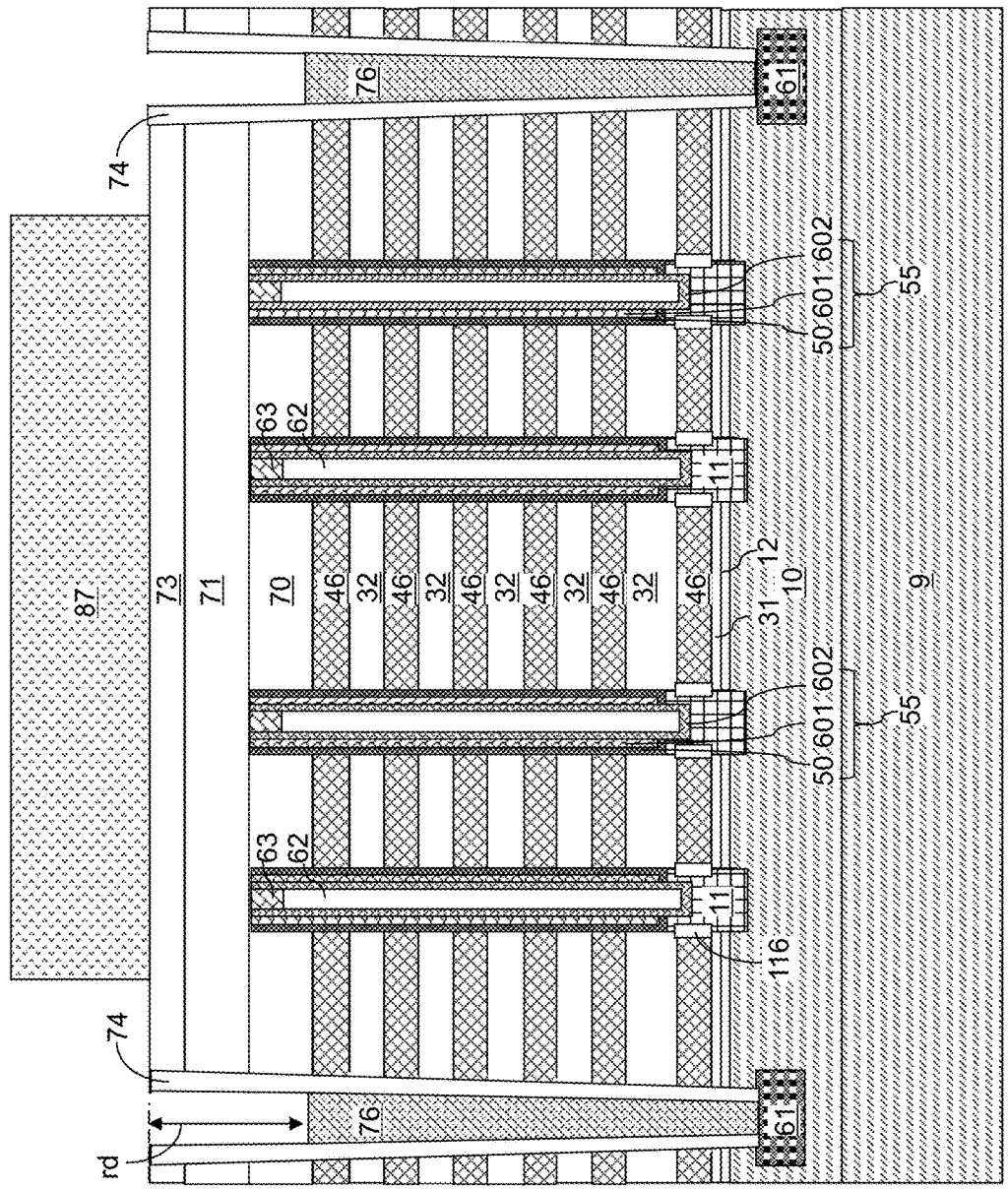

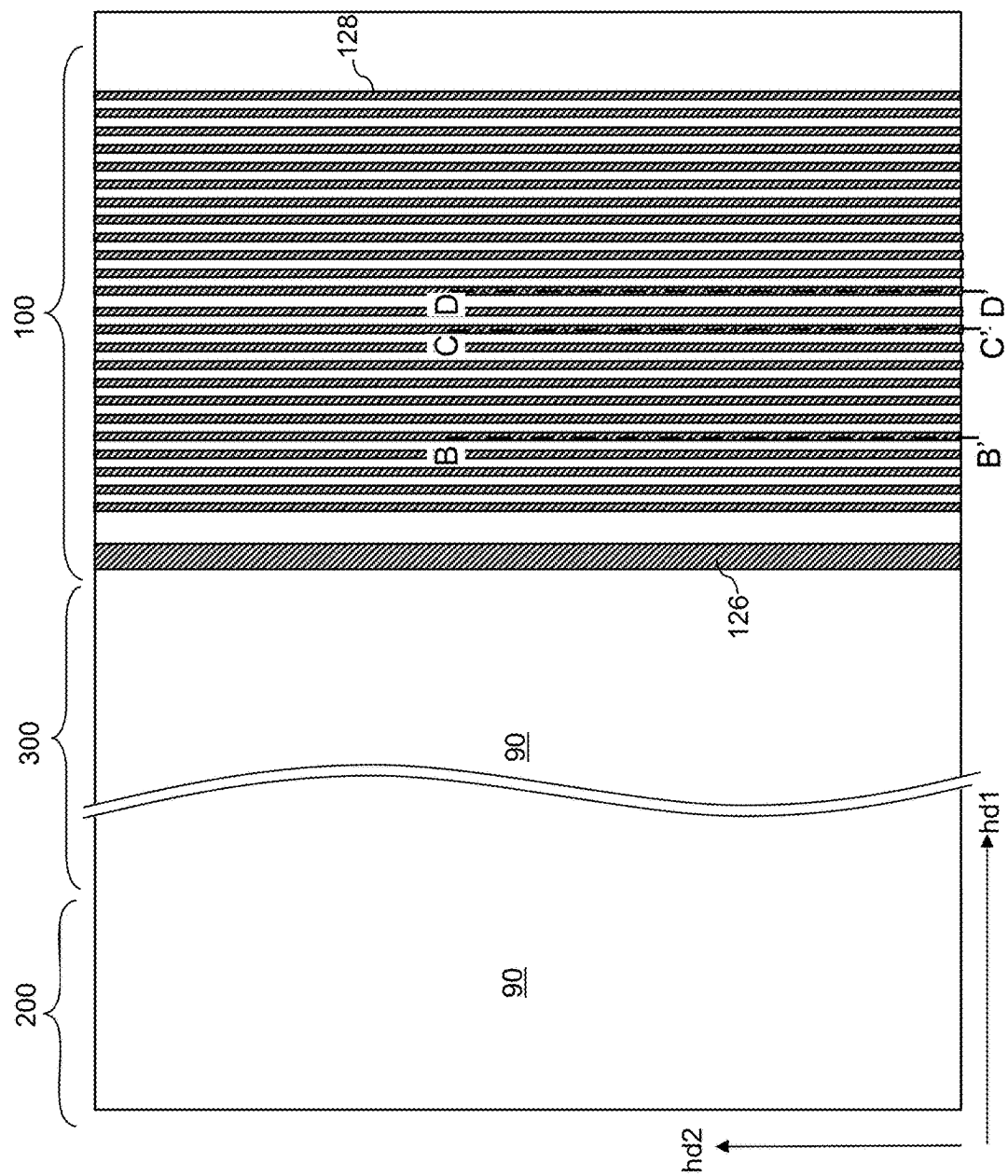

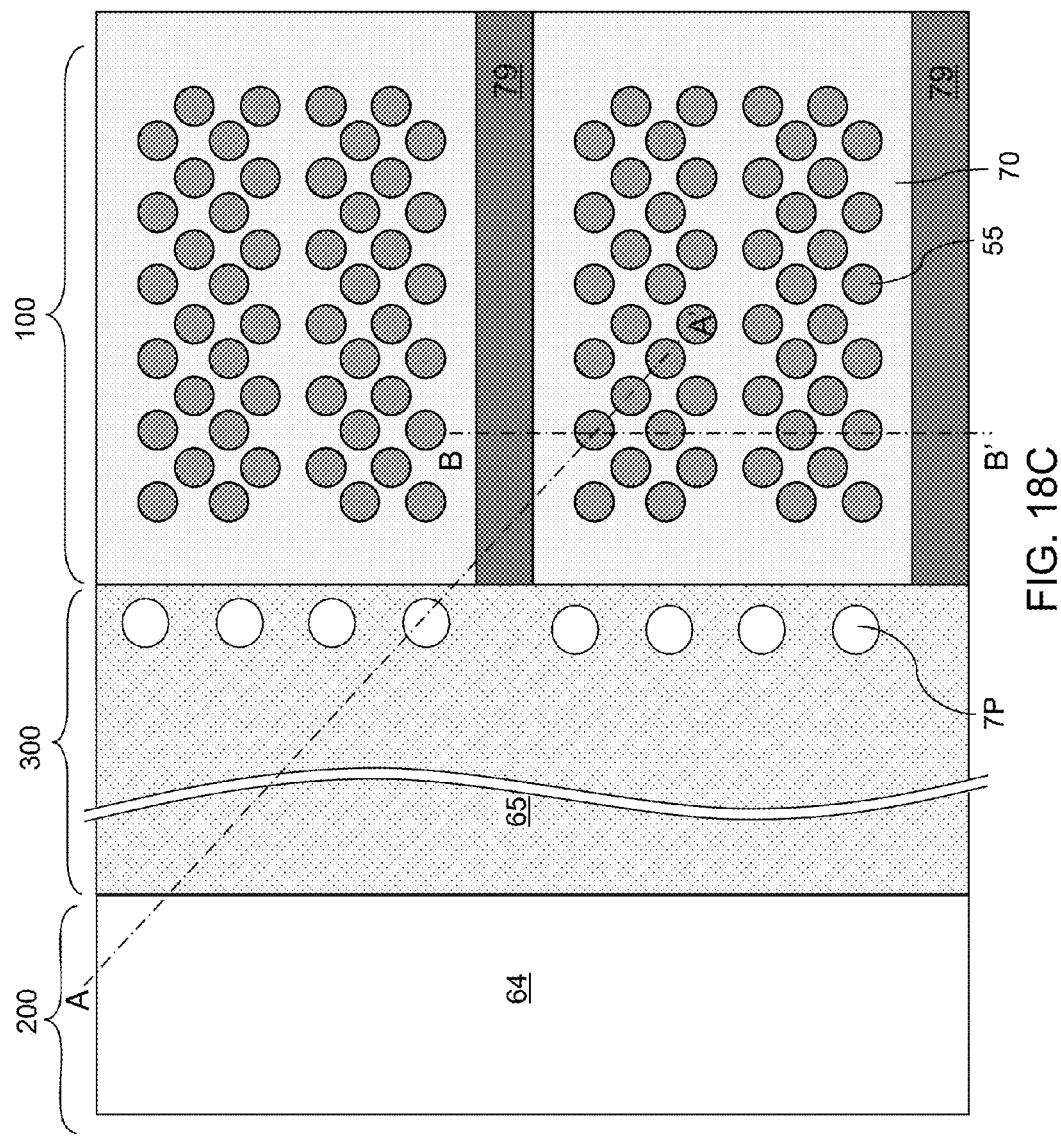

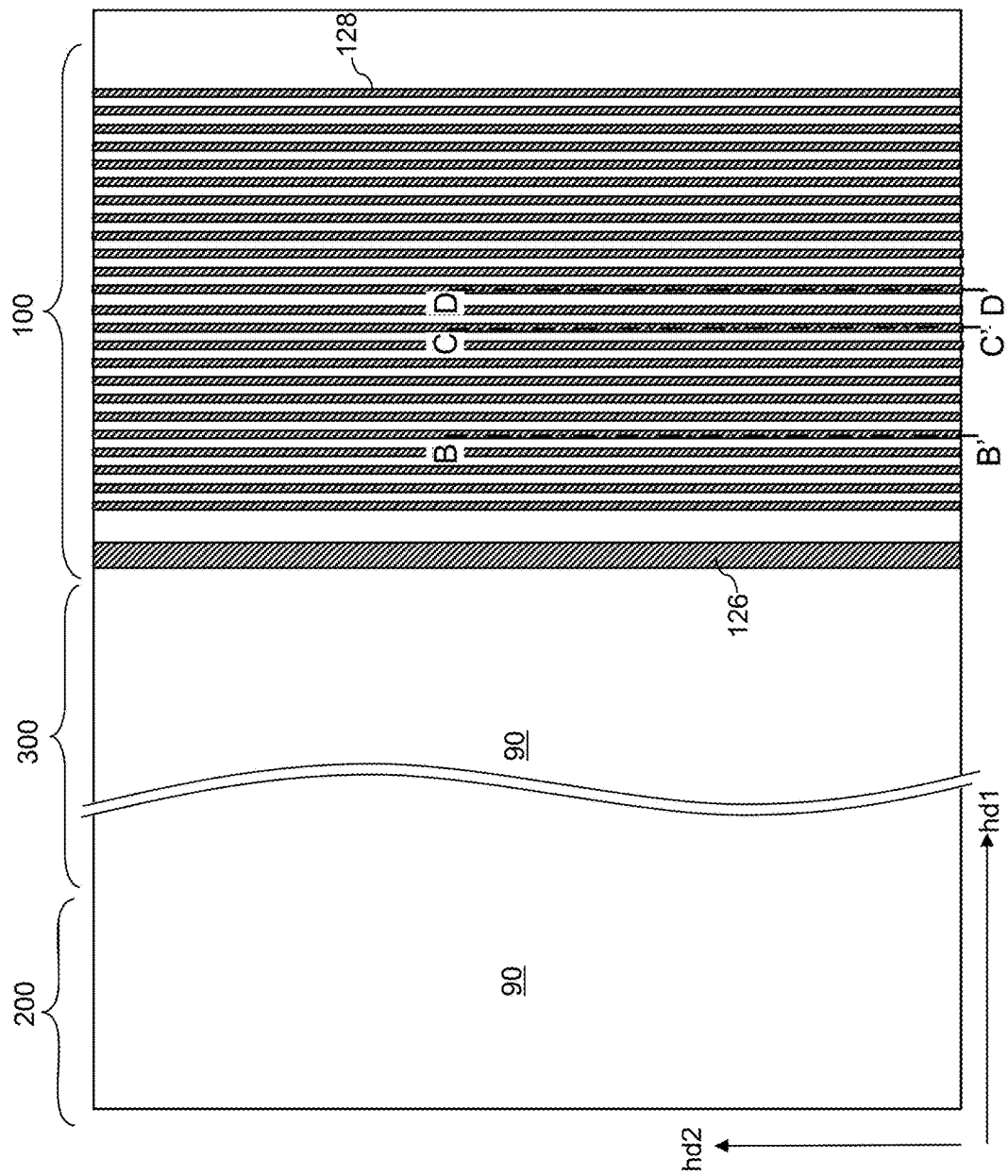

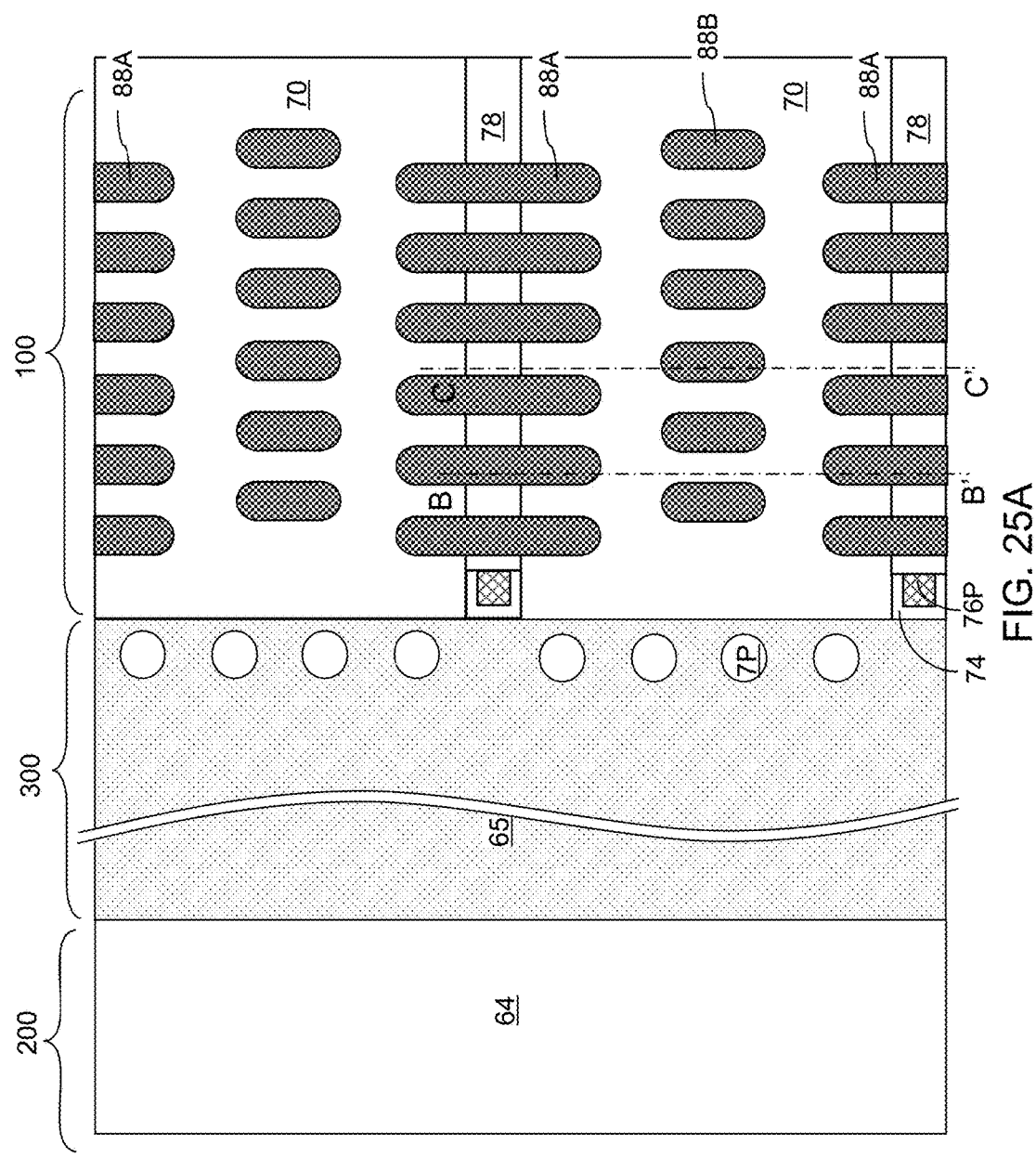

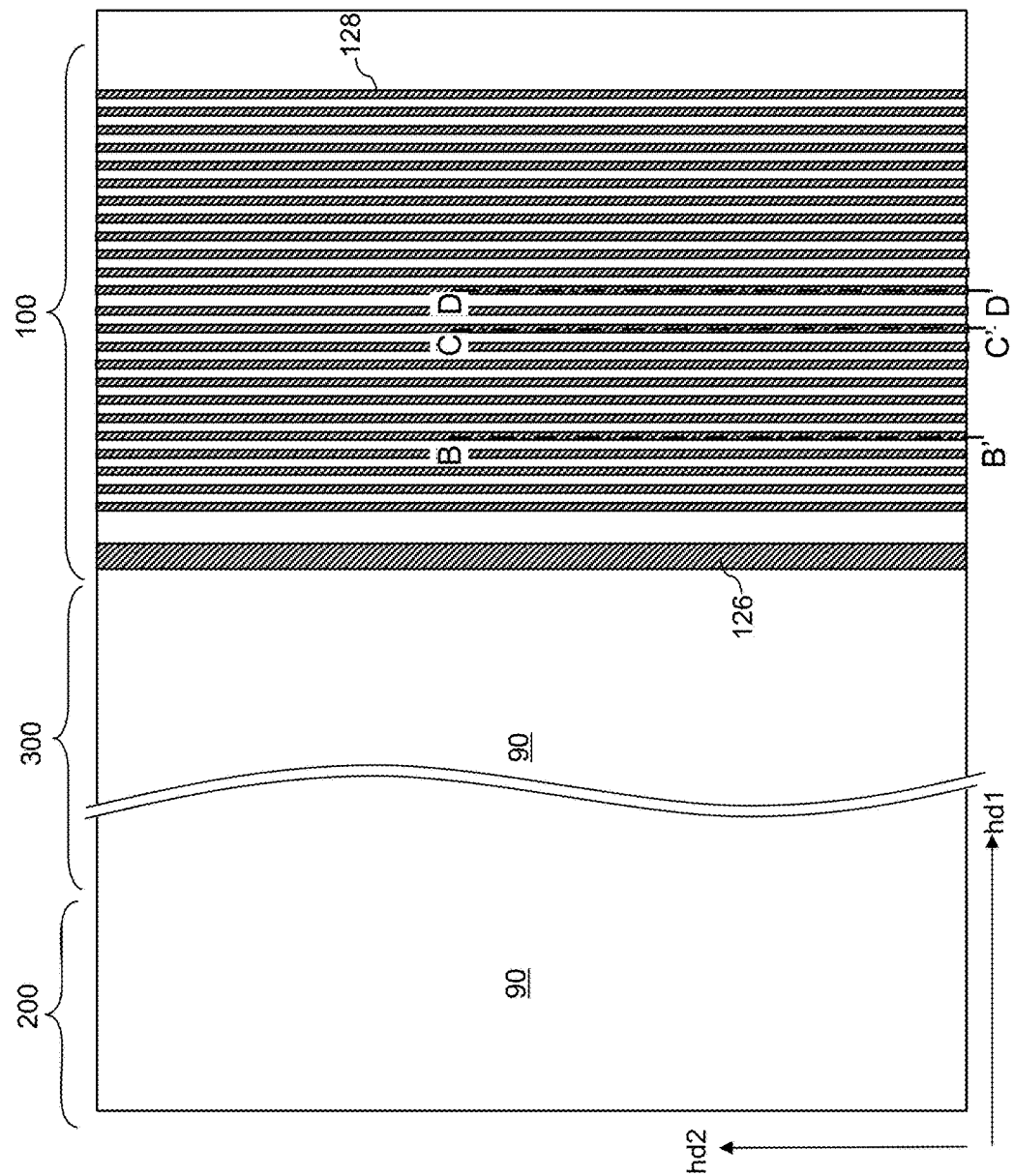

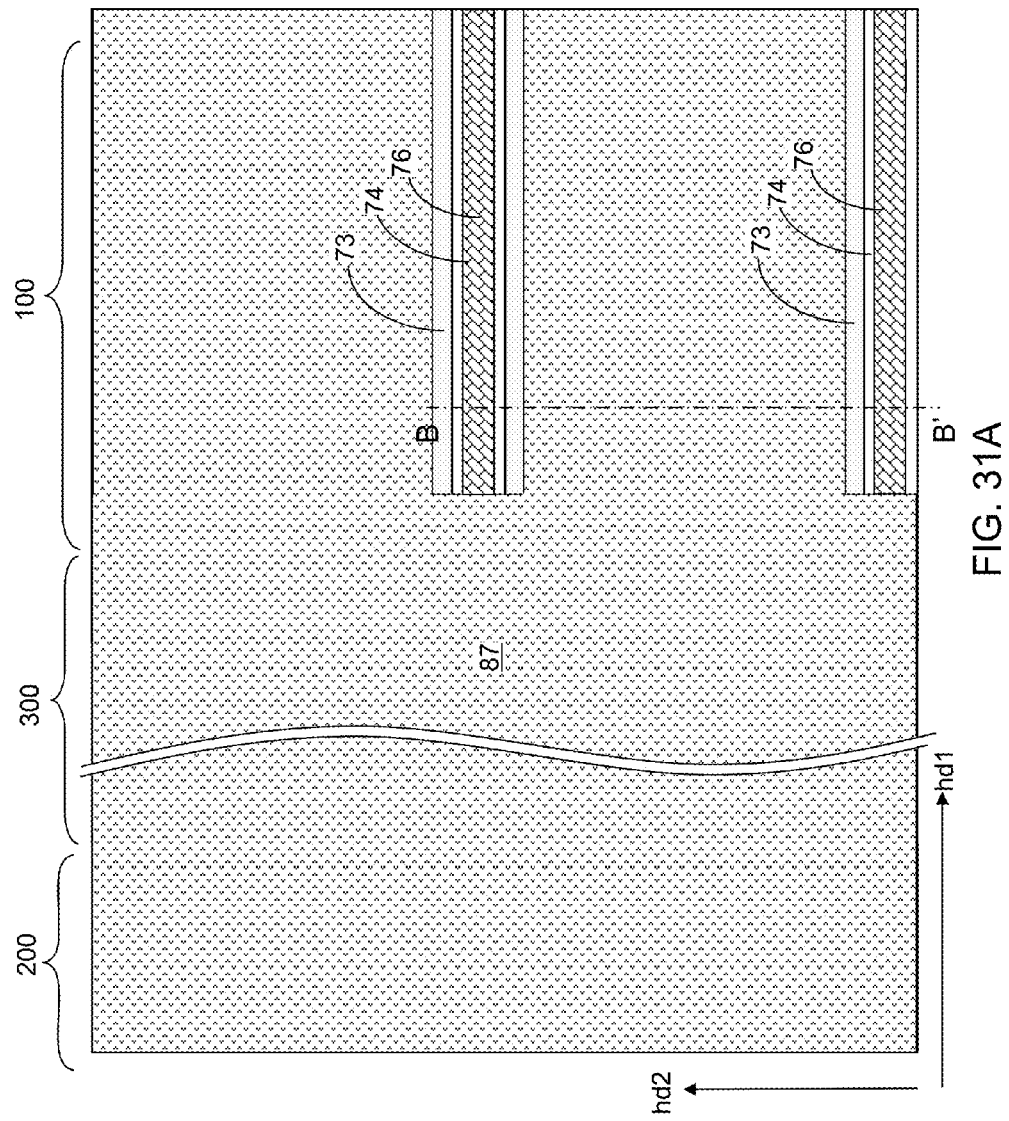

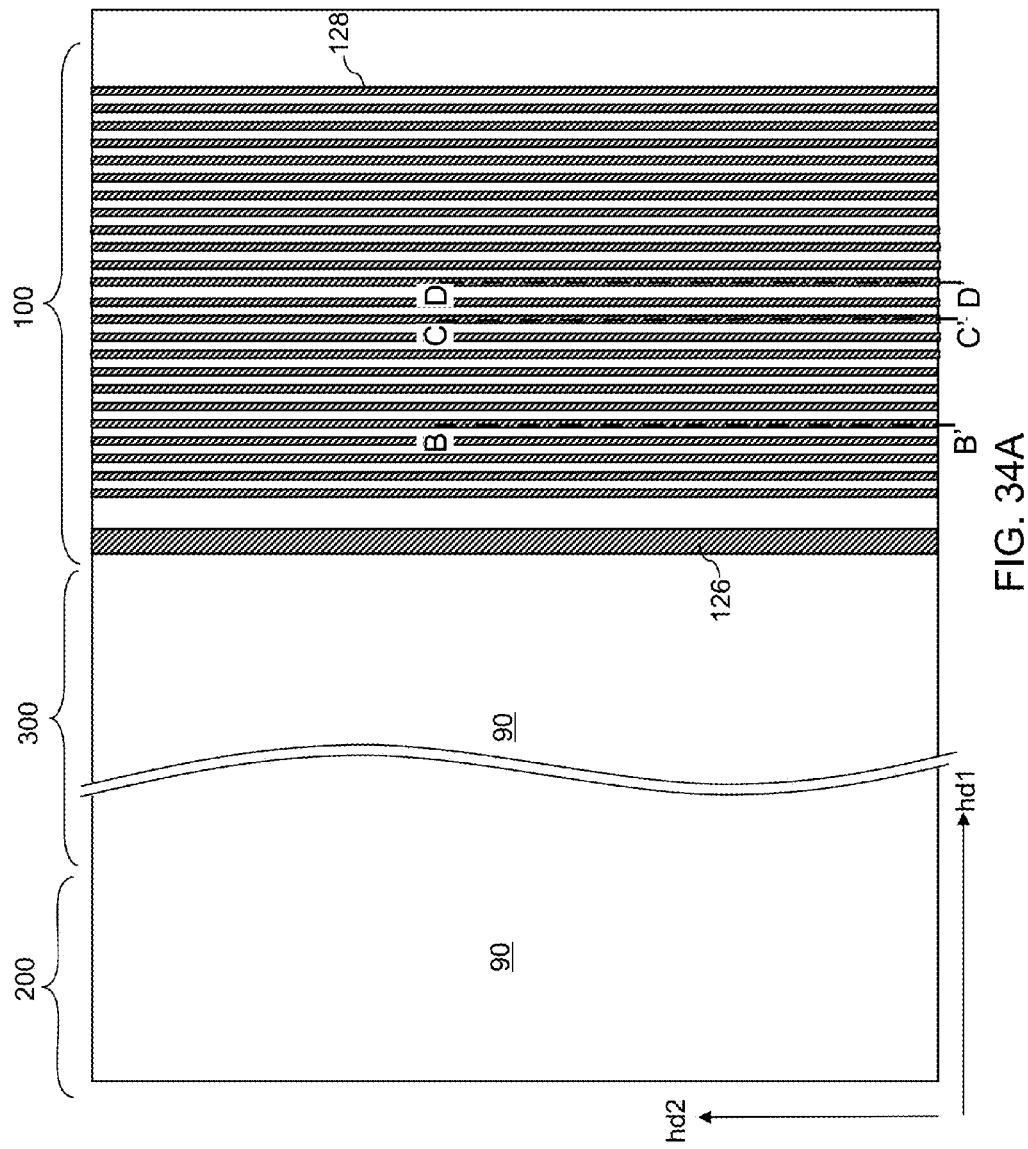

US 9,613,975 B2

BRIDGE LINE STRUCTURE FOR BIT LINE CONNECTION IN A THREE-DIMENSIONAL SEMICONDUCTOR DEVICE

FIELD

The present disclosure relates generally to the field of semiconductor devices and specifically to metal interconnect structures for providing electrical connection to three-dimensional semiconductor devices, such as vertical NAND strings, and methods of making thereof.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. For example, a 3D NAND stacked memory device may include a high density of bit lines electrically connected to respective drain regions through underlying contact via structures. Misalignment between the contact via structures and the bit lines can cause undesirable electrical shorts or electrical opens.

SUMMARY

According to an aspect of the present disclosure, a monolithic three-dimensional memory device is provided, which comprises a stack of alternating layers comprising insulating layers and electrically conductive layers and located over a substrate; a plurality of memory stack structures extending through the stack; at least one bridge line structure contacting top surfaces of a respective subset of the plurality of memory stack structures; an array of bit line structures overlying the at least one bridge line structure; at least one first contact via structure contacting a respective bit line structure within the array of bit line structures and contacting a respective bridge line structure; and second contact via structures contacting a respective bit line structure within the array of bit line structures and contacting a respective memory stack structure.

According to another aspect of the present disclosure, a method of manufacturing a memory device is provided. A stack of alternating layers comprising insulating layers and material layers is formed over a substrate. A plurality of memory stack structures is formed through the stack. At least one bridge line structure is formed on top surfaces of a respective subset of the plurality of memory stack structures. A dielectric material layer is formed over the at least one bridge line structure and the plurality of memory stack structures. A plurality contact via cavities is formed through the dielectric material layer. The plurality of contact via cavities comprises at least one first via cavity underneath which a top surface of a respective bridge line structure is physically exposed, and second via cavities underneath which a top surface of a respective memory stack structure is physically exposed. A plurality of contact via structures is formed by filling the first and second via cavities with at least one conductive material.

According to yet another aspect of the present disclosure, a monolithic three-dimensional memory device is provided, which comprises a stack of alternating layers comprising insulating layers and electrically conductive layers and located over a substrate; a plurality of memory stack structures extending through the stack; at least one bridge line structure contacting top surfaces of a respective subset of the plurality of memory stack structures; and bridge level via structures located at a same level as the at least one bridge line structure. Each of the bridge level via structures contacts no more than a respective single memory stack structure among the plurality of memory stack structures. The monolithic three-dimensional memory device further comprises an array of bit line structures overlying the at least one bridge line structure; at least one first contact via structure contacting a respective bit line structure within the array of bit line structures and contacting a respective bridge line structure; and second contact via structures contacting a respective bit line structure within the array of bit line structures and contacting a respective bridge level via structure.

According to still another aspect of the present disclosure, a method of manufacturing a memory device is provided. A stack of alternating layers comprising insulating layers and material layers is formed over a substrate. A plurality of memory stack structures is formed through the stack. At least one bridge line structure and bridge level via structures are simultaneously formed. The at least one bridge line structure is formed on top surfaces of a respective subset of the plurality of memory stack structures, and each of the bridge level via structures contacts no more than a respective single memory stack structure among the plurality of memory stack structures. At least one dielectric material layer is formed over the at least one bridge line structure and the bridge level via structures. A plurality contact via cavities is formed through the at least one dielectric material layer. The plurality of contact via cavities comprises at least one first via cavity underneath which a top surface of a respective bridge line structure is physically exposed, and second via cavities underneath which a top surface of a respective bridge level via structure is physically exposed. A plurality of contact via structures is formed by filling the first and second via cavities with at least one conductive material.

According to even another aspect of the present disclosure, a monolithic three-dimensional memory device is provided, which comprises: a stack of alternating layers comprising insulating layers and electrically conductive layers and located over a substrate; a plurality of memory stack structures extending through the stack; an array of memory contact via structures overlying each of the plurality of memory stack structures; at least one bridge line structure contacting top surfaces of a respective subset of memory contact via structures; an array of bit line structures overlying the at least one bridge line structure; at least one first contact via structure contacting a respective bit line structure within the array of bit line structures and contacting a respective bridge line structure; and second contact via structures contacting a respective bit line structure within the array of bit line structures and contacting a respective memory contact via structure.

According to a further embodiment of the present disclosure, a method of manufacturing a memory device is provided. A stack of alternating layers comprising insulating layers and material layers is formed over a substrate. A plurality of memory stack structures is formed through the stack. An array of memory contact via structures is formed over the plurality of memory stack structures. At least one bridge line structure is formed on top surfaces of a respective subset of memory contact via structures. At least one dielectric material layer is formed over the at least one bridge line structure and the array of memory contact via structures. A plurality contact via cavities is formed through the at least one dielectric material layer. The plurality of contact via cavities comprises at least one first via cavity underneath which a top surface of a respective bridge line structure is physically exposed, and second via cavities underneath which a top surface of a respective memory contact via structure is physically exposed. A plurality of contact via structures is formed by filling the first and second via cavities with at least one conductive material.

BRIEF DESCRIPTION OF THE DRAWINGS

FIGS. 2A-2F are sequential vertical cross-sectional views of a memory opening within the first exemplary structure during various processing steps employed to form a memory stack structure according to the first embodiment of the present disclosure.

FIG. 8B is vertical cross-sectional views of the first exemplary structure along to the vertical plane of B-B' in FIG. 8A

FIG. 11A is a top-down view of the first exemplary structure after formation of bit line contact via structures and bit line structures according to the first embodiment of the present disclosure.

FIG. 18C is a top-down view of the second exemplary structure of FIG. 18A. The vertical plane A-A' is the plane of the vertical cross-sectional view of FIG. 18A. The vertical plane B-B' is the plane of the vertical cross-sectional view of FIG. 18B.

FIG. 24A is a top-down view of the second exemplary structure after formation of bit line contact via structures and bit line structures according to the second embodiment of the present disclosure.

FIG. 25A is a top-down view of a third exemplary structure after formation of bridge line structures connecting memory stack structures and bridge level contact via structures according to a third embodiment of the present disclosure. A bridge level dielectric layer is not shown in this see-through view.

FIG. 26A is a top-down view of the third exemplary structure after formation of bit line contact via structures and bit line structures according to the third embodiment of the present disclosure.

FIG. 31A is a top-down view of the fourth exemplary structure after application and patterning of a photoresist layer, and recessing of the backside contact via structures according to the fourth embodiment of the present disclosure.

FIG. 34A is a top-down view of the fourth exemplary structure after formation of bit line contact via structures and bit line structures according to the fourth embodiment of the present disclosure.

DETAILED DESCRIPTION

Figure 1:
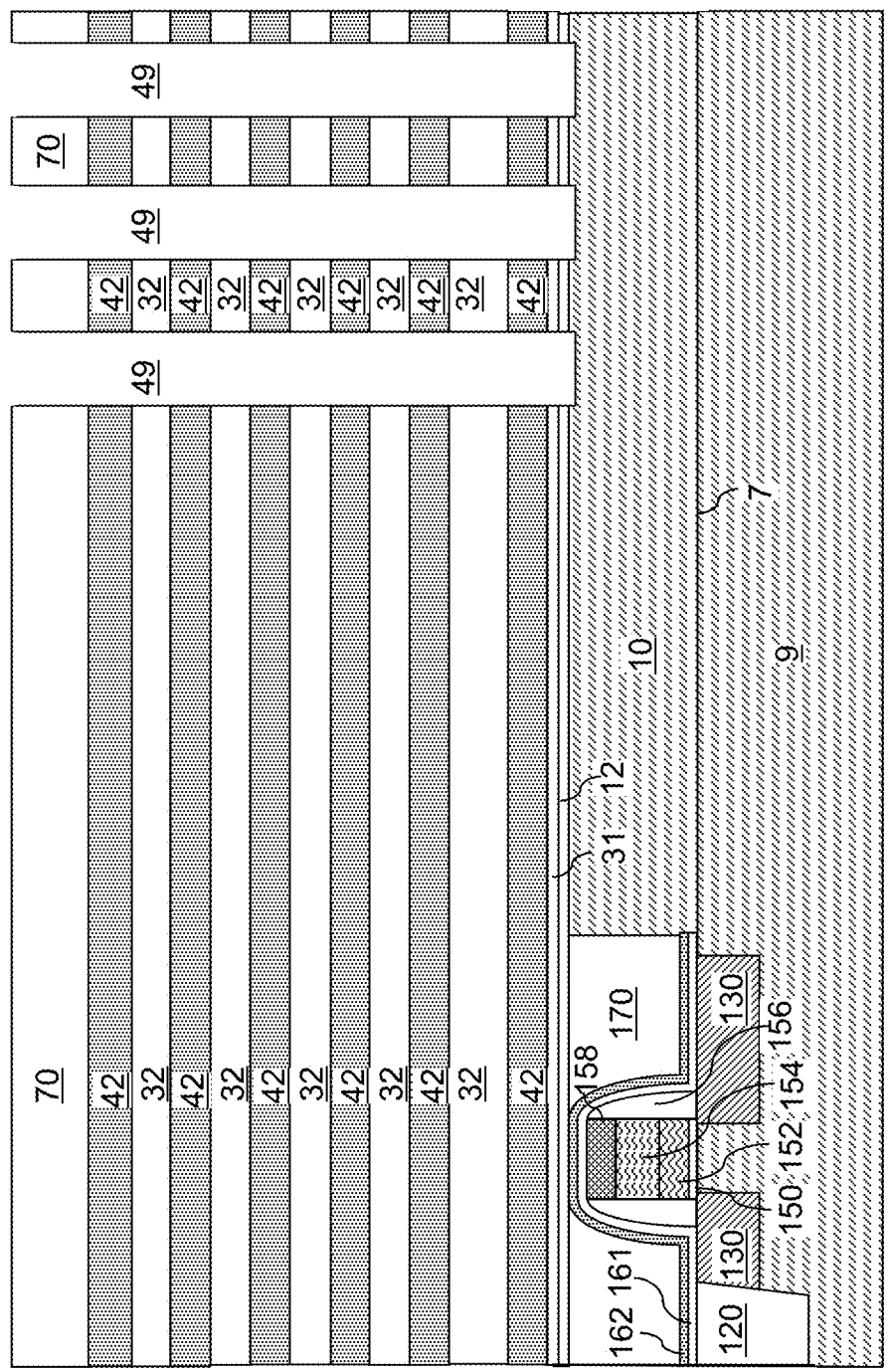
FIG. 1 is a vertical cross-sectional view of a first exemplary structure after formation of a stack including an alternating plurality of material layers and memory openings extending through the stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

In vertical cross-sectional views in which the vertical plane of the cross-section does not pass through the geometrical centers of memory stack structures, the memory stack structures are illustrated employing a vertical cross-sectional profile within a vertical plane that passes through the geometrical centers of the memory stack structures for simplicity. It is to be understood that a true vertical cross-sectional profile would cut through a peripheral portion of the memory stack structures, and consequently, not all elements within the memory stack structures may be visible in a true vertical cross-sectional view.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical resistivity in a range from 1.0 S/cm to $1.0 \times 10^5$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one insulating material. As such, each insulator layer 32 can be an insulating material layer. Insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the first exemplary structure during formation of an exemplary memory stack structure according to a first embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

An epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501Lincludes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide (Al2O3), hafnium oxide (HfO2), lanthanum oxide (LaO2), yttrium oxide (Y2O3), tantalum oxide (Ta2O5), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501Lincludes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501Land/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 505l, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (SOIL, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 505, the charge storage element 504, and the at least one blocking dielectric (501, 503). Optionally, the physically exposed portion of the epitaxial channel portion 11 can be vertically recessed. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2E:
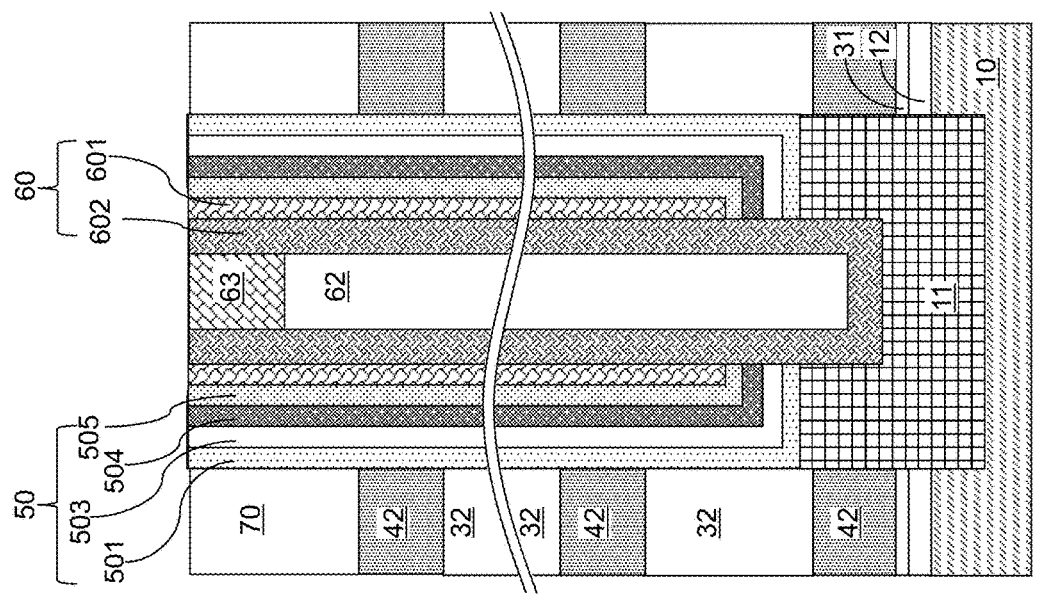

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Figure 2F:
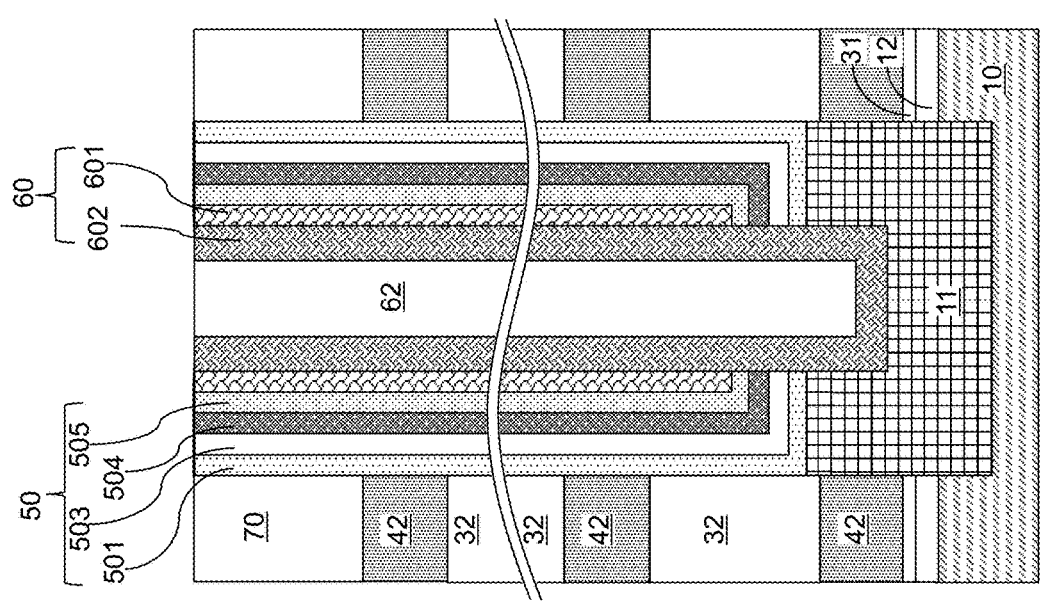

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
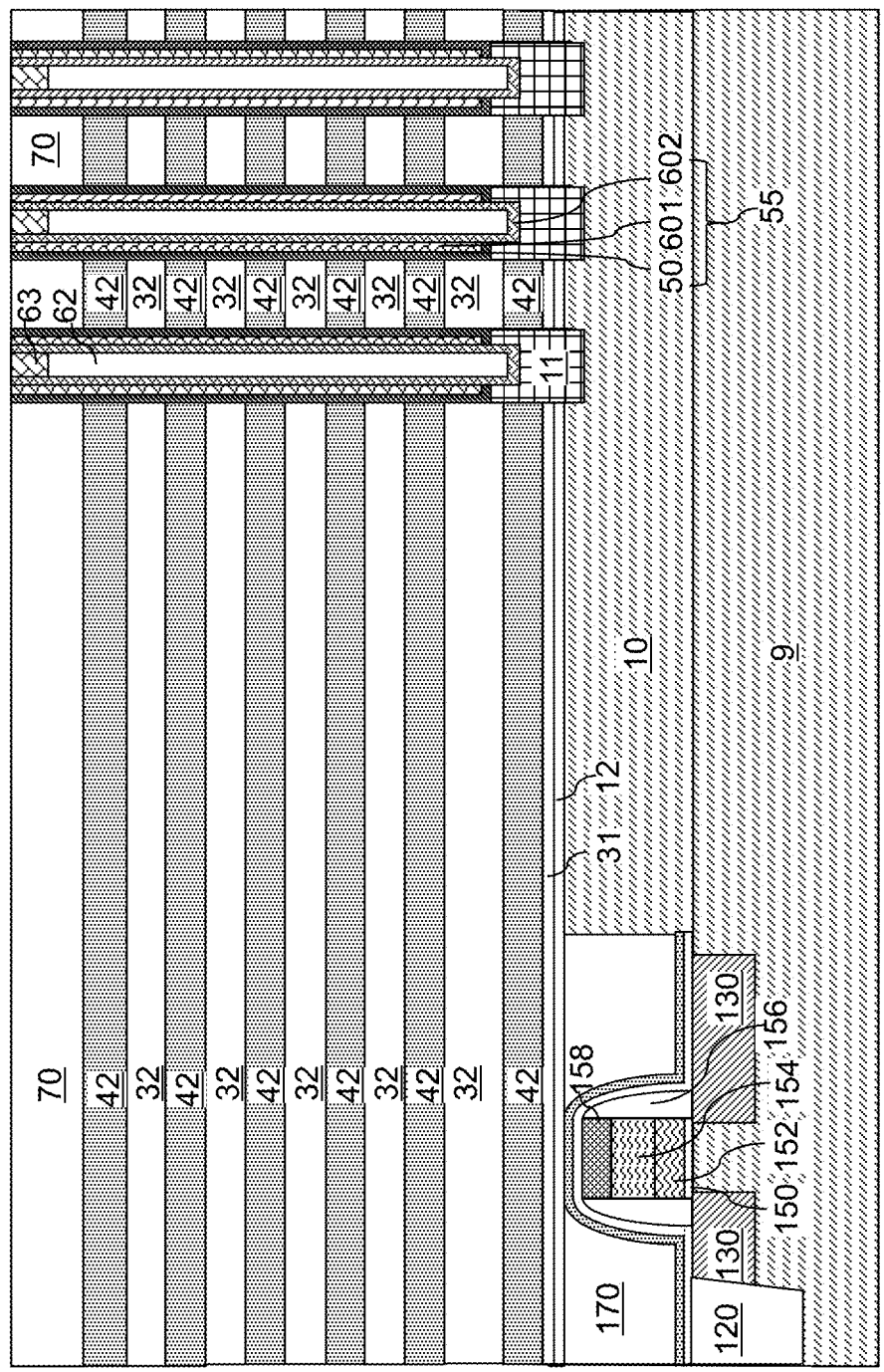
FIG. 3 is a vertical cross-sectional view of the first exemplary structure after formation of memory stack structures according to the first embodiment of the present disclosure.

The exemplary memory stack structure can be embedded into the first exemplary structure illustrated in FIG. 1. FIG. 3 illustrates the first exemplary structure that incorporates multiple instances of the exemplary memory stack structure of FIG. 2F. The first exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
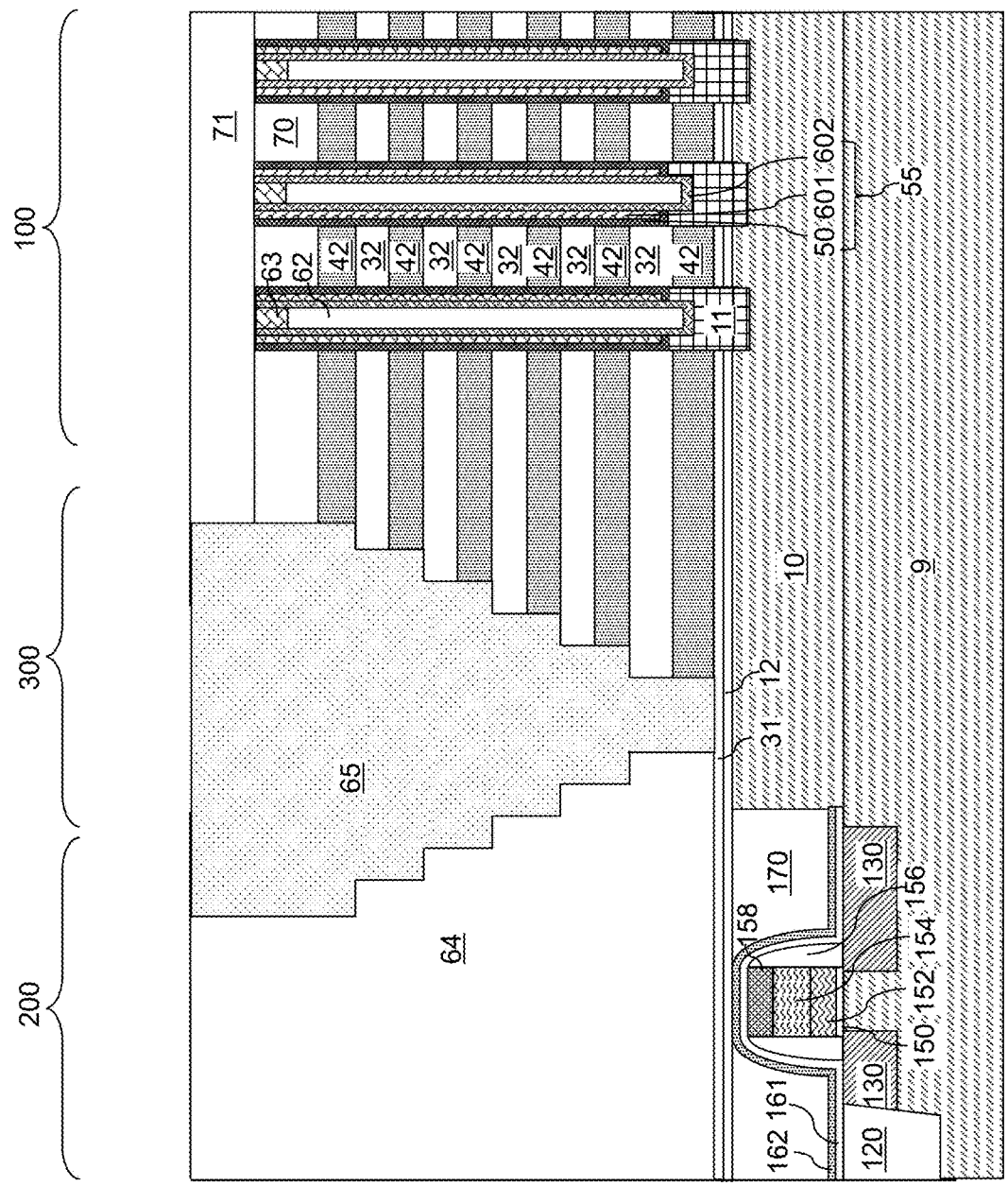
FIG. 4 is a vertical cross-sectional view of the first exemplary structure after formation of a stepped terrace and a retro-stepped dielectric material portion according to the first embodiment of the present disclosure.

Referring to FIG. 4, an optional first array contact level dielectric layer 71 can be formed over the substrate (9, 10). As an optional structure, the first array contact level dielectric layer 71 may, or may not, be formed. In case the first array contact level dielectric layer 71 is formed, the first array contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first array contact level dielectric layer 71 can be formed over a horizontal plane including the top surface of the insulating cap layer 70 and the top surfaces of the drain regions 63. The first array contact level dielectric layer 71 can be deposited by chemical vapor deposition, atomic layer deposition (ALD), spin-coating, or a combination thereof. The thickness of the first array contact level dielectric layer 71 can be in a range from 10 nm to 300 nm, although lesser and greater thicknesses can also be employed.

In one embodiment, the first array contact level dielectric layer 71 can be formed as a dielectric material layer having a uniform thickness throughout. The first array contact level dielectric layer 71 may be formed as a single dielectric material layer, or can be formed as a stack of a plurality of dielectric material layers. Alternatively, formation of the first array contact level dielectric layer 71 may be merged with formation of at least one line level dielectric layer (not shown). While the present disclosure is described employing an embodiment in which the first array contact level dielectric layer 71 is a structure separate from an optional second array contact level dielectric layer or at least one line level dielectric layer to be subsequently deposited, embodiments in which the first array contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first array contact level dielectric layer 71 by a planarization process such as chemical mechanical planarization and/or a recess etch. The top surfaces of the first array contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first array contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
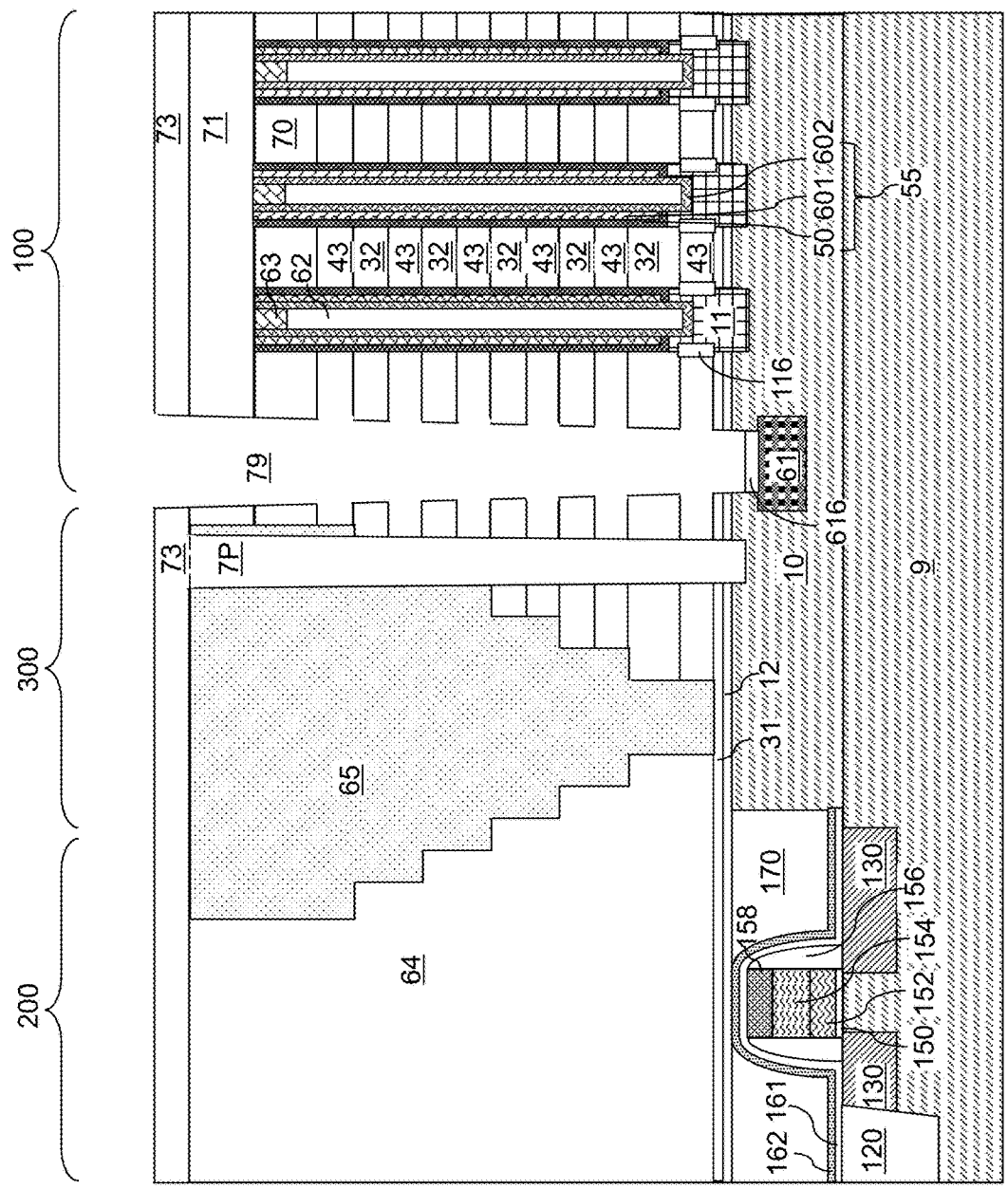
FIG. 5A is a vertical cross-sectional view of the first exemplary structure after formation of a backside contact trench and backside recesses according to the first embodiment of the present disclosure.
Figure 5B:
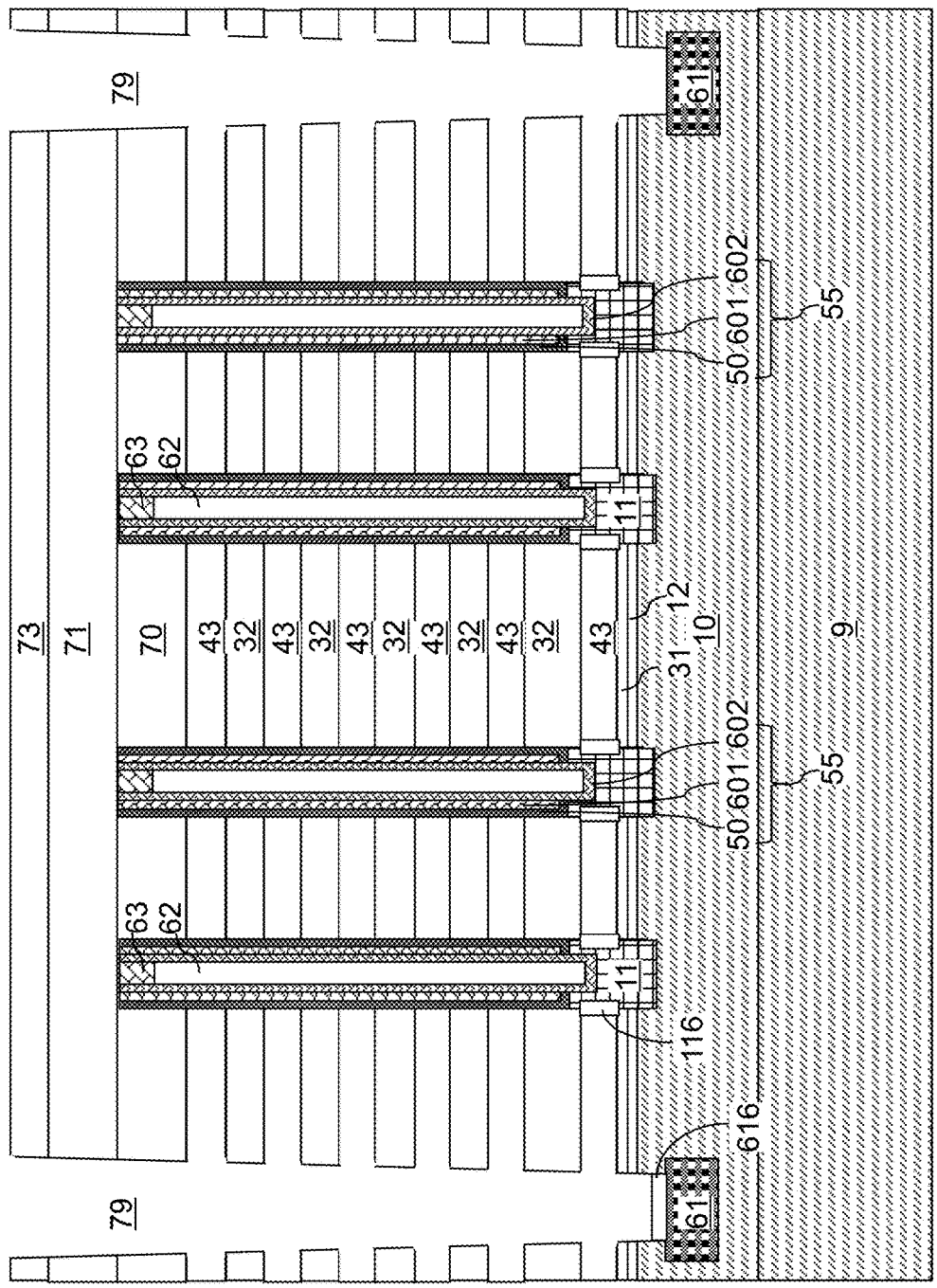
FIG. 5B is another vertical cross-sectional view of the first exemplary structure of FIG. 5A.
Figure 5C:
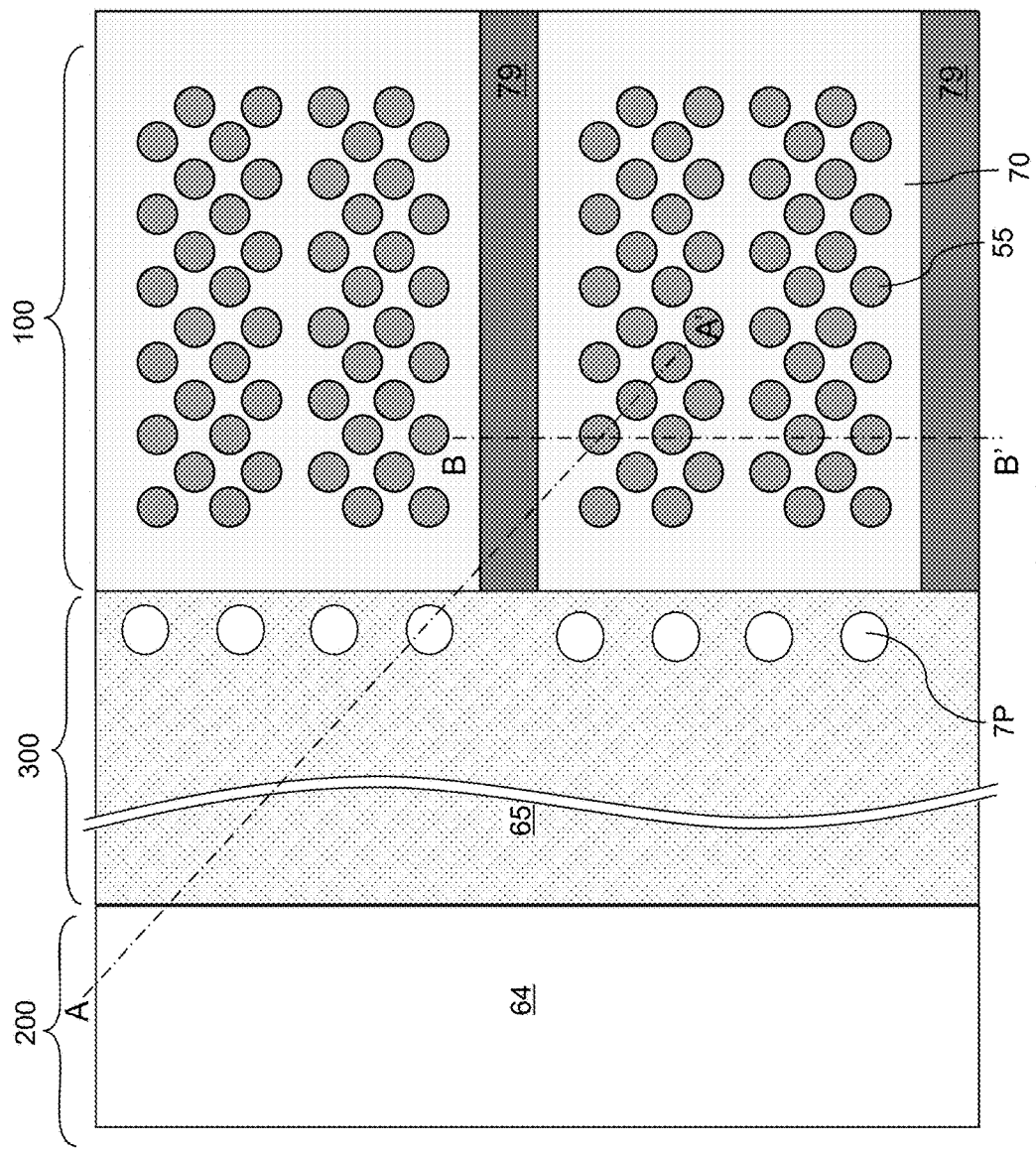
FIG. 5C is a see-through top-down view of the first exemplary structure of FIG. 5A. A second array contact level dielectric layer is not shown in this view. The vertical plane A-A' is the plane of the vertical cross-sectional view of FIG. 5A. The vertical plane B-B' is the plane of the vertical cross-sectional view of FIG. 5B.

Referring to FIGS. 5A-5C, at least one dielectric support pillar 7P may be optionally formed through the retro-stepped dielectric material portion 65 and/or through the first array contact level dielectric layer 71 and/or through the alternating stack (32, 42). The plane A-A' in FIG. 5C corresponds to the plane of the vertical cross-sectional view of FIG. 5A. The plane B-B' in FIG. 5C corresponds to the plane of the vertical cross-sectional view of FIG. 5B. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first array contact level dielectric layer 71 concurrently with deposition of the at least one dielectric support pillar 7P can be present over the first array contact level dielectric layer 71 as a second array contact level dielectric layer 73. Each of the at least one dielectric support pillar 7P and the second array contact level dielectric layer 73 is an optional structure. As such, the second array contact level dielectric layer 73 may, or may not, be present over the insulating cap layer 70 and the retro-stepped dielectric material portion 65. The first array contact level dielectric layer 71 and the second array contact level dielectric layer 73 are herein collectively referred to as at least one array contact level dielectric layer (71, 73). In one embodiment, the at least one array contact level dielectric layer (71, 73) can include both the first and second array contact level dielectric layers (71, 73), and optionally include any additional via level dielectric layer that can be subsequently formed. In another embodiment, the at least one array contact level dielectric layer (71, 73) can include only the first array contact level dielectric layer 71 or the second array contact level dielectric layer 73, and optionally include any additional via level dielectric layer that can be subsequently formed. Alternatively, formation of the first and second array contact level dielectric layers (71, 73) may be omitted, and at least one via level dielectric layer may be subsequently formed, i.e., after formation of a backside contact via structure.

The second array contact level dielectric layer 73 and the at least one dielectric support pillar 7P can be formed as a single contiguous structure of integral construction, i.e., without any material interface therebetween. In another embodiment, the portion of the dielectric material that is deposited over the first array contact level dielectric layer 71 concurrently with deposition of the at least one dielectric support pillar 7P can be removed, for example, by chemical mechanical planarization or a recess etch. In this case, the second array contact level dielectric layer 73 is not present, and the top surface of the first array contact level dielectric layer 71 can be physically exposed.

A photoresist layer (not shown) can be applied over the alternating stack (32, 42) and/or the retro-stepped dielectric material portion 65, and optionally over the dielectric material portion 64, and lithographically patterned to form at least opening in an area in which formation of at least one backside contact via structure is desired. The pattern in the photoresist layer can be transferred through the alternating stack (32, 42) and/or the retro-stepped dielectric material portion 65 employing an anisotropic etch to form at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 6:
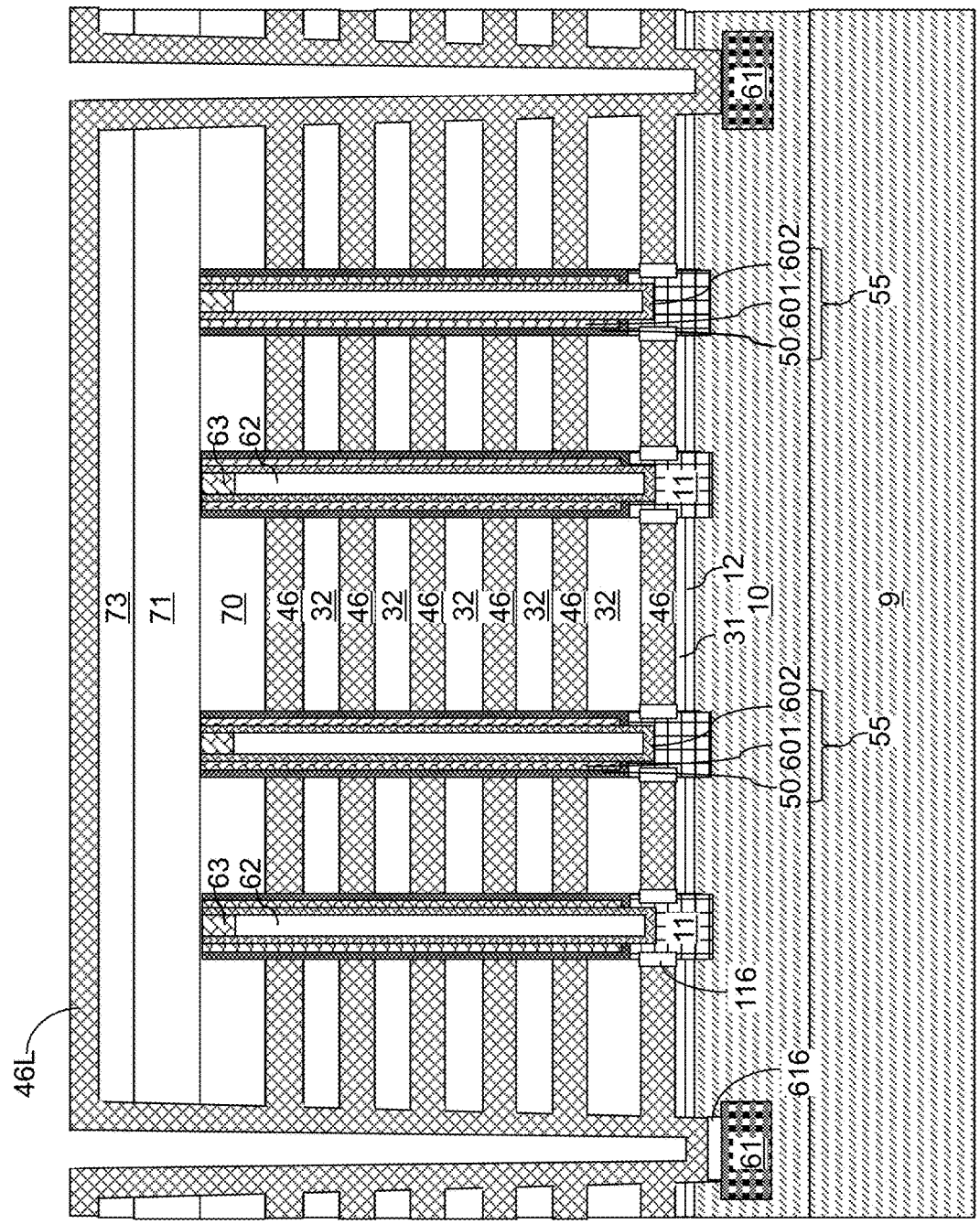
FIG. 6 is a vertical cross-sectional view of the first exemplary structure after formation of electrically conductive lines according to the first embodiment of the present disclosure.

Referring to FIG. 6, a conductive material can be deposited in the plurality of backside recesses 43, on sidewalls of the at least one the backside contact trench 79, and over the top surface of the second array contact level dielectric layer 73 (or the topmost layer of the first array contact level dielectric layer 71 if the second array contact level dielectric layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 can be formed in the plurality of backside recesses 43, and a contiguous conductive material layer 46L can be formed on the sidewalls of each backside contact trench 79 and over the second array contact level dielectric layer 73 (or the topmost layer of the first exemplary structure in case the second array contact level dielectric layer 73 is not employed). Thus, at least a portion of each sacrificial material layer 42 can be replaced with an electrically conductive layer 46, which is a conductive material portion.

Figure 7:
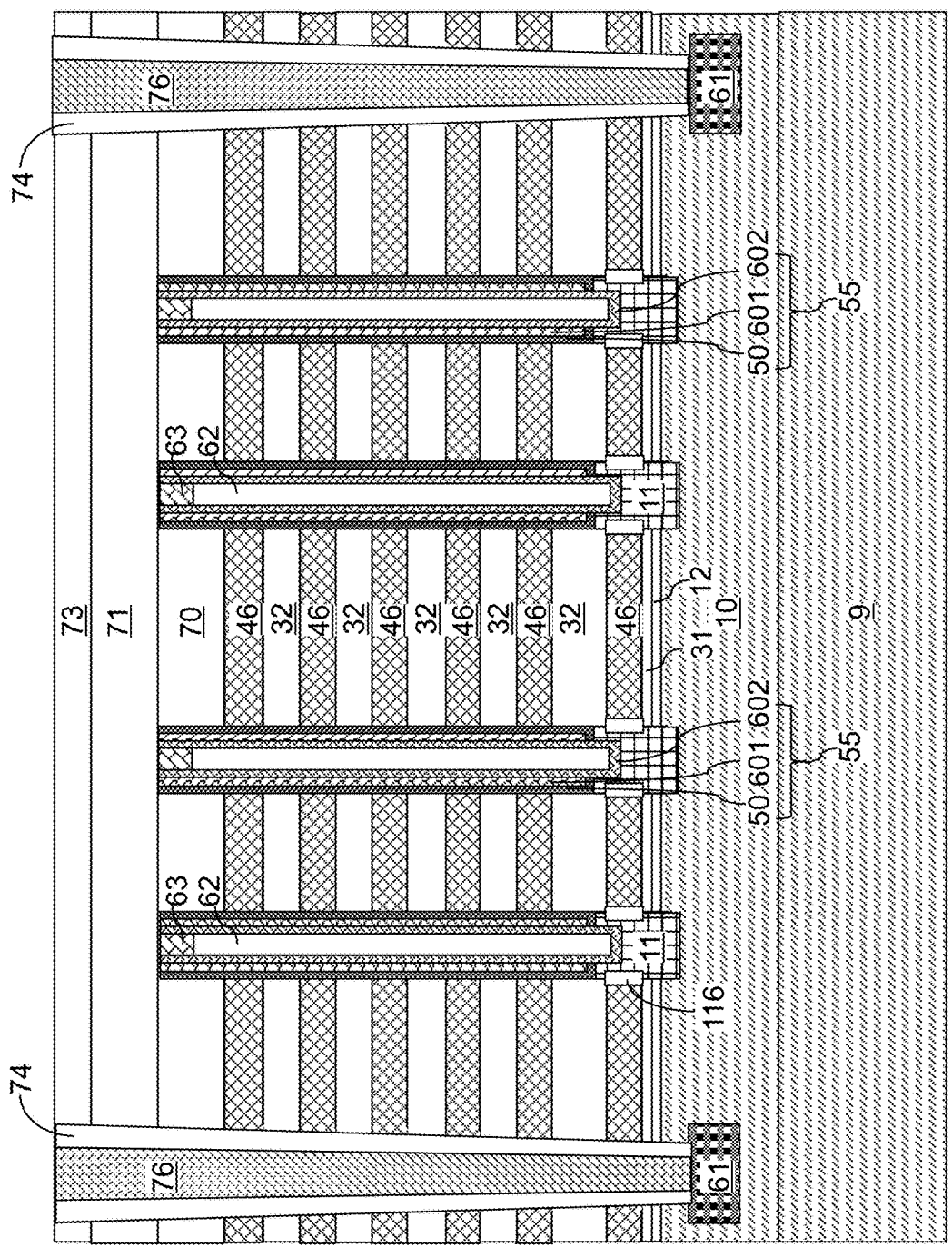
FIG. 7 is a vertical cross-sectional view of the first exemplary structure after formation of insulating spacers and backside contact via structures according to the first embodiment of the present disclosure.

Referring to FIG. 7, the deposited conductive material of the contiguous conductive material layer 46L is etched back from the sidewalls of each backside contact trench 79 and from above the second array contact level dielectric layer 73 (or the topmost layer of the first exemplary structure in case the second array contact level dielectric layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The sacrificial dielectric portions 616 can be removed from above the source regions 61 during the anisotropic etch. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the first exemplary structure (which can be, for example, the second array contact level dielectric layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the second array contact level dielectric layer 73 to the bottom surface of the gate via cavity, can be less than the vertical distance between the top surface of the second array contact level dielectric layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the first exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

The cavity laterally surrounded by the insulating spacer 74, the various via cavities in the peripheral device region 200, the control gate contact via cavities in the contact region 300, and the memory contact via cavities in the device region 100 can be filled with a conductive material to form various contact via structures. For example, a backside contact via structure 76 can be formed in the cavity surrounded by the insulating spacer 74. A gate contact via structure can be formed in each gate via cavity in the peripheral device region 200. An active region via structure can be formed in each active region via cavity in the peripheral device region 200. Further, control gate contact via structures (not shown) can be formed within each contact via cavity that extends to a top surface of the electrically conductive layers 46 in the contact region 300.

Optionally, one or more additional via level dielectric layers (not shown) may be added to the at least one array contact level dielectric layer (71, 73). The at least additional via level dielectric layers, if present, comprises a dielectric material such as silicon oxide, silicon nitride, silicon oxynitride, and/or organosilicate glass. While the present disclosure is described employing an embodiment in which the at least one array contact level dielectric layer (71, 73) includes the first array contact level dielectric layer 71 and the second array contact level dielectric layer 73 and optional one or more additional via level dielectric layers, it is understood that the at least one array contact level dielectric layer (71, 73) can include any combination, or none, of the first array contact level dielectric layer 71 and the second array contact level dielectric layer 73 and optional one or more additional via level dielectric layers. Further, it is understood that the at least one array contact level dielectric layer (71, 73) may optionally include a portion that is added during subsequent deposition of at least one line level dielectric layer provided that line structures are not subsequently formed within the portion of the at least one line level dielectric layer. As such, the at least one array contact level dielectric layer (71, 73) can include any dielectric material layer or portion that is formed above the top surface of the drain regions 63 and underlying a horizontal plane including the bottommost surface of line structures to be subsequently formed over the drain region 63.

Figure 8A:
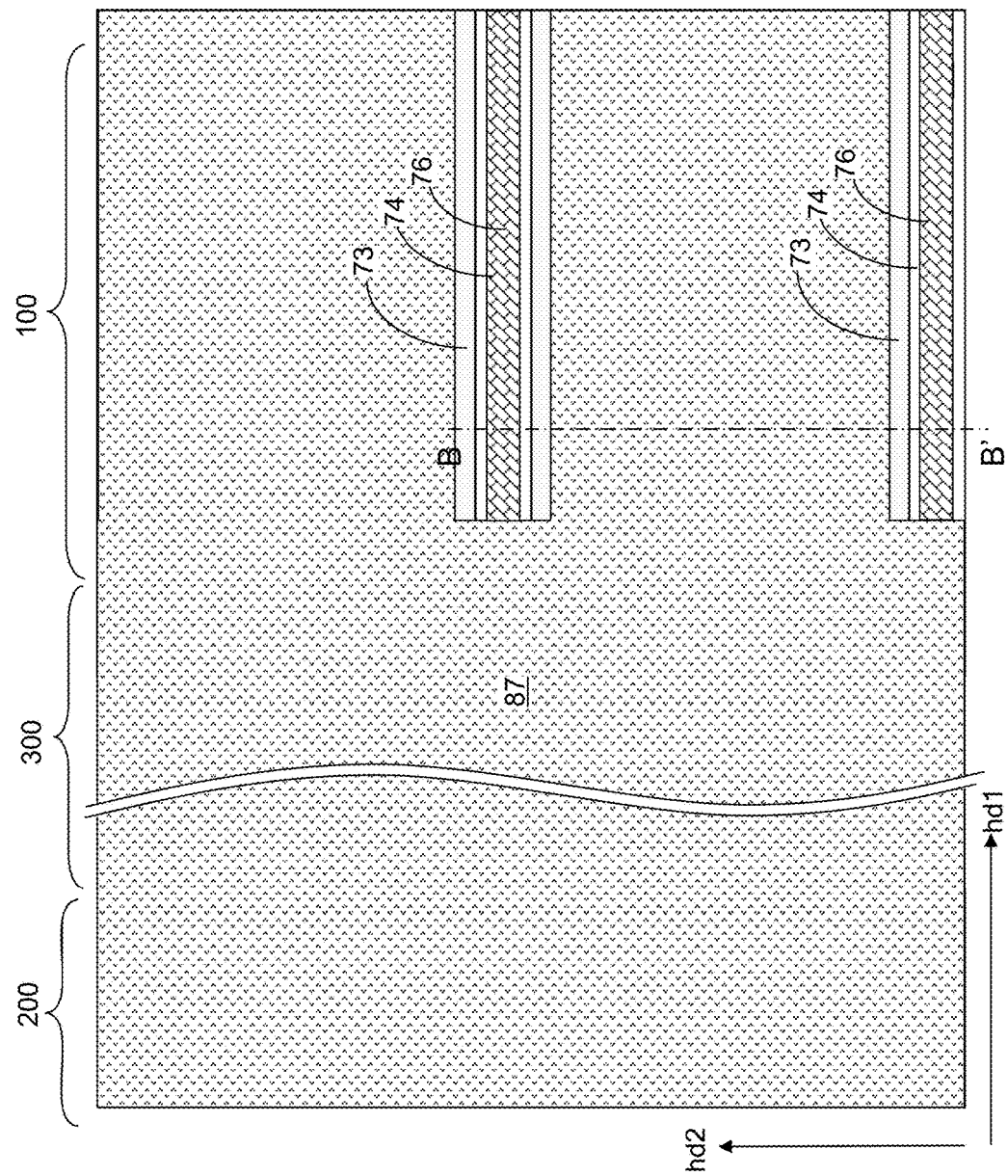
FIG. 8A is a top-down view of the first exemplary structure after application and patterning of a photoresist layer, and recessing of the backside contact via structures according to the first embodiment of the present disclosure.

Referring to FIGS. 8A and 8B, a photoresist layer 87 can be applied over the at least one array contact level dielectric layer (71, 73), and can be lithographically patterned to physically expose areas of the backside contact via structures 76. In one embodiment, a pair of sidewalls of the patterned photoresist layer 87 can overlie a top surface of the at least one array contact level dielectric layer (71, 73), and can be parallel to the lengthwise direction of the backside contact via structures 76. The lengthwise direction of each backside contact via trench 76 is the horizontal direction along which the respective backside contact via structures 76 laterally extend, and is herein referred to as a first horizontal direction hd1. The horizontal direction perpendicular to the first horizontal direction hd1 is herein referred to as a second horizontal direction hd2.

In one embodiment, a first portion of the top surface of each backside contact via structures 76 can be within an opening in the patterned photoresist layer, and a second portion of the top surface of each backside contact via structure 76 can be covered by the patterned photoresist layer 87. In one embodiment, the physically exposed first portion of the top surface of a backside contact via structure 76 can be a predominant portion of the top surface of the respective backside contact via structure 76, and the covered second portion of the top surface of a backside contact via structure 76 can be a peripheral portion of the top surface of the respective backside contact via structure 76.

Subsequently, the physically exposed first portions of the top surfaces of the backside contact via structures 76 are vertically recessed, while the covered second portions of the top surfaces of the backside contact via structures 76 are covered by the photoresist layer 87, and therefore, not vertically recessed. The vertical recessing of the physically exposed first portions of the top surfaces of the backside contact via structures 76 may be performed selective to the at least one array contact level dielectric layer (71, 73) and the insulating spacers 74. Each second portion of the topmost surface of the backside contact via structure 76 is not recessed during vertical recessing of the first portion of the topmost surface of the respective backside contact via structure 76. In one embodiment, the topmost surface of each backside contact via structure 76 can be coplanar with the top surfaces of the memory stack structures 55. A recess cavity having a recess depth rd is formed within each volume from which a portion of a backside contact via structure 76 is removed. Subsequently, the photoresist layer 87 can be removed, for example, by ashing.

Figure 9:
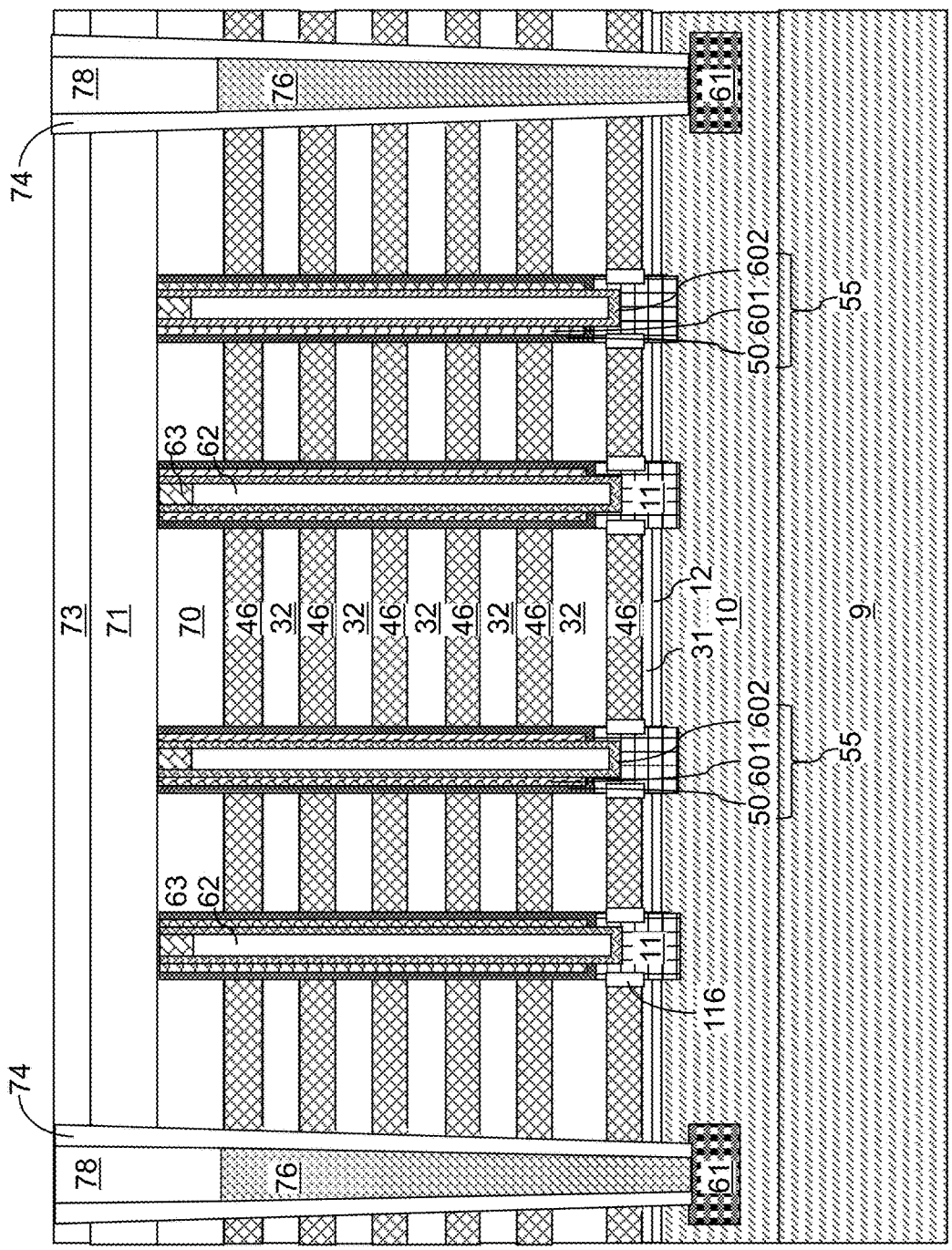
FIG. 9 is a vertical cross-sectional view of the first exemplary structure after formation of dielectric plugs in cavities overlying recessed backside contact via structures according to the first embodiment of the present disclosure.

Referring to FIG. 9, a dielectric material is deposited in the recess cavities. The recess cavities are filled with the deposited dielectric material. The dielectric material can be, for example, silicon oxide, silicon nitride, organosilicate glass (OSG), a dielectric metal oxide material (such as aluminum oxide), or a combination thereof. Excess portions of the deposited dielectric material can be removed from above a horizontal plane including the topmost surface of the at least one array contact level dielectric layer (71, 73) by a planarization process. The planarization process can employ, for example, chemical mechanical planarization (CMP) and/or a recess etch. Each remaining portion of the deposited dielectric material that fills a recess cavity is herein referred to as a dielectric plug 78. The height of the dielectric plugs 78 can be in a range from 10 nm to 300 nm, although lesser and greater heights can also be employed. Each dielectric plug 78 fills a cavity overlying a top surface of a recessed portion of a backside contact via structure 76, and can laterally contact a sidewall of an unrecessed portion of the backside contact via structure 76.

Figure 10A:
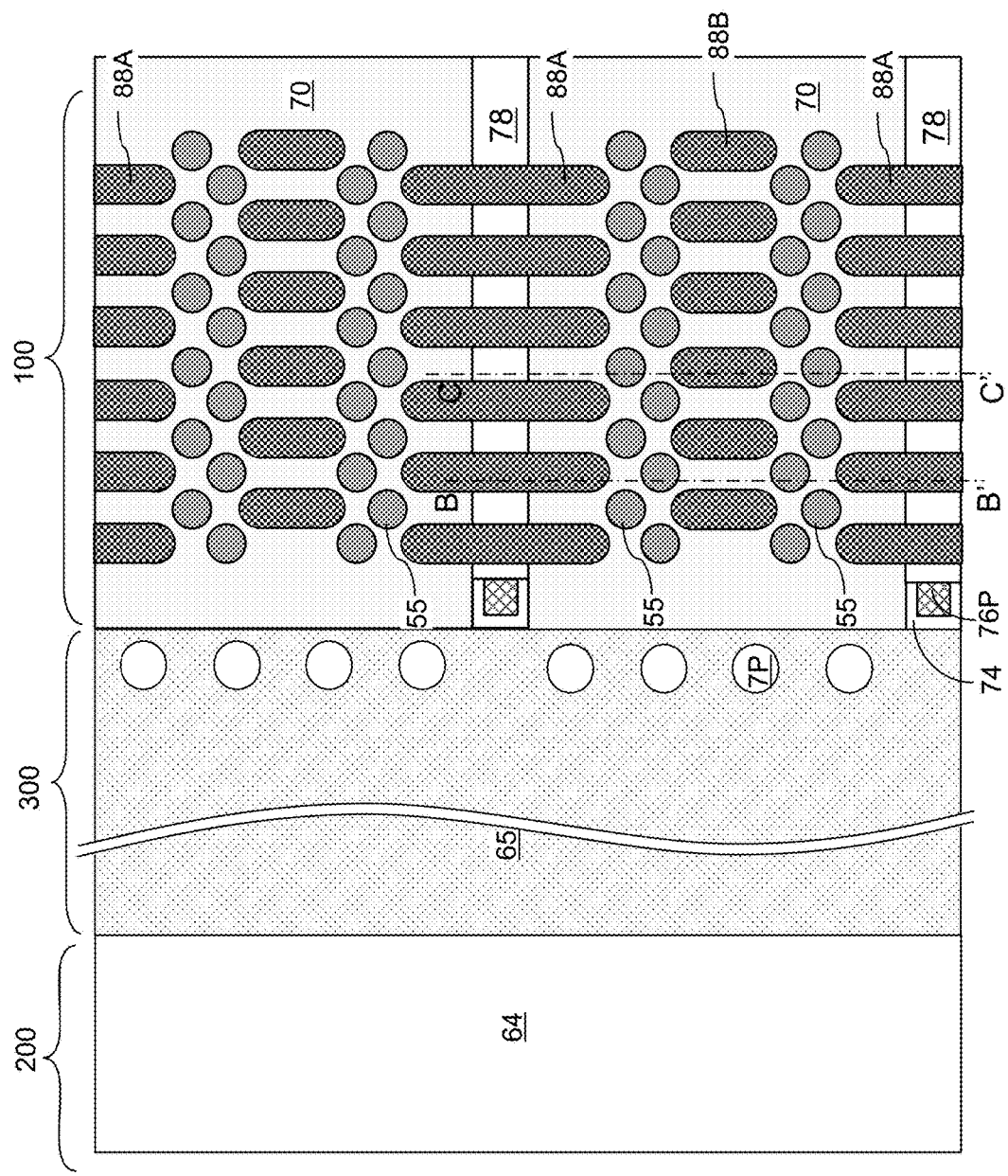
FIG. 10A is a see-through top-down view of the first exemplary structure after formation of bridge line structures connecting memory stack structures according to the first embodiment of the present disclosure. At least one array contact level dielectric layer is not shown in this see-through view.
Figure 10B:
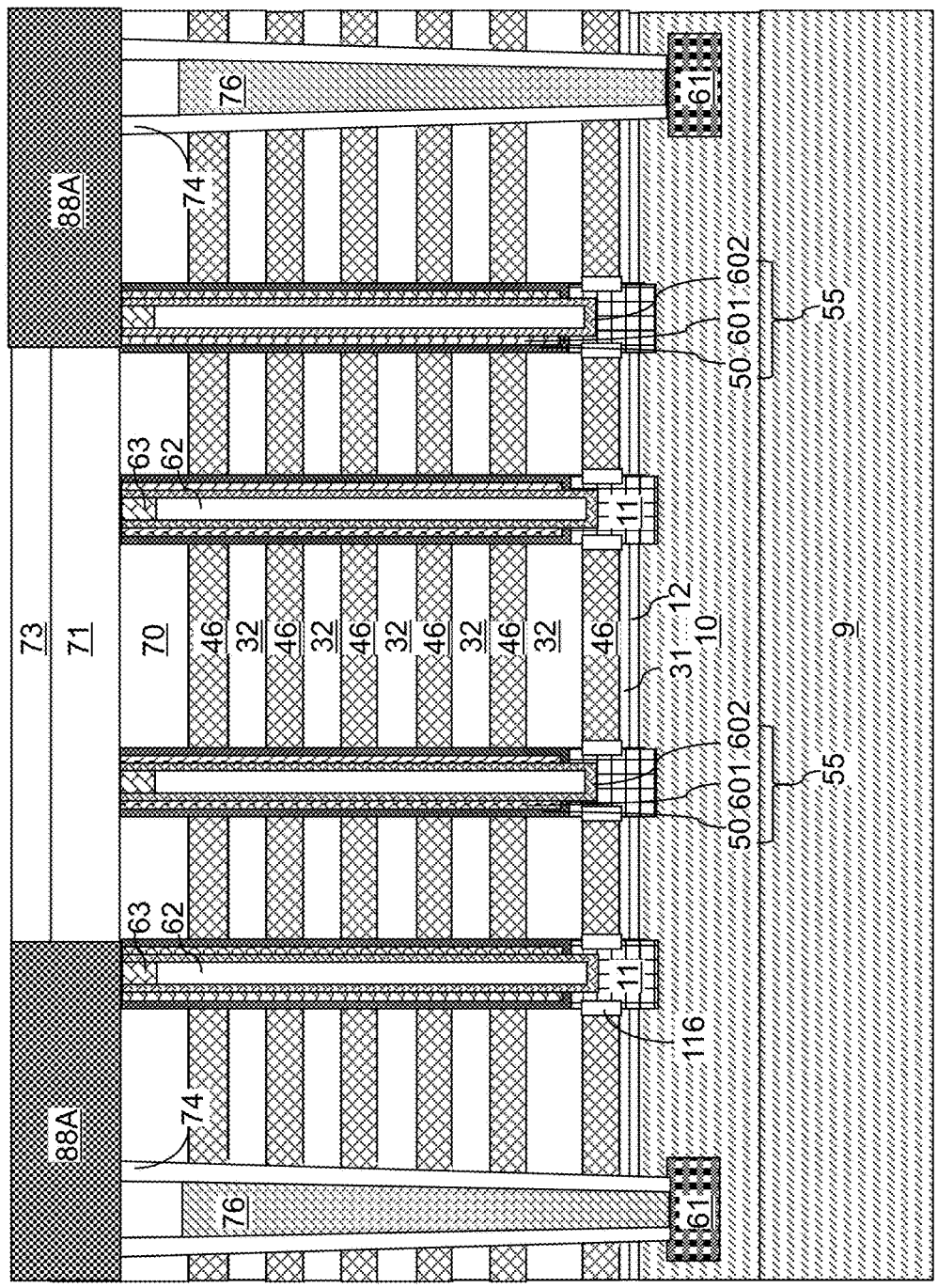
FIG. 10B is vertical cross-sectional views of the first exemplary structure along to the vertical plane of B-B' in FIG. 10A.
Figure 10C:
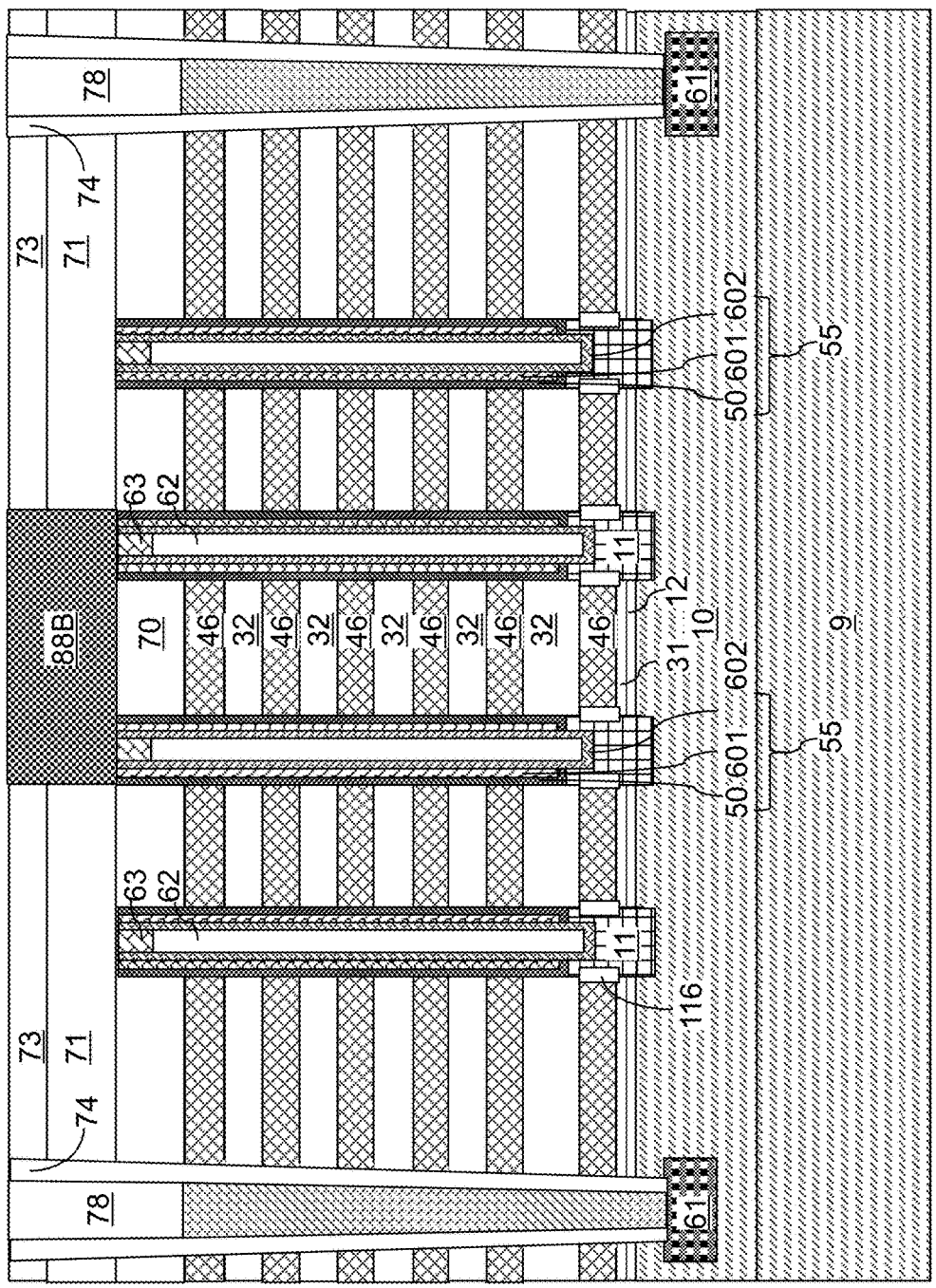
FIG. 10C is vertical cross-sectional views of the first exemplary structure along to the vertical plane of C-C' in FIG. 10A.
Figure 10D:
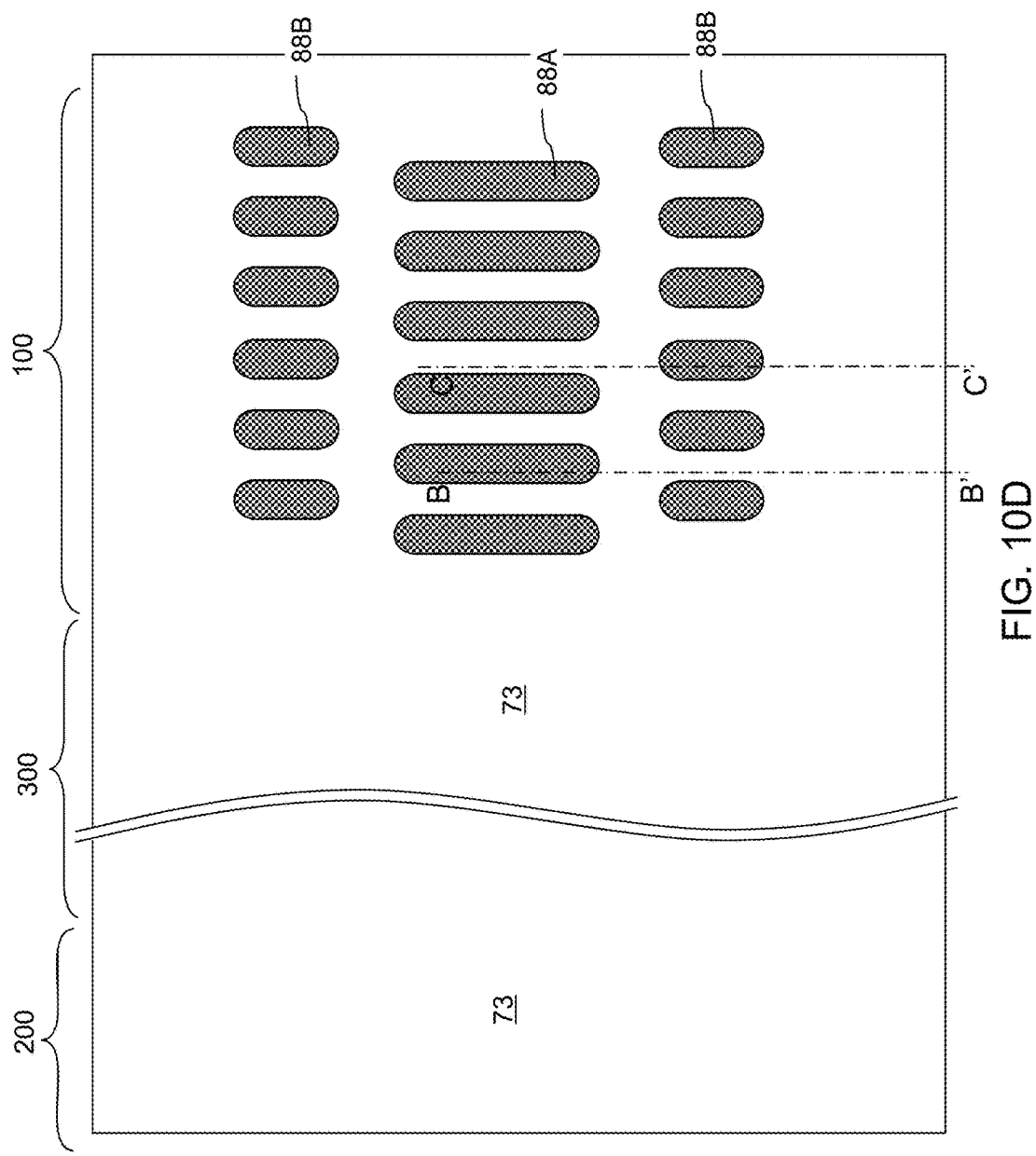
FIG. 10D is a top-down view of the first exemplary structure of FIGS. 10A-10C.

Referring to FIGS. 10A-10D, bridge line structures (88A, 88B) are formed by formation of line trenches through the at least one array contact level dielectric layer (71, 73) and deposition of a conductive material directly on the top surfaces of the respective subset of memory stack structures 55. FIG. 10A is see-through top-down view in which the at least one array contact level dielectric layer (71, 73) is omitted for clarity. The level of the at least one array contact level dielectric layer (71, 73) is herein referred to as a "bridge level," which is the level in which bridge line structures are formed. As used herein, a "bridge line structures" refers to a line structure that contacts at least two underlying conductive structures such as the drains 63 of the memory stack structures 55.

Line cavities through the at least one array contact level dielectric layer (71, 73) can be formed, for example, by applying a photoresist layer (not shown), patterning the photoresist layer to form openings therein, and transferring the pattern of the openings in the photoresist layer through the at least one array contact level dielectric layer (71, 73) by an etch process that employs the patterned photoresist layer as an etch mask. The pattern of the openings in the photoresist layer can be selected such that the line trenches laterally extend between a pair of memory stack structures 55. In one embodiment, the line trenches can laterally extend along the second horizontal direction hd2 (which is different from the first horizontal direction hd1 along which the backside contact via structures 76 laterally extend). In one embodiment, a top surface of a first memory stack structure 55 can be physically exposed at a first end portion of a line trench, and a top surface of a second memory stack structure 55 can be physically exposed at a second end portion of the line trench.

Bridge line structures (88A, 88B) connecting multiple memory stack structures 55 can be subsequently formed by filling the line trenches with at least one conductive material. Excess portions of the deposited conductive material can be removed from above the horizontal plane including the top surface of the at least one array contact level dielectric layer (71, 73) by a planarization process such as chemical mechanical planarization (CMP).

Each bridge line structure (88A, 88B) can be formed on top surfaces of a respective subset of memory stack structures 55. The bridge line structures (88A, 88B) can comprise a first subset including first type bridge line structures 88A that straddle a backside contact via structure 76, and a second subset including second type bridge line structures 88B that does not straddle any backside contact via structure 76. Each first type bridge line structures 88A can be formed directly on a top surface of a dielectric plug 78. The entirety of each sidewall of a second type bridge line structure 88B contacts a sidewall of the at least one array contact level dielectric layer (71, 73). Each second type bridge line structure 88B contacts top surfaces of at least two memory stack structures 55 and a top surface of the insulating cap layer 70. In one embodiment, a plurality of bridge line structures (88A, 88B) can extend along the second horizontal direction. Each backside contact via structure 76 can include a peripheral portion 76P that is not covered by a dielectric plug 78 that covers a non-peripheral portion of the backside contact via structure 76. In other words, each backside contact via structure 76 can include a non-peripheral portion that underlies a dielectric plug 78 and a peripheral portion 76P having a top surface that is substantially coplanar with the top surface of the dielectric plug 78 and the top surface of the insulating cap layer 70.

Referring to FIGS. 11A-11F and 12, at least one dielectric material layer (90, 110) can be formed over the bridge line structures (88A, 88B) and the at least one array contact dielectric layer (71, 73). Each of the at least one dielectric material layer (90, 110) comprises a dielectric material such as silicon oxide, silicon nitride, silicon oxynitride, organosilicate glass, a dielectric metal oxide, or a combination thereof. Each of the at least one dielectric material layer (90, 110) can be formed, for example, by chemical vapor deposition (CVD) or spin-coating. The dielectric material layer 90 can have a thickness in a range from 100 nm to 1,000 nm, although lesser and greater thicknesses can also be employed.

In one embodiment, the at least one dielectric material layer (90, 110) can comprise a stack, from bottom to top, of a via level dielectric material layer 90 and a line level dielectric material layer 110. In one embodiment, the dielectric material of the via level dielectric material layer 90 can be a material that can be etched selective to the material of the line level dielectric material layer 110 in an anisotropic etch, or can be etched at a faster etch rate than the material of the line level dielectric material layer 110 in an anisotropic etch. In one embodiment, the via level dielectric material layer 90 can comprise porous or non-porous organosilicate glass, and the line level dielectric material layer 110 can comprise silicon oxide or silicon nitride. In another embodiment, the via level dielectric material layer 90 can comprise silicon oxide, and the line level dielectric material layer 110 can silicon nitride.

Line cavities extending along the second direction can be formed in the line level dielectric material layer 110 by a combination of lithographic methods and an anisotropic etch. For example, the line cavities can be formed by application and patterning of a first photoresist layer over the line level dielectric material layer 110, and by transferring the pattern in the photoresist layer into the line level dielectric material layer 110 by an anisotropic etch. The pattern in the photoresist layer can be a line and space pattern that is repeated along the first horizontal direction. The anisotropic etch forms line cavities having a bottom surface at about the interface between the via level dielectric material layer 90 and the line level dielectric material layer 110. Optionally, an etch stop layer (not shown) can be provided between the via level dielectric material layer 90 and the line level dielectric material layer 110 so that the line trenches do not extend below the etch stop layer. The first photoresist layer can be removed, for example, by ashing.

Subsequently, a second photoresist layer is applied over the patterned line level dielectric material layer 110. The second photoresist layer is patterned to form openings in areas that generally overlap with a line trench and with one of the bridge line structures (88A, 88B) and the memory stack structures 55.

A plurality contact via cavities can be formed through the via level dielectric material layer 90 by an anisotropic etch that etches the dielectric material of the via level dielectric material layer 90 employing the combination of the patterned second photoresist layer and the line level dielectric material layer 10 as an etch mask. The chemistry of the anisotropic etch can be selective to the dielectric material of the line level dielectric material layer 110, i.e., does not substantially etch the dielectric material of the line level dielectric material layer 110.

Figure 12:
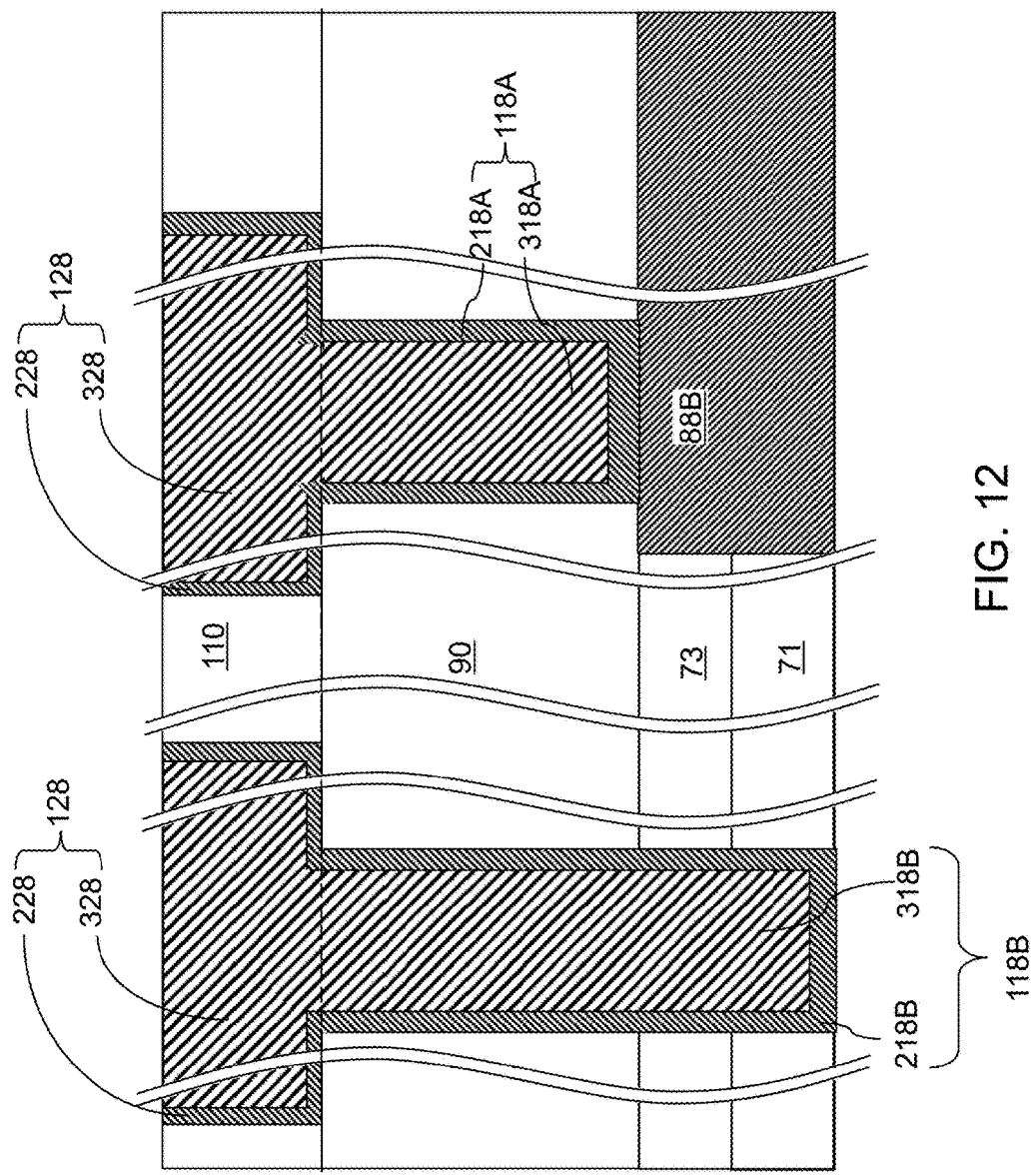
FIG. 12 is a vertical cross-sectional view of a region of the first exemplary structure of FIGS. 11A-11F according to the first embodiment of the present disclosure.

In one embodiment, at least one first via cavity can be formed over a respective bridge line structure (88A, 88B), and at least one second via cavity can be formed over a respective memory stack structure 55 as shown in FIG. 12. The at least one first via cavity and the second via cavities can be simultaneously formed employing a same anisotropic etch process. In one embodiment, a top surface of a bridge line structure (88A, 88B) can be physically exposed underneath each first via cavity, and a top surface of a memory stack structure 55 can be physically exposed underneath each second via cavity. In one embodiment, the first via cavities and the second via cavities can have a greater lateral extent along the second horizontal direction than along the first horizontal direction.

In one embodiment, each physically exposed top surface of bridge line structures (88A, 88B) can be an etch stop surface of the anisotropic etch process. Further, each physically exposed top surface of the memory stack structures 55 can be an additional etch stop surface of the anisotropic etch process. Because the top surfaces of the bridge line structures (88A, 88B) are vertically offset from the top surfaces of the memory stack structures 55, the bottom surfaces of each first via cavity can be vertically offset from the bottom surfaces of the second via cavities by the height of the bridge line structures (88A, 88B).

In one embodiment, integrated line and via cavities can be formed in the line level dielectric material layer 110 and the via level dielectric material layer 90. Each of the integrated line and via cavities can comprise a via cavity (which is one of the first and second via cavities) and a line cavity. Each via cavity is formed within the via level dielectric material layer 90 and vertically extends from underneath a respective line cavity to a top surface of a bridge line structure (88A, 88B) or to a top surface of a memory stack structure 55. Each line cavity laterally extends along a lengthwise direction and overlies, and is adjoined to, and underlying via cavity.

At least one conductive material can be deposited in the integrated line and via cavities. Excess portions of the at least one conductive material can be removed from above the horizontal plane including the top surface of the at least one dielectric material layer (90, 110). Remaining portions of the at least one conductive material constitute integrated line and via structures {(128, 118A) or (128, 118B)}. Each integrated line and via structure {(128, 118A) or (128, 118B)} comprises a bit line structure 128 and at least one of a plurality of contact via structures (118A, 118B). The integrated line and via structures {(128, 118A) or (128, 118B)} comprise first type integrated line and via structures (128, 118A), each of which comprises a bit line structure 128 and one or more first type contact via structures 118A (or "first type contact via structures") that contacts a top surface of a bridge line structure (88A, 88B). The integrated line and via structures {(128, 118A) or (128, 118B)} comprise second type integrated line and via structures (128, 118B), each of which comprises a bit line structure 128 and one or more second type contact via structures 118B (or "second type contact via structures") that contacts a top surface of a memory stack structures 55. In one embodiment, one or more of the at least one first type contact via structure 118A and the at least one second type contact via structure 118B can be elongated along the lengthwise direction of the bit line structures 128. Additional metal line structures 126 can be formed at the same level as the bit line structures 128 to provide electrical contact to underlying conductive structures such as the backside contact via structures 76 by contacting the top surface of the peripheral portions 76P (as shown in FIG. 10A) of the backside contact via structures 76.

Referring to FIG. 12, the plurality of contact via structures (118A, 118B) can be formed by filling the first and second via cavities with at least one conductive material. An array of bit line structures 128 can be formed over the plurality of contact via structures (118A, 118B) in the same of different deposition step. Each bit line structure 128 among the array of bit line structures contacts a respective contact via structure (118A, 118B) among the plurality of contact via structures.

In one embodiment, the at least one conductive material can comprise a conductive metallic liner (218A, 218B, 228) having a first metallic composition and deposited on sidewalls of the at least one first via cavity and the second via cavities and the line cavities, and a conductive fill material (318A, 318B, 328) having a second metallic composition and deposited on the conductive metallic liner (218A, 218B, 228). In one embodiment, the conductive metallic liner (218A, 218B, 228) can comprise a metallic nitride such as TiN, TaN, WN, or a combination thereof, and the conductive fill material (318A, 318B, 328) can comprise at least one elemental metal such as W, Cu, Al, Ru, Co, Ti, Pt, Ni, and alloys thereof.

While the present disclosure is described employing a specific embodiment for forming the at least one dielectric material layer (90, 110), the contact via structure (118A, 118B), and the bit line structures 128, alternate embodiments can be employed provided that such alternate embodiments separately fabricate the at least one dielectric material layer (90, 110), the contact via structure (118A, 118B), and the bit line structures 128 described herein. For example, a via level dielectric material layer 90 and the contact via structure (118A, 118B) can be formed first, and a line level dielectric material layer 110 and the bit line structures 128 and the additional metal line structures 126 can be subsequently formed in lieu of a dual damascene process employed to form the integrated line and via structures {(128, 118A) or (128, 118B)}.

Referring back to FIGS. 11A-11F, the first exemplary structure can comprise a monolithic three-dimensional memory device. The monolithic three-dimensional memory device can include a stack of alternating layers comprising insulating layers 32 and electrically conductive layers 46 and located over a substrate (9, 10); a plurality of memory stack structures 55 extending through the stack (32, 46); at least one bridge line structure (88A, 88B) contacting top surfaces of a respective subset of the plurality of memory stack structures 55; an array of bit line structures 128 overlying the at least one bridge line structure (88A, 88B); at least one first contact via structure 118A contacting a respective bit line structure 128 within the array of bit line structures and contacting a respective bridge line structure (88A, 88B); and second contact via structures 118B contacting a respective bit line structure 128 within the array of bit line structures and contacting a respective memory stack structure 55.

In one embodiment, each bottom surface of the at least one bridge line structure (88A, 88B) can be coplanar with top surfaces of the array of memory stack structures 55. In one embodiment, each bottom surface of the at least one first contact via structure 118A can be located above a horizontal plane including top surfaces of the memory stack structures 55. In one embodiment, each bottom surface of the at least one first contact via structure 118A can be located above a horizontal plane including bottom surfaces of the second contact via structures 118B. In one embodiment, the height of the second contact via structures 118B can be the same as the sum of the height of the at least one bridge line structure (88A, 88B) and the height of the at least one first contact via structure 118A.

In one embodiment, each of the at least one first contact via structure 118A and the at least one second contact via structure 118B comprises a conductive metallic liner (218A, 218B) having a first metallic composition and a conductive fill material portion (318A, 318B) having a second metallic composition. In one embodiment, the at least one first contact via structure 118A and the at least one second contact via structure 118B are elongated along a lengthwise direction of the bit line structures 128 within the array of bit line structures.

In one embodiment, a backside contact via structure 76 can extend through the stack (32, 46) and can contact a portion of the substrate (9, 10, 61). A first type bridge line structure 88A straddles the backside contact via structure 76 without contacting the backside contact via structure 76. The horizontal surface of a portion of the backside contact via structure 76 that underlies a first type bridge line structure 88A can be recessed below the horizontal plane including each bottom surface of the first type bridge line structures 88A.

In one embodiment, a topmost surface of the backside contact via structure 76 (i.e., the unrecessed peripheral portion 76P of the backside contact via structure 76 illustrated in FIG. 10A) can be coplanar with the horizontal plane including each bottom surface of the at least one bridge line structure (88A, 88B). A plurality of bridge line structures (88A, 88B) can laterally extend along a direction parallel to the array of bit line structures 128, i.e., along the second horizontal direction, and can straddle the backside contact via structure 76.

A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

The first exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the first exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In one embodiment, a set of memory stack structures 55 can form a one-dimensional array extending along the first horizontal direction hd1, i.e., the lengthwise direction of the backside contact via structure 76. The pitch of the one-dimensional array of memory stack structures 55 is herein referred to as a memory hole pitch p0. A set of memory stack structures 55 can form a one-dimensional array extending along the first horizontal direction hd1.

Figure 11B:
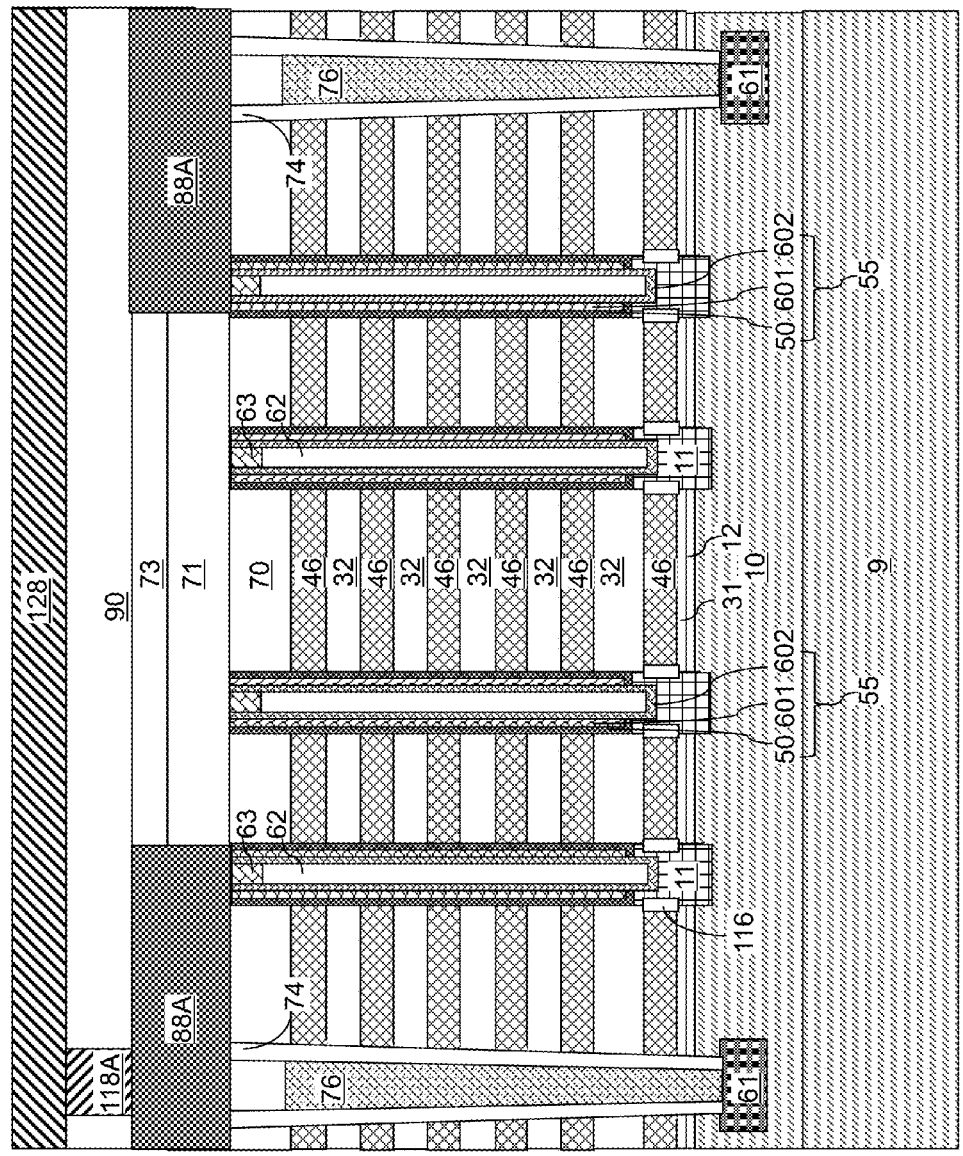
FIG. 11B is vertical cross-sectional views of the first exemplary structure along to the vertical plane of B-B' in FIG. 11A.
Figure 11C:
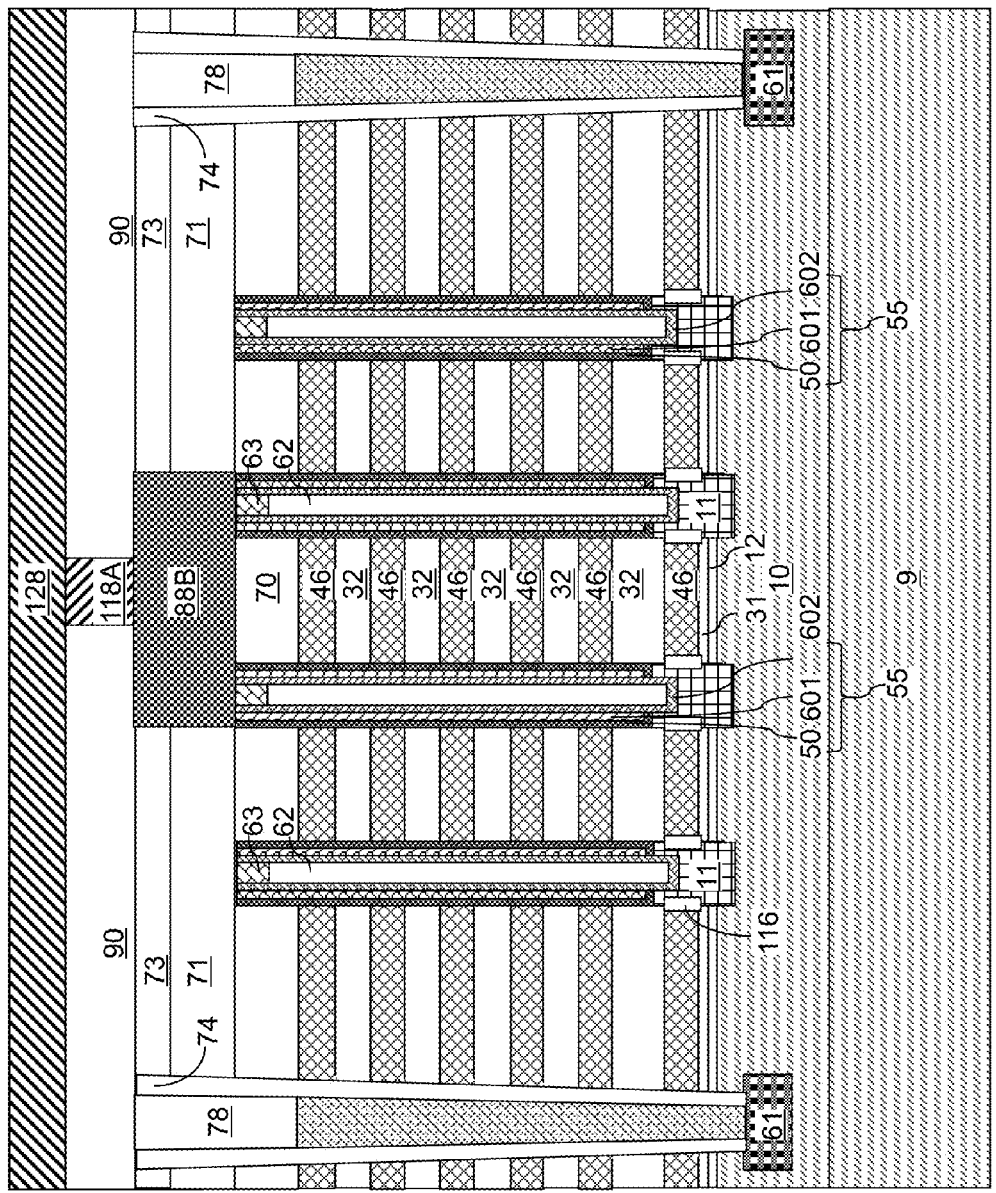
FIG. 11C is vertical cross-sectional views of the first exemplary structure along to the vertical plane of C-C' in FIG. 11A.
Figure 11D:
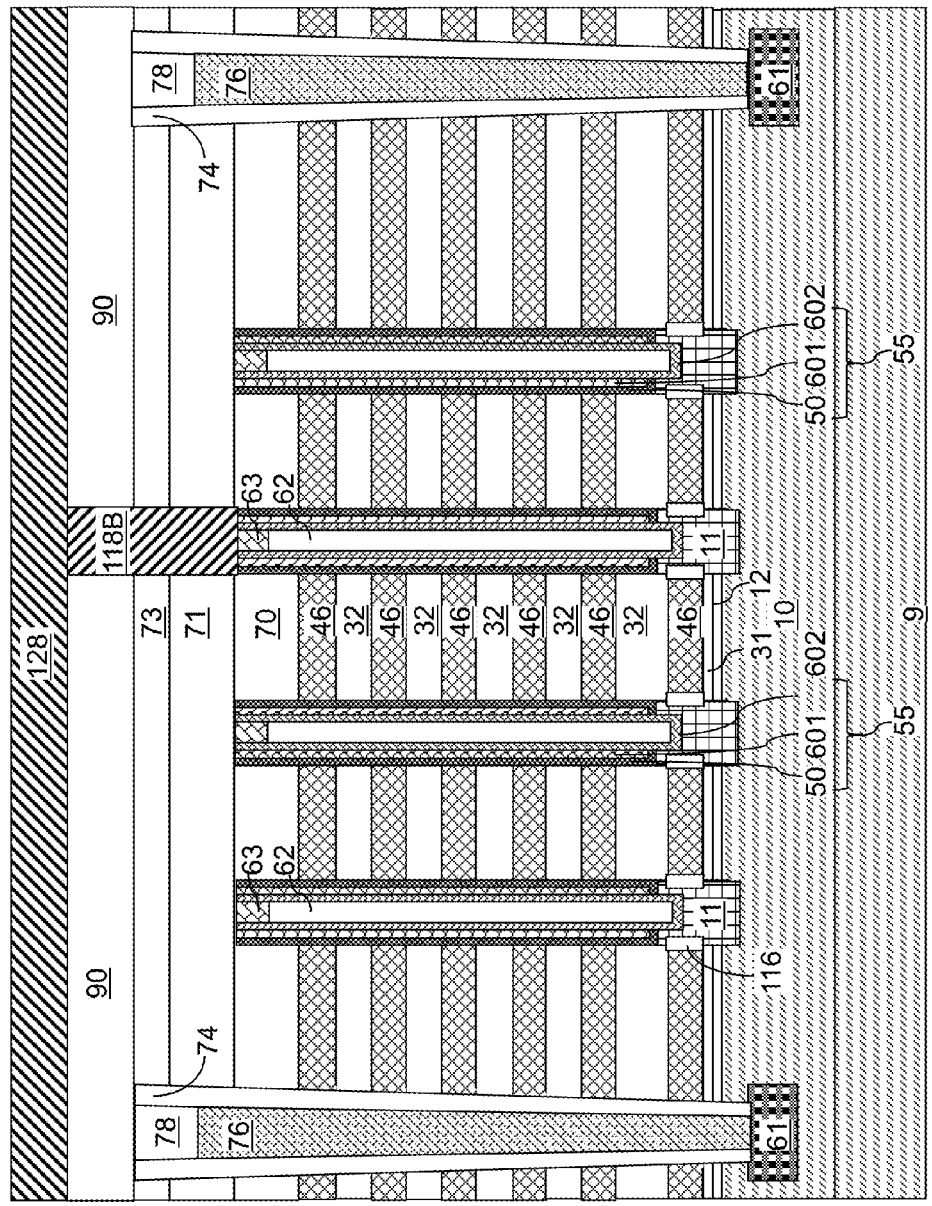
FIG. 11D is vertical cross-sectional views of the first exemplary structure along to the vertical plane of D-D' in FIG. 11A.
Figure 11E:
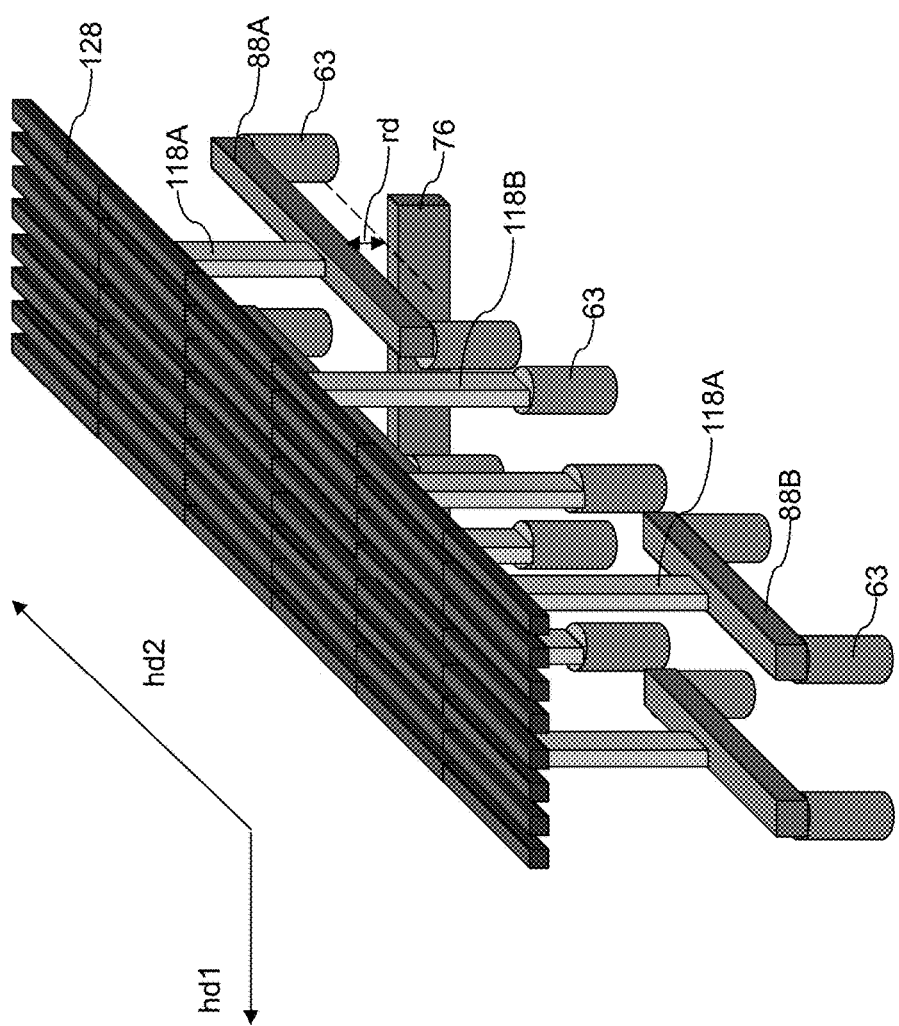
FIG. 11E is a see-through perspective view of an upper region of the first exemplary structure of FIG. 11A.
Figure 11F:
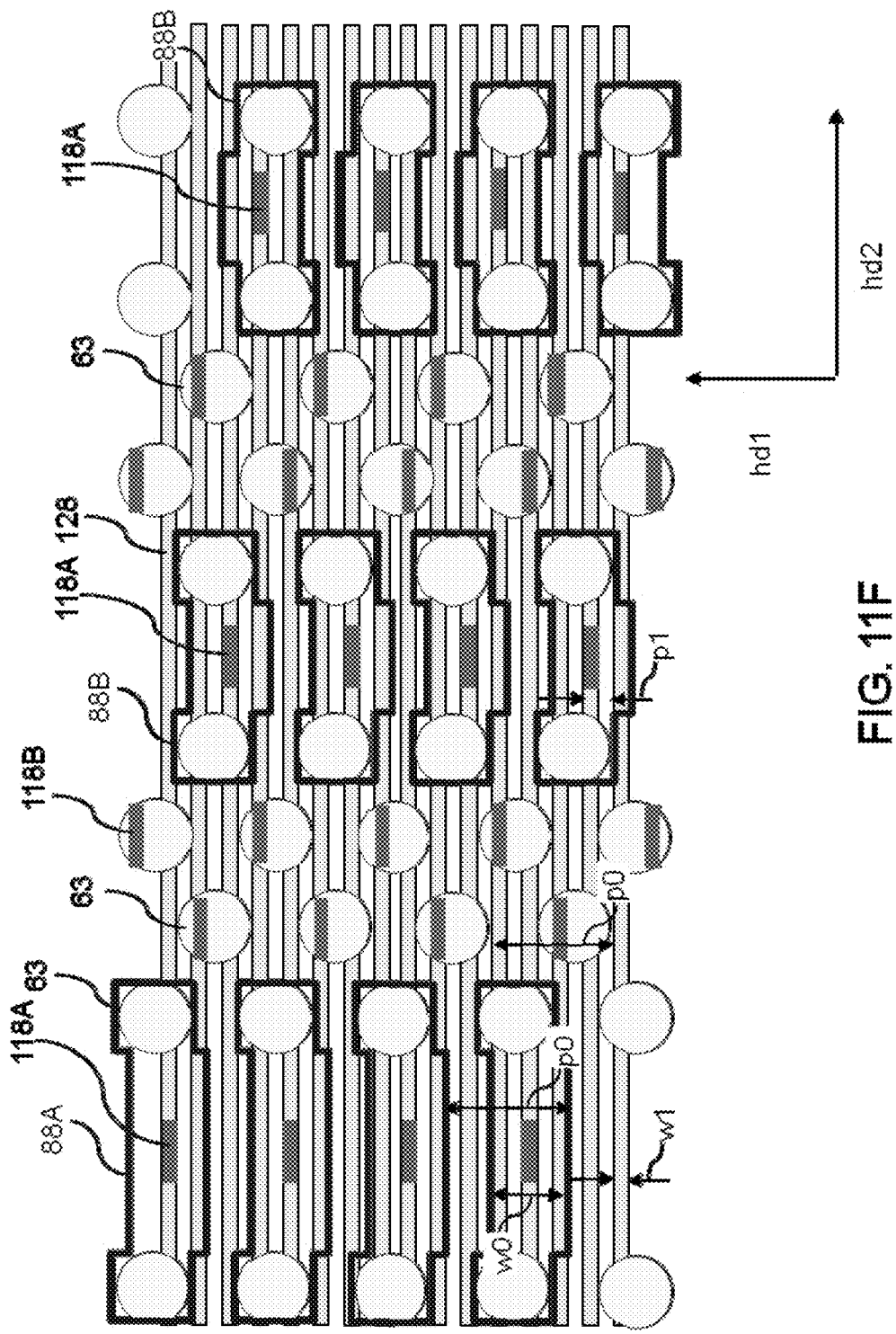
FIG. 11F is a schematic layout of the various metal interconnect structures of the first exemplary structure of FIG. 11A.

The first type bridge line structures 88A generally extend along the second horizontal direction hd2, and overlie a backside contact via structure 76. As shown in FIG. 11F, the first type bridge line structures 88A can include a wiggle protruding in the first horizontal direction hd1 to increase a process window for overlay within the underlying first type contact via structures 118A. The second type bridge line structures 88B generally extend along the second horizontal direction hd2, and do not overly any backside contact via structure 76. The second type bridge line structures 88B can include a wiggle protruding in the first horizontal direction hd1 to increase a process window for overlay within the underlying first type contact via structures 118A.

The width of the bridge line structures (88A, 88B) along the first horizontal direction hd1 is herein referred to a bridge line width w0. The pitch of the bridge line structures (88A, 88B) along the first horizontal direction is herein referred to as a bridge line pitch, which can be the same as the memory hole pitch p0. The width of the bit line structures 128 is herein referred to as a bit line width w1. The pitch of the bit line structures 128 along the first horizontal direction hd1 is herein referred to as a bit line pitch p1.

In one embodiment, the memory hole pitch p0 can be an integer multiple of the bit line pitch p1. The integer multiple can be an integer greater than 1, i.e., 2, 3, 4, 5, 6, etc. In one embodiment, the integer multiple can be 4 as illustrated in FIG. 11F. In this case, the bridge line width w0 may be about three to six times the bit line width w1. Thus, the patterning of the bridge line structures (88A, 88B) can be performed employing a lithography process having a larger overlay tolerance and/or a larger critical dimension tolerance than the lithography process employed to pattern the bit lines 128.

Figure 13:
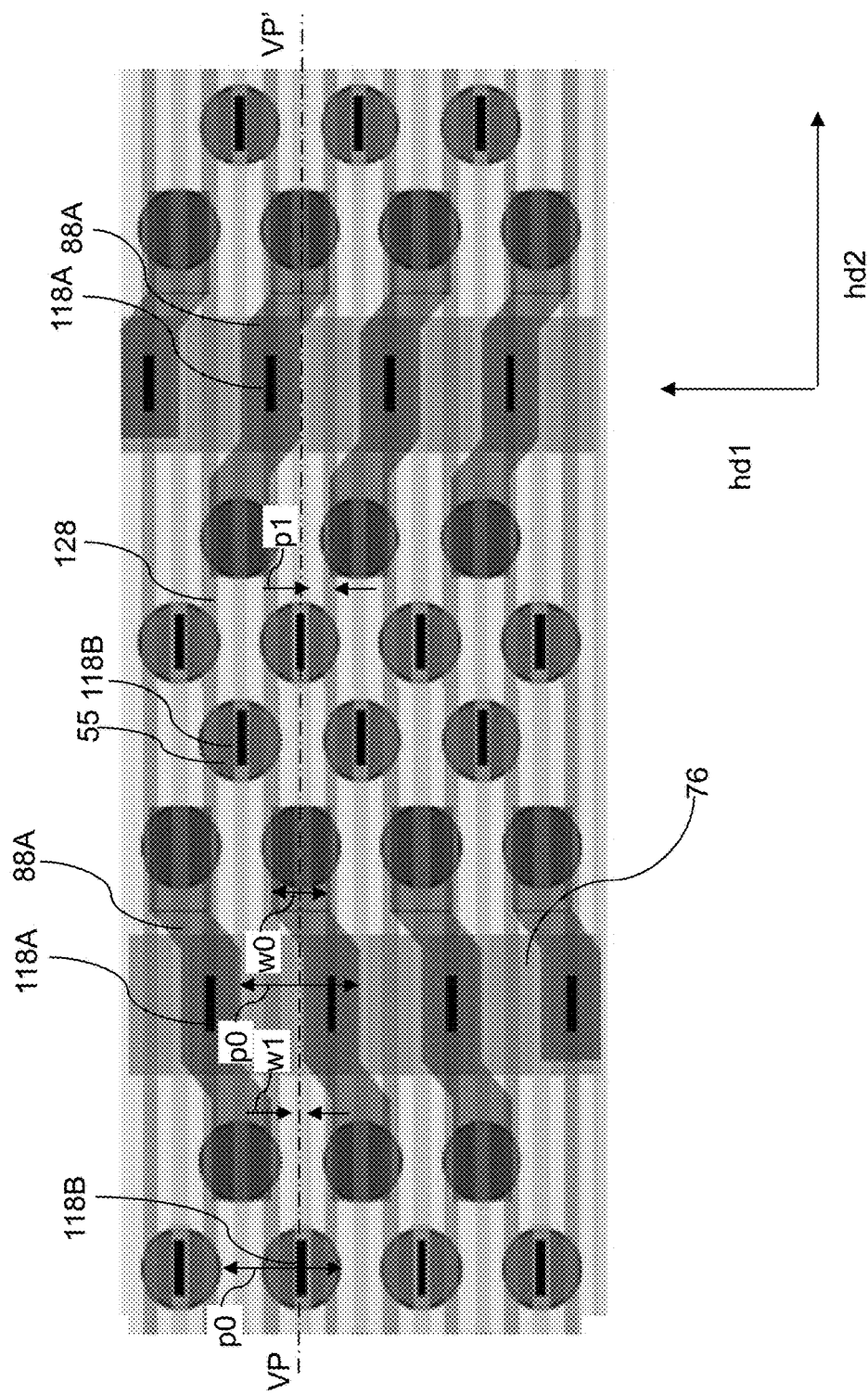
FIG. 13 is a schematic layout of the various metal interconnect structures of a first alternative embodiment of the first exemplary structure of FIG. 11A.

Referring to FIG. 13, a schematic layout of the metal interconnect structure of a first alternative embodiment of the present disclosure is illustrated. In this embodiment, the first type bridge line structures 88A can extend along a direction that is horizontally offset from the second horizontal direction hd2 by an angle less than 45 degrees. Optionally, the first type bridge line structures 88A may include wiggles. In one embodiment, the memory hole pitch p0 can be an integer multiple of the bit line pitch p1. The integer multiple can be an integer greater than 1, i.e., 2, 3, 4, 5, 6, etc. The integer multiple of the schematic of FIG. 13 is 4. In this case, the bridge line width w0 may be about three to six times the bit line width w1.

Thus, the patterning of the bridge line structures (88A, 88B) can be performed employing a lithography process having a larger overlay tolerance and/or a larger critical dimension tolerance than the lithography process employed to pattern the bit lines 128. The second type contact via structures 118A can overlie a geometrical center of a respective memory stack structure 55. Thus, a vertical plane VP-VP' passing through a geometrical center of a memory stack structure 55 which does not underlie a bridge line structure (88A, 88B) can pass through a bit line 128, and through a geometrical center of a second type contact via structure 118B.

Figure 14:
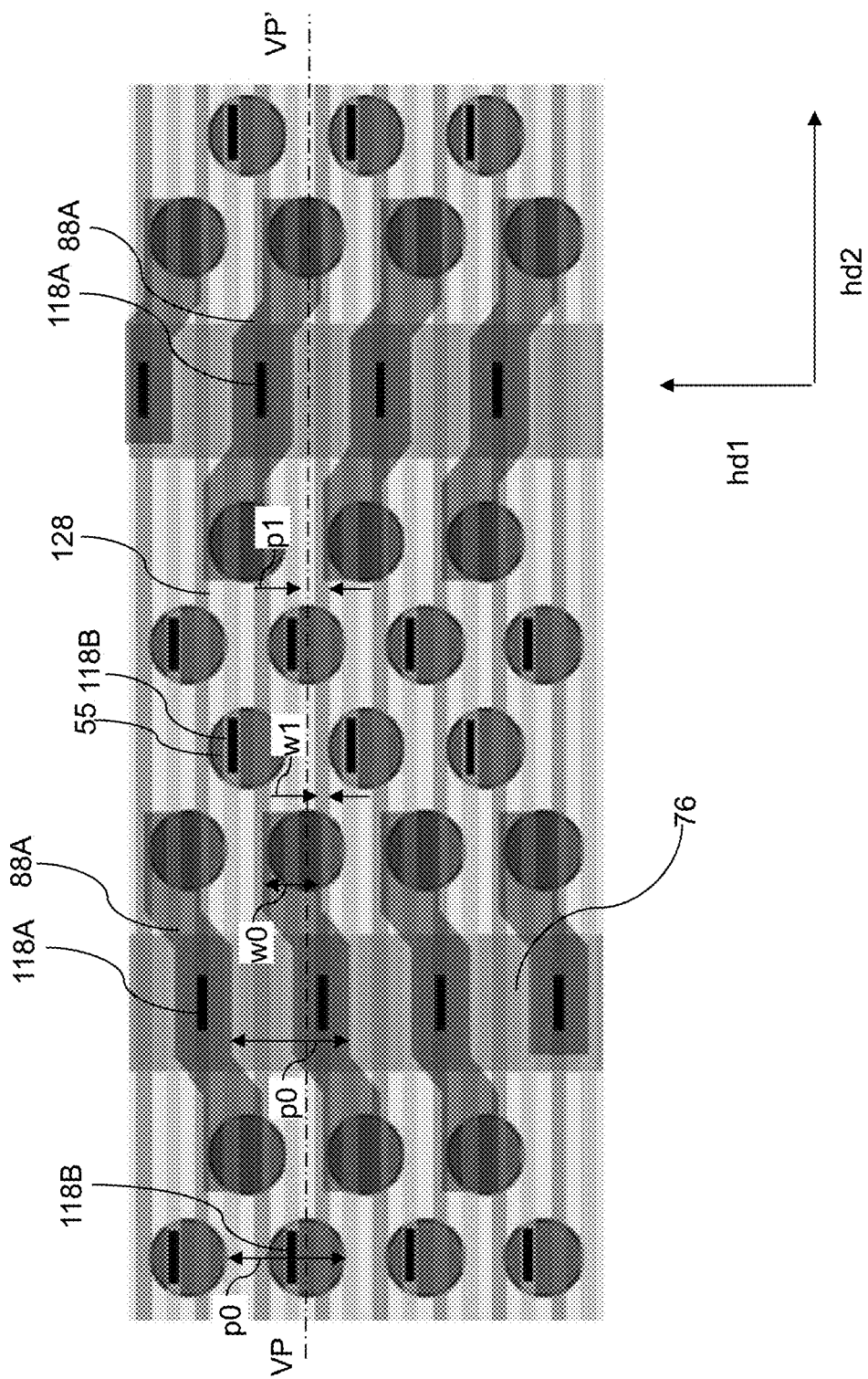
FIG. 14 is a schematic layout of the various metal interconnect structures of a second alternative embodiment of the first exemplary structure of FIG. 11A.

Referring to FIG. 14, the metal interconnect structure of a second alternative embodiment of the present disclosure can be derived from the first alternative embodiment illustrated in FIG. 13 by shifting the positions of the metal interconnect structures above the memory stack structures along the first horizontal direction hd1 by about one half of the bit line pitch p1. In this case, a vertical plane VP-VP' passing through a geometrical center of a memory stack structure 55 which does not underlie a bridge line structure (88A, 88B) can be located between a pair of bit lines 128.

Figure 15:
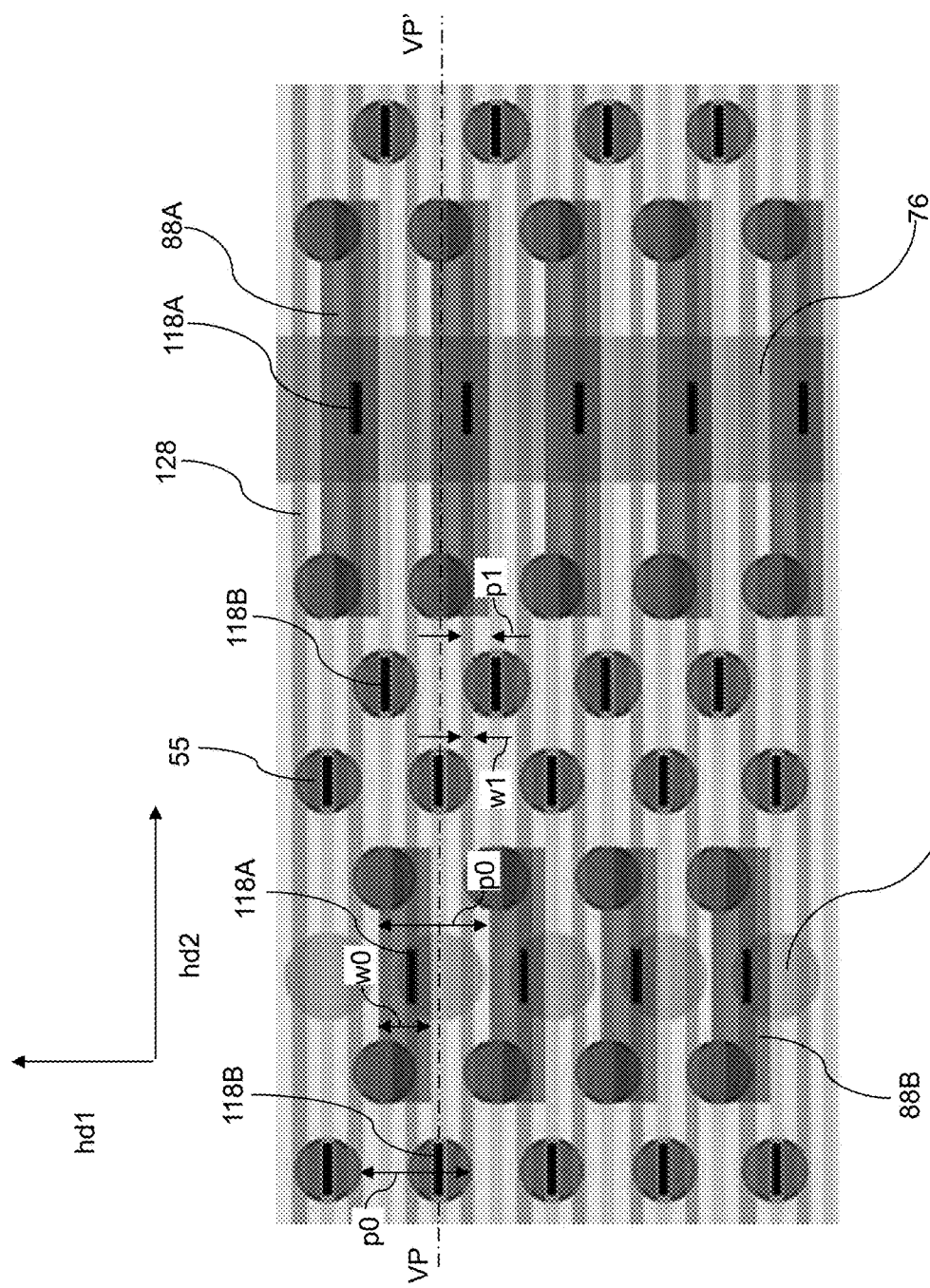
FIG. 15 is a schematic layout of the various metal interconnect structures of a third alternative embodiment of the first exemplary structure of FIG. 11A.

Referring to FIG. 15, the metal interconnect structure of a third alternative embodiment of the present disclosure can be derived from the first alternative embodiment illustrated in FIG. 13 by forming dummy memory opening fill structures 155, and forming the second type bridge line structures 88B over the dummy memory opening fill structures 155. The dummy memory opening fill structures 155 can be formed, for example, by forming additional memory openings 49, by applying and patterning a photoresist layer after deposition of the semiconductor channel layers for forming the semiconductor channels 60 to form openings in regions in which formation of the dummy memory opening fill structures 155 is desired, and by filling the additional memory openings 49 with a dielectric material. Thus, the additional memory openings 49 are filled with the dielectric material of the dielectric cores 62.

In one embodiment, the first type bridge line structures 88A and the second type bridge line structures 88B can extend along the second horizontal direction hd2, and can have rectangular horizontal cross-sectional shapes. In one embodiment, the memory hole pitch p0 can be an integer multiple of the bit line pitch p1. The integer multiple can be an integer greater than 1, i.e., 2, 3, 4, 5, 6, etc. The integer multiple of the schematic of FIG. 15 is 4. In this case, the bridge line width w0 may be about three to six times the bit line width w1.

Thus, the patterning of the bridge line structures (88A, 88B) can be performed employing a lithography process having a larger overlay tolerance and/or a larger critical dimension tolerance than the lithography process employed to pattern the bit lines 128. The second type contact via structures 118A can overlie a geometrical center of a respective memory stack structure 55. Thus, a vertical plane VP-VP' passing through a geometrical center of a memory stack structure 55 which does not underlie a bridge line structure (88A, 88B) can pass through a bit line 128, and through a geometrical center of a second type contact via structure 118B.

Figure 16:
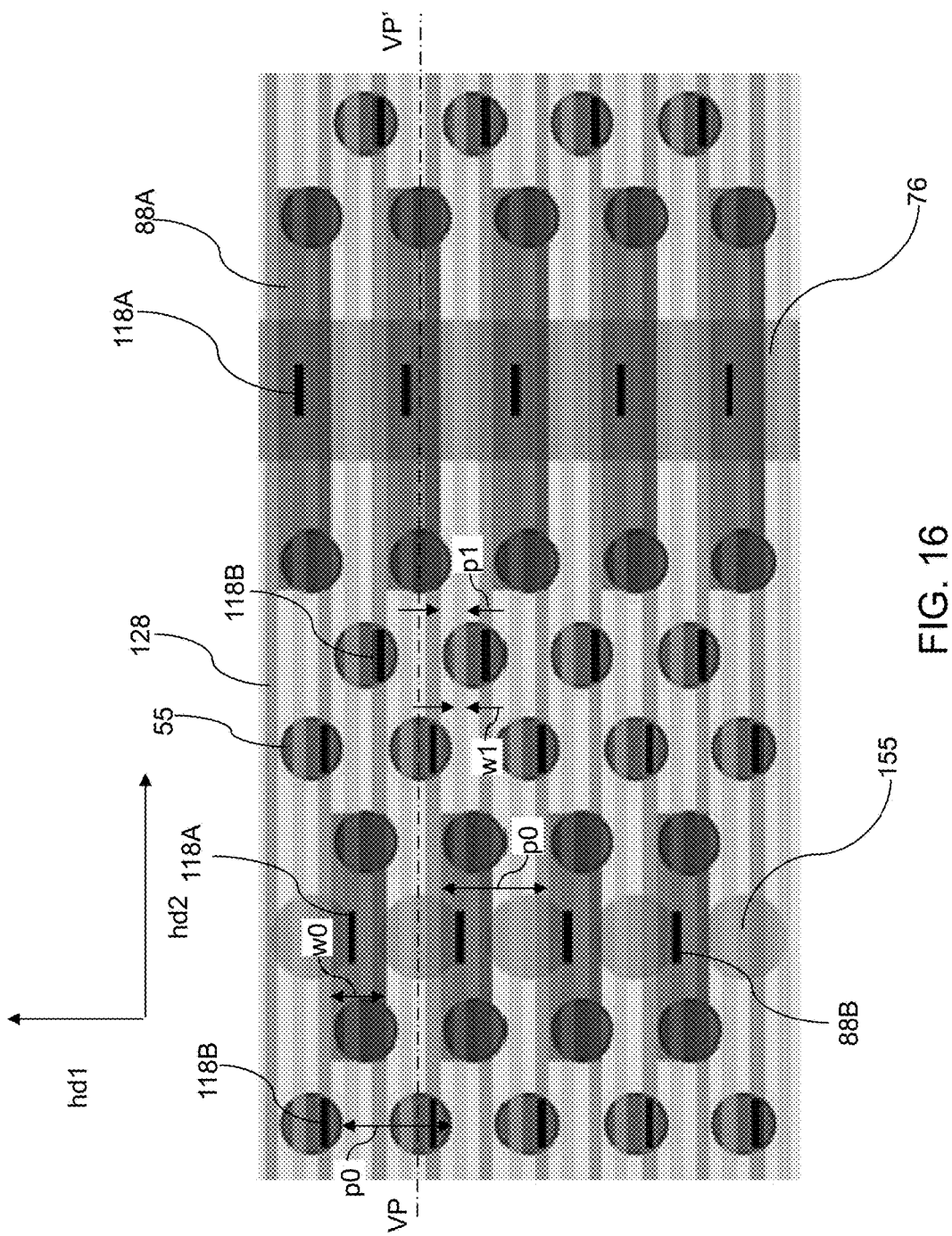
FIG. 16 is a schematic layout of the various metal interconnect structures of a fourth alternative embodiment of the first exemplary structure of FIG. 11A.

Referring to FIG. 16, the metal interconnect structure of a second alternative embodiment of the present disclosure can be derived from the first alternative embodiment illustrated in FIG. 15 by shifting the positions of the metal interconnect structures above the memory stack structures along the first horizontal direction hd1 by about one half of the bit line pitch p1. In this case, a vertical plane VP-VP' passing through a geometrical center of a memory stack structure 55 which does not underlie a bridge line structure (88A, 88B) can be located between a pair of bit lines 128.

Figure 17:
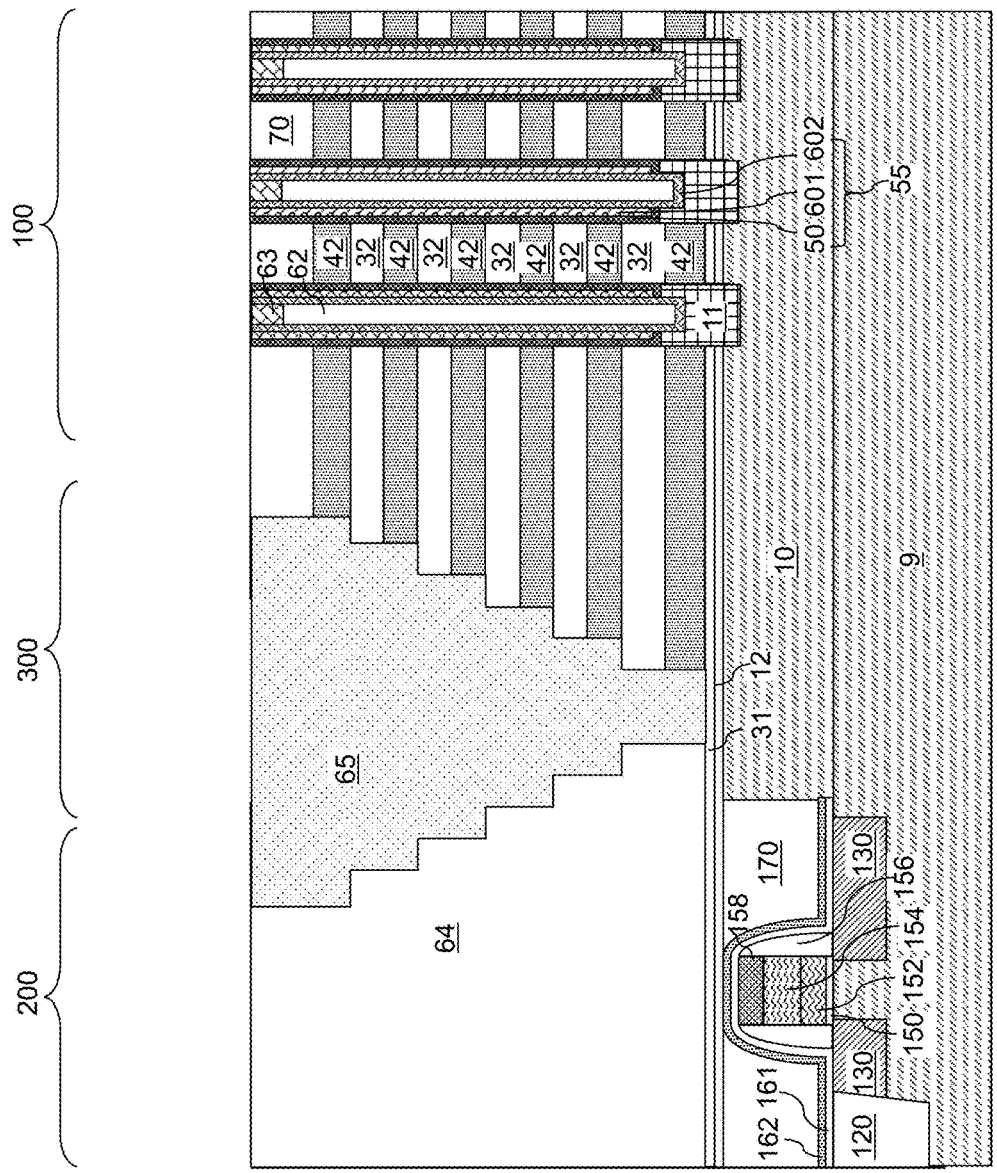
FIG. 17 is a vertical cross-sectional view of a second exemplary structure after formation of a stepped terrace and a retro-stepped dielectric material portion according to a second embodiment of the present disclosure.

Referring to FIG. 17, a second exemplary structure according to a second embodiment of the present disclosure can be derived from the first exemplary structure of FIG. 3 by omitting formation of the optional first array contact level dielectric layer 71, and performing the processing steps of FIG. 4. In this case, the insulating cap layer 70 can be employed as a stopping layer during planarization processes.

Figure 18A:
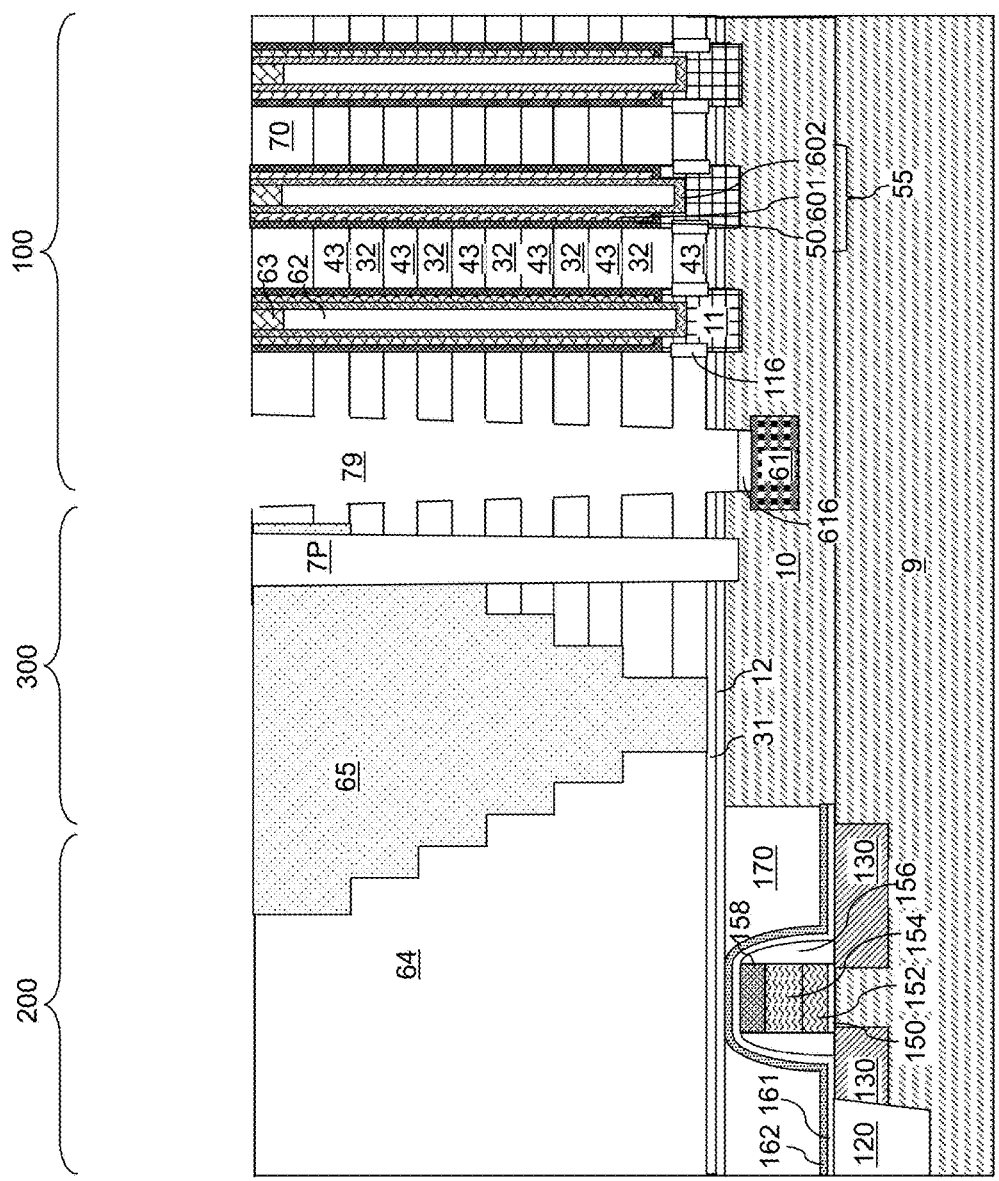
FIG. 18A is a vertical cross-sectional view of the second exemplary structure after formation of a backside contact trench and backside recesses according to a second embodiment of the present disclosure.
Figure 18B:
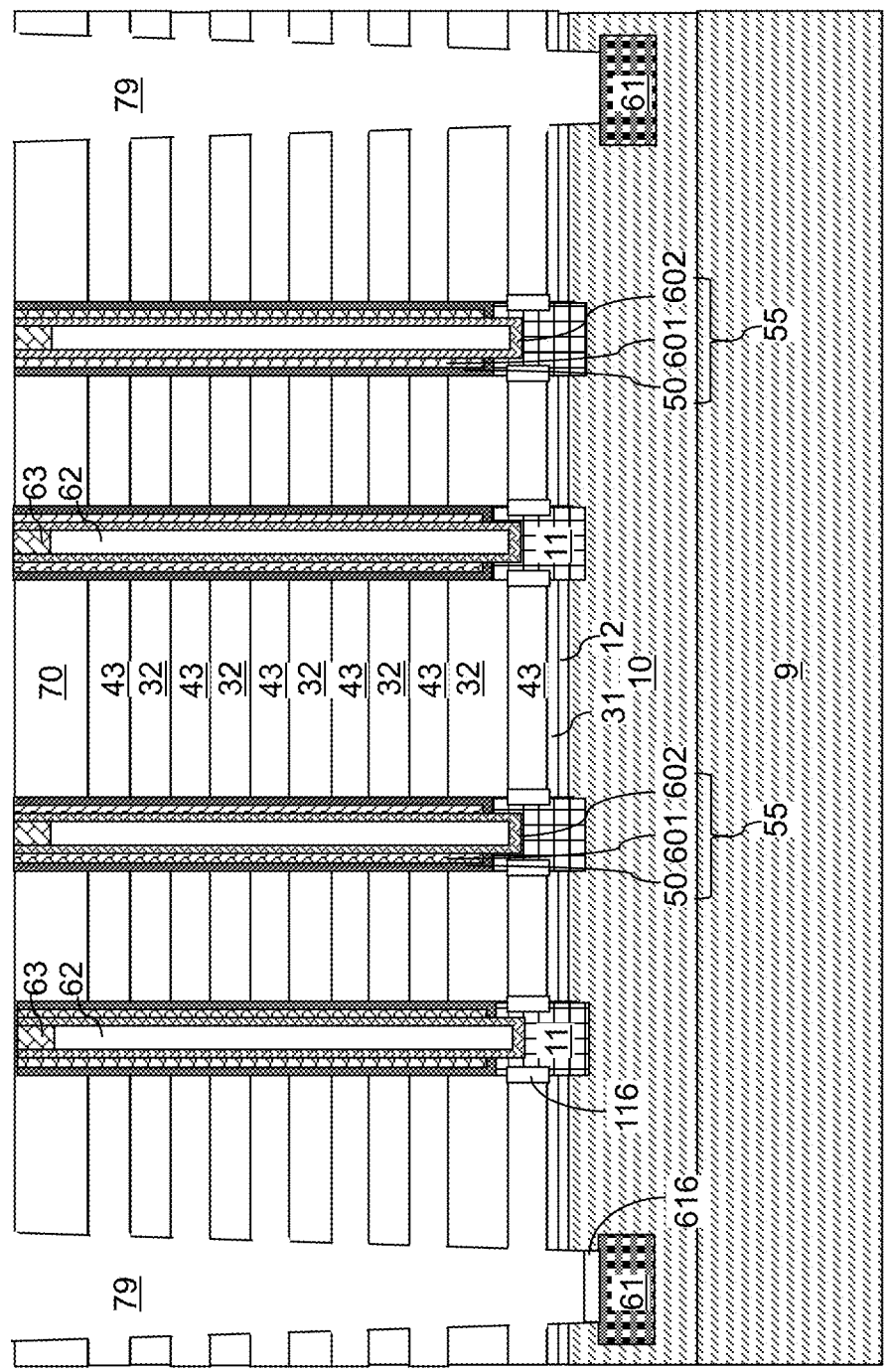
FIG. 18B is another vertical cross-sectional view of the second exemplary structure of FIG. 18A.

Referring to FIGS. 18A-18C, the processing steps of FIGS. 5A-5C can be performed. Optionally, the dielectric material employed to form the at least one dielectric support pillar 7P and the second array contact level dielectric layer 73 may be completely removed from above the top surface of the insulating cap layer 70 during a planarization process. In this case, the second array contact level dielectric layer 73 is not formed in the second exemplary structure, and the insulating cap layer 70 is the topmost layer after the planarization process. Subsequently, the backside contact trench 79 and the backside recesses 43 can be formed in the same manner as in the first embodiment.

Figure 19:
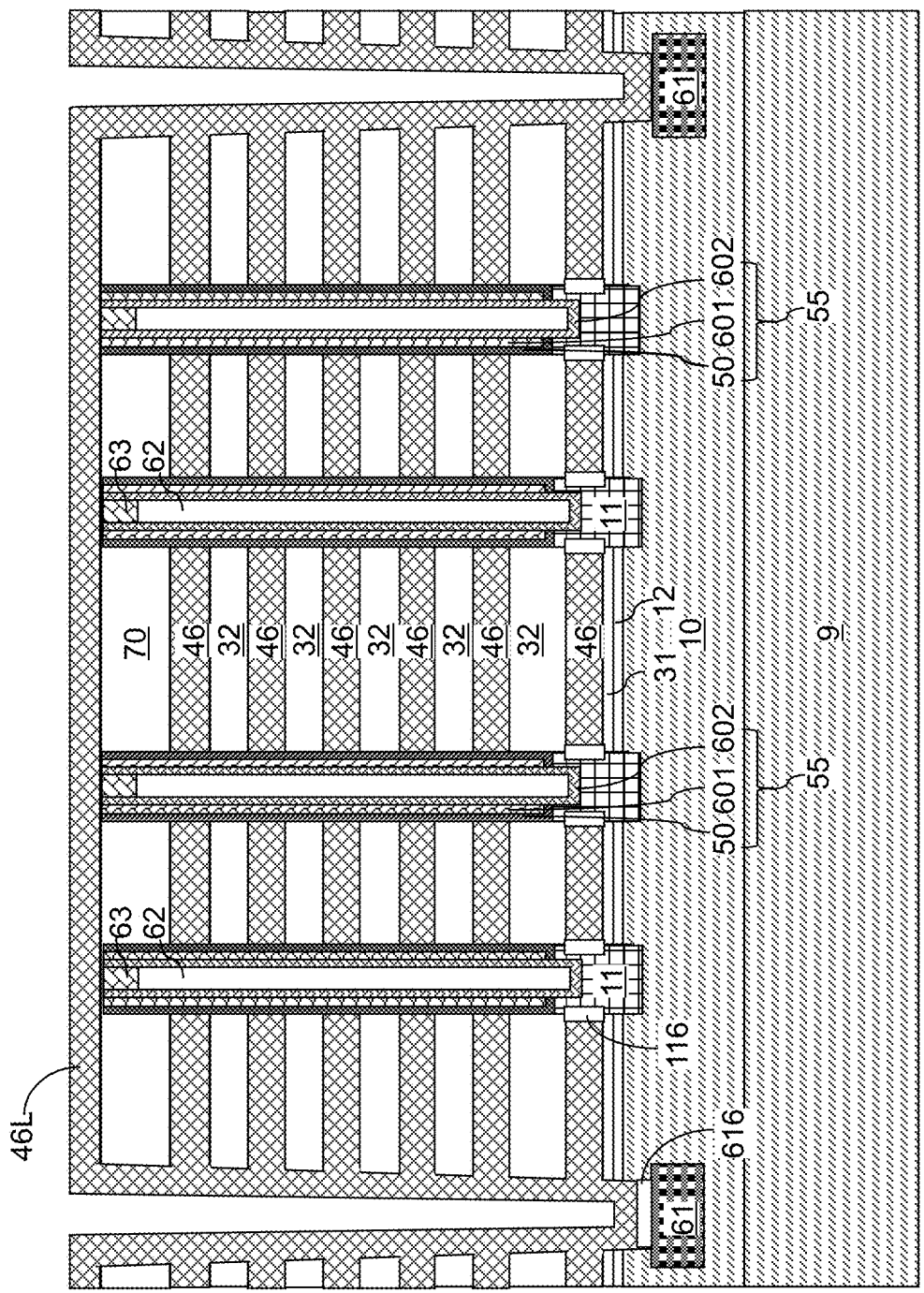
FIG. 19 is a vertical cross-sectional view of the second exemplary structure after formation of electrically conductive lines according to the second embodiment of the present disclosure.

Referring to FIG. 19, the processing steps of FIG. 6 are performed to form electrically conductive layers 46 and the contiguous conductive material layer 46L. In one embodiment, the contiguous conductive material layer 46L can be formed on the top surface of the insulating cap layer 70. In another embodiment, the contiguous conductive material layer 46L can be formed on a top surface of a second array contact level dielectric layer 73.

Figure 20:
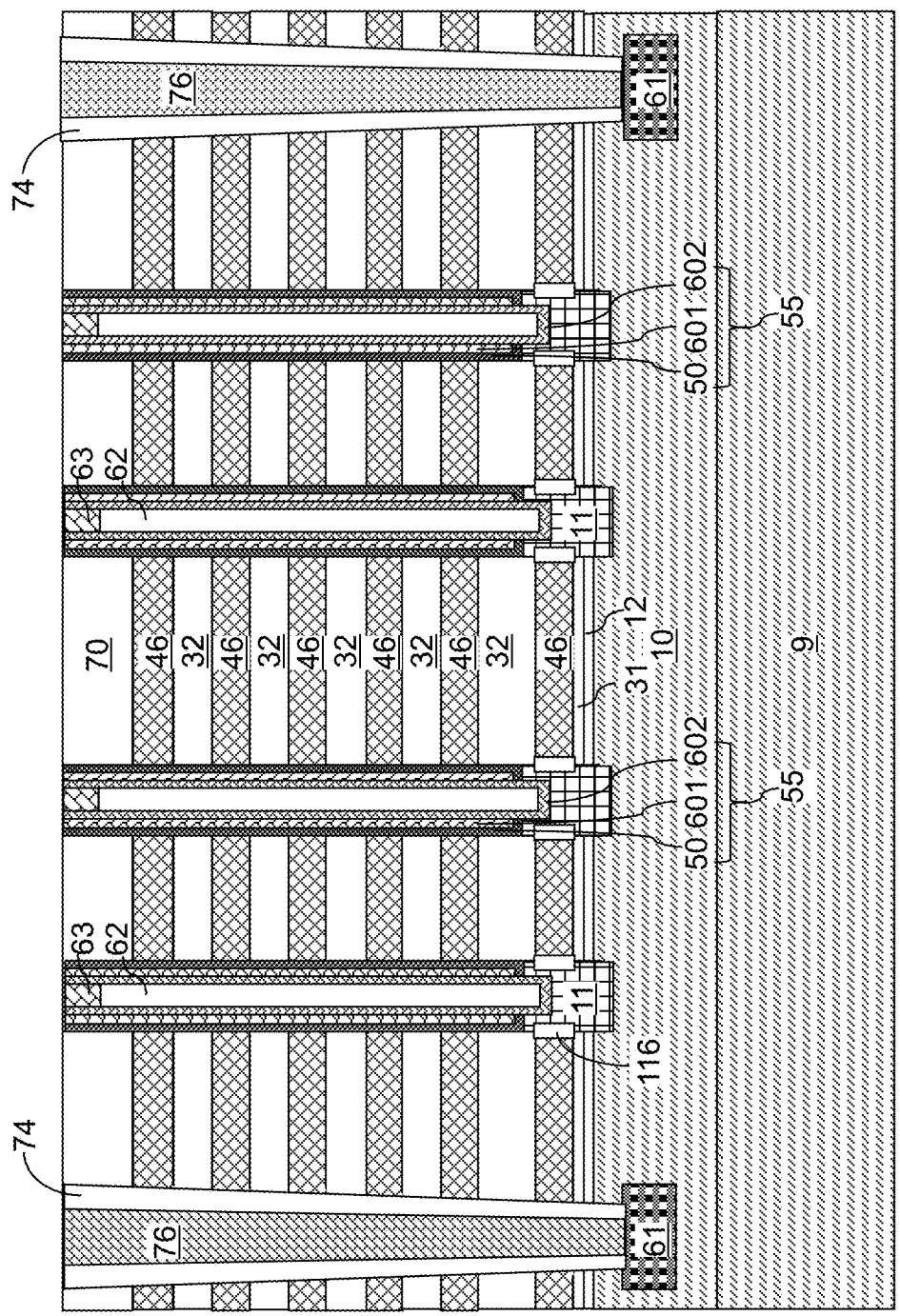
FIG. 20 is a vertical cross-sectional view of the second exemplary structure after formation of insulating spacers and backside contact via structures according to the second embodiment of the present disclosure.

Referring to FIG. 20, the processing steps of FIG. 7 are performed to form insulating spacers 74 and backside contact via structures 76.

Figure 21A:
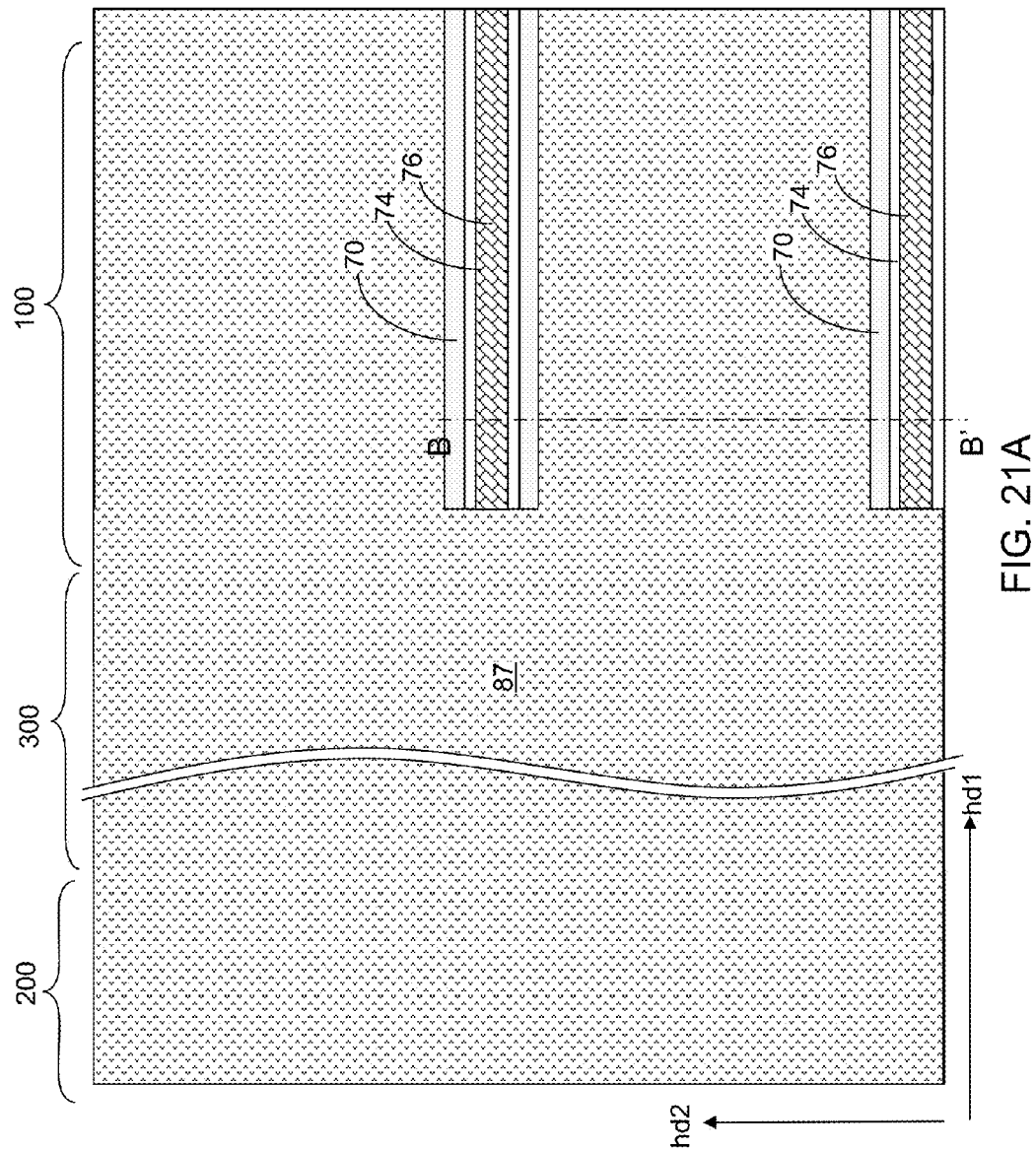
FIG. 21A is a top-down view of the second exemplary structure after application and patterning of a photoresist layer, and recessing of the backside contact via structures according to the second embodiment of the present disclosure.
Figure 21B:
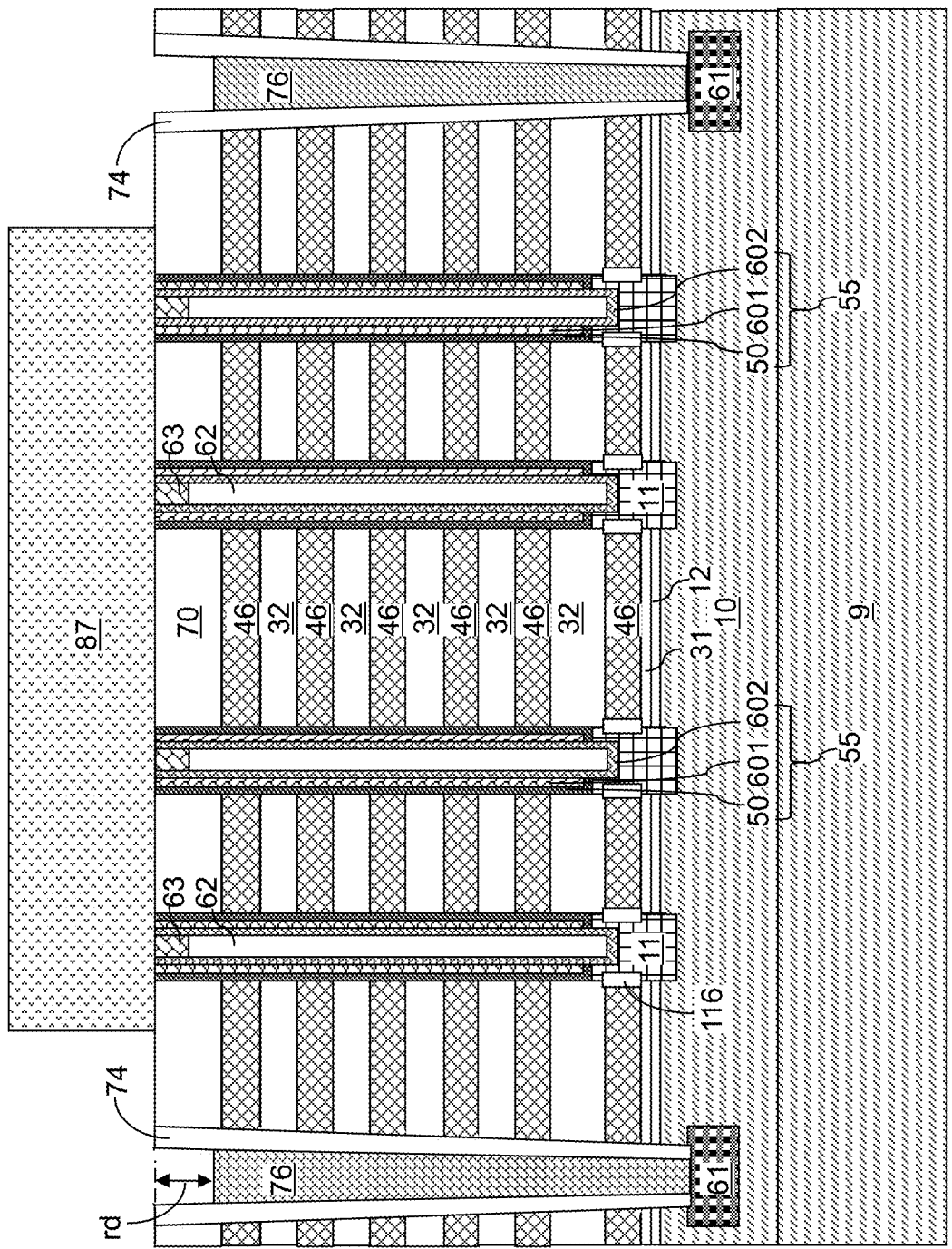
FIG. 21B is vertical cross-sectional views of the second exemplary structure along to the vertical plane of B-B' in FIG. 21A

Referring to FIGS. 21A and 21B, the processing steps of FIGS. 8A and 8B can be performed to recess portions of the backside contact via structures 76.

Figure 22:
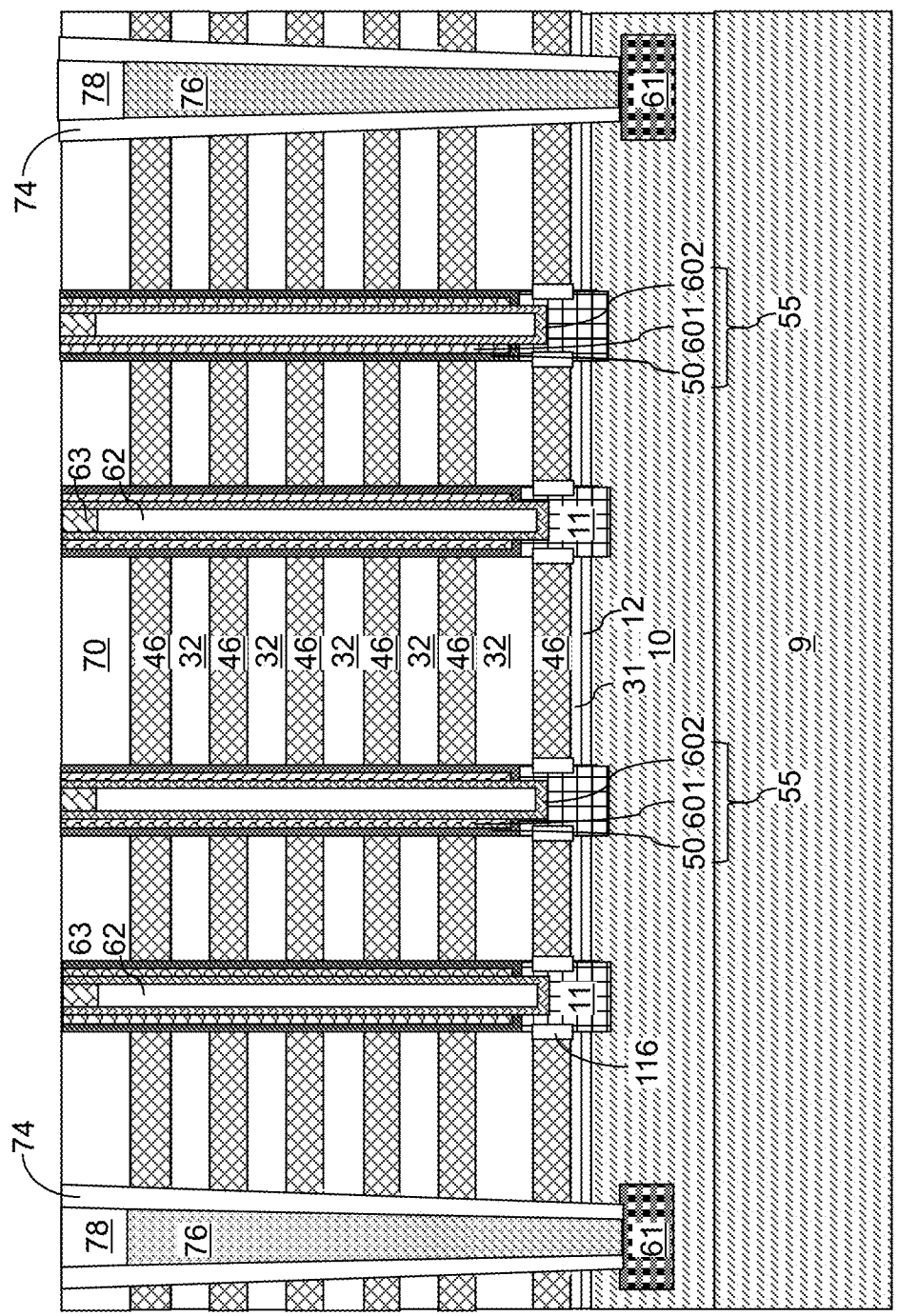
FIG. 22 is a vertical cross-sectional view of the second exemplary structure after formation of dielectric plugs in cavities overlying recessed backside contact via structures according to the second embodiment of the present disclosure.
Figure 23A:
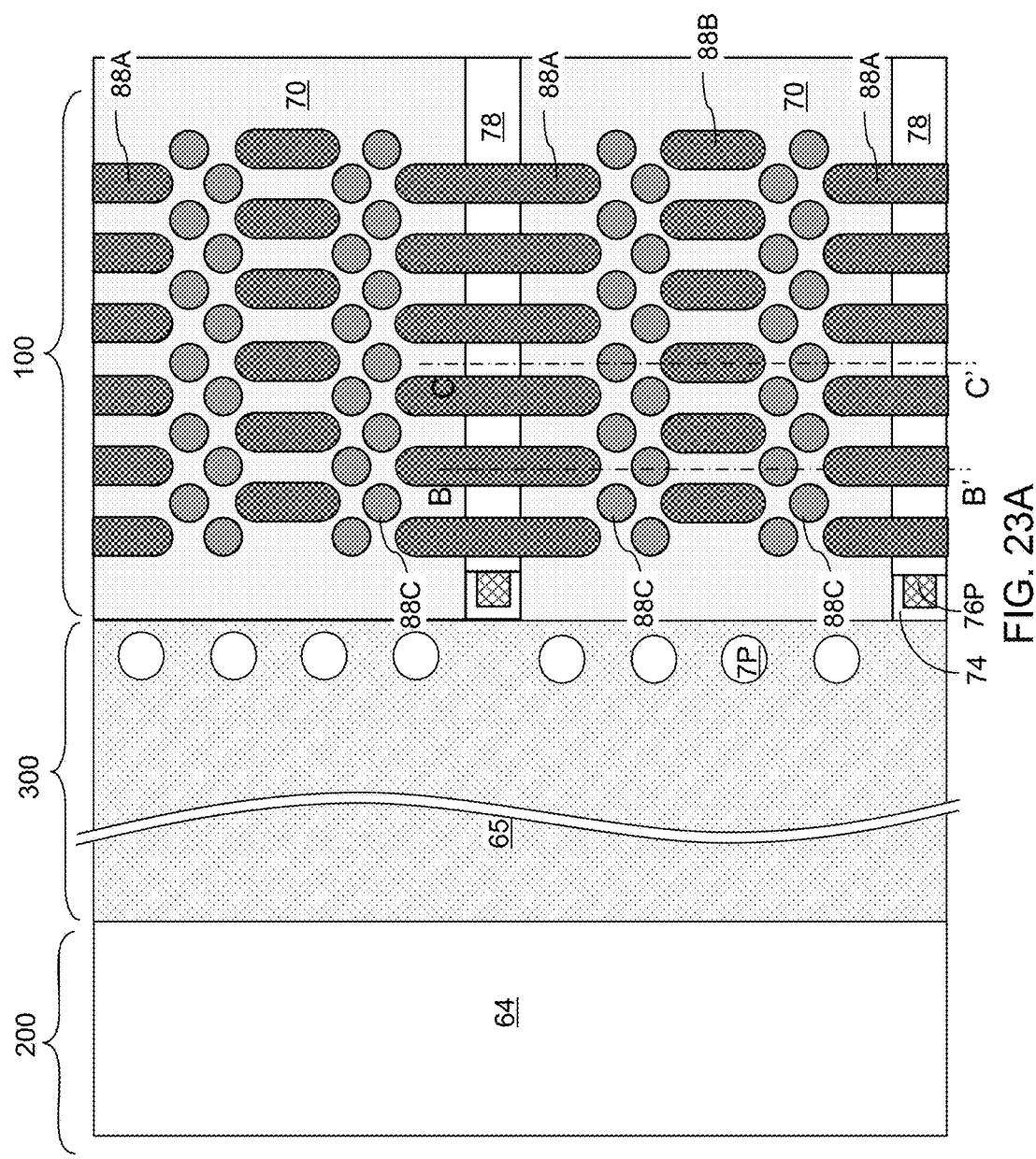
FIG. 23A is a top-down view of the second exemplary structure after formation of bridge line structures connecting memory stack structures and bridge level contact via structures according to the second embodiment of the present disclosure. A bridge level dielectric layer is not shown in this see-through view.
Figure 23B:
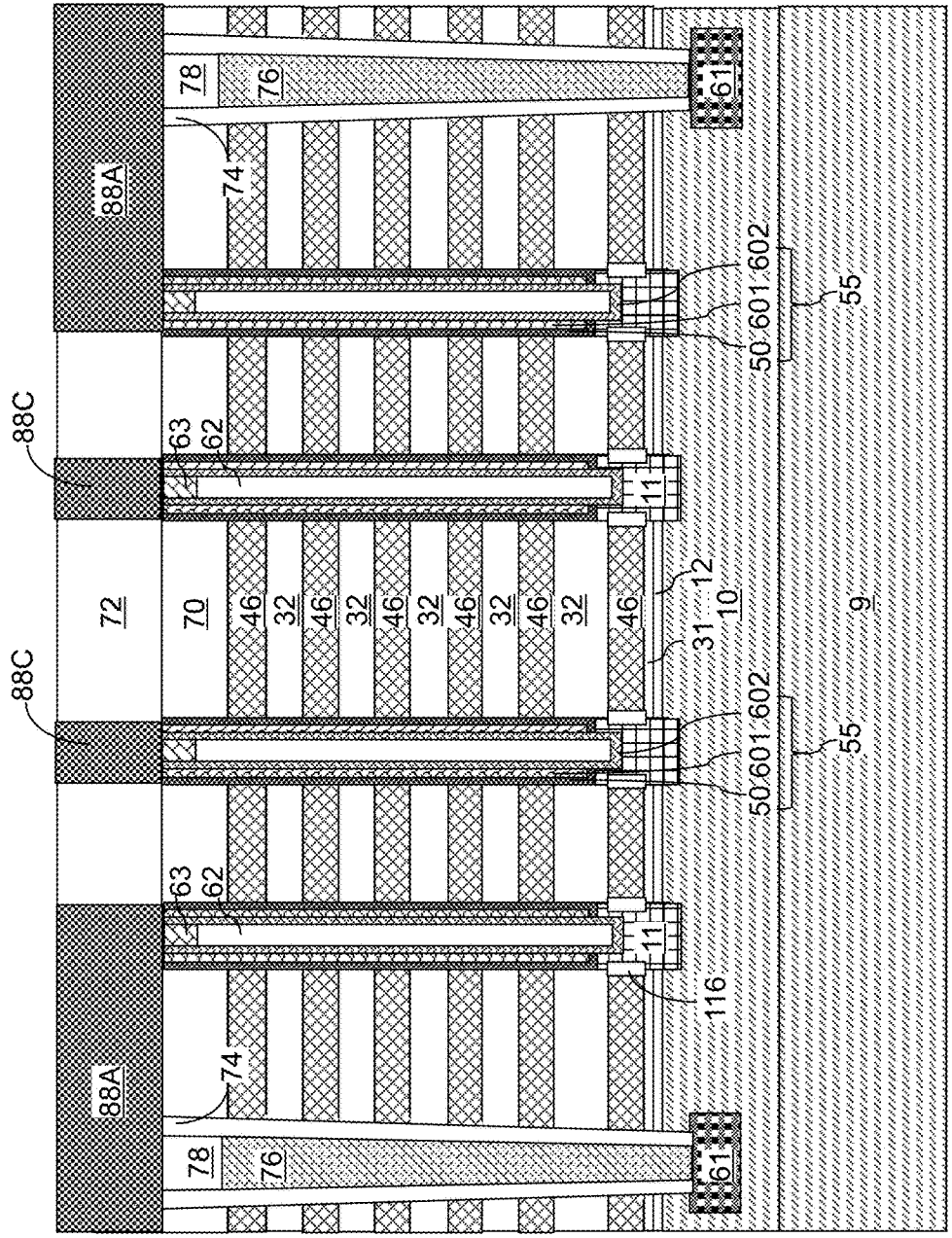
FIG. 23B is vertical cross-sectional views of the second exemplary structure along to the vertical plane of B-B' in FIG. 23A.
Figure 23C:
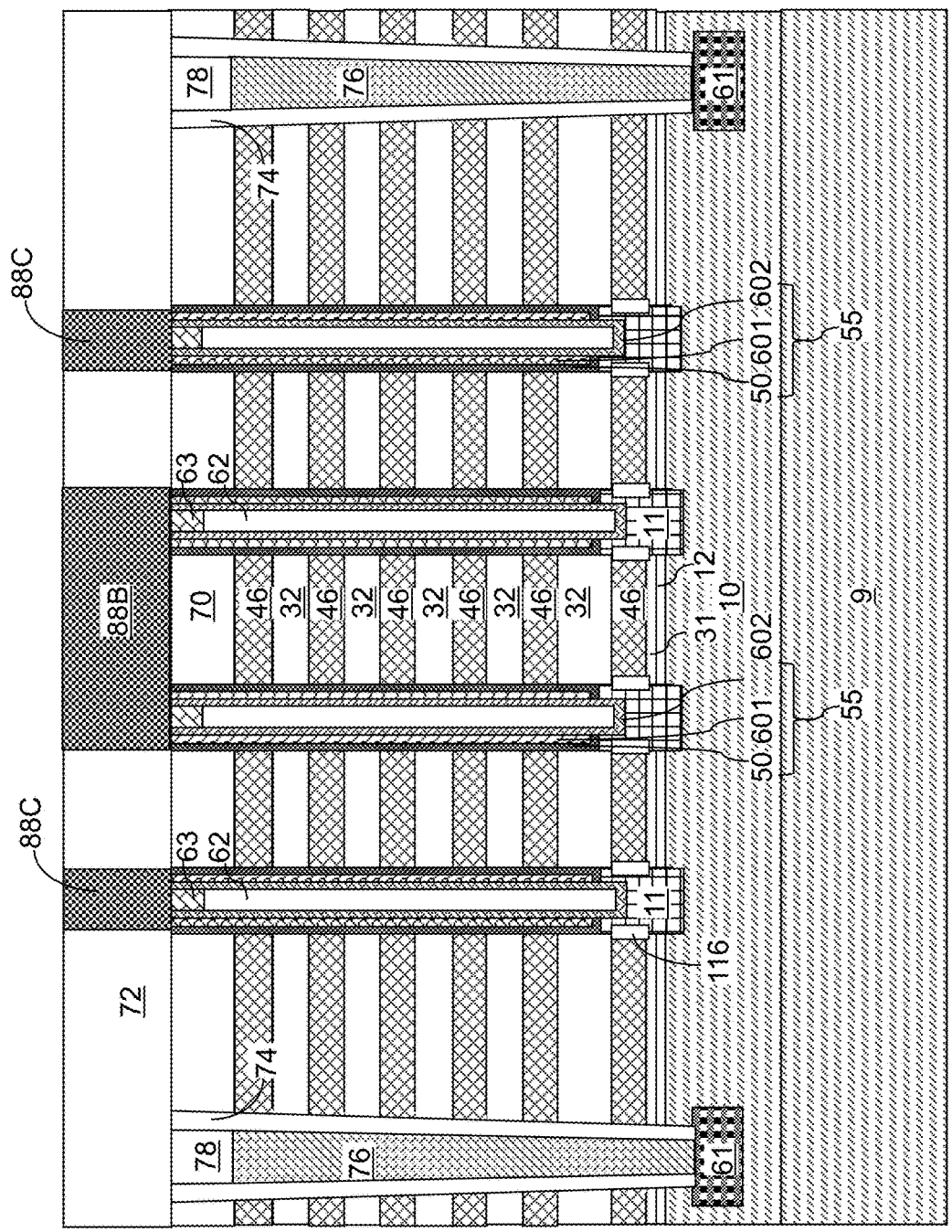
FIG. 23C is vertical cross-sectional views of the second exemplary structure along to the vertical plane of C-C' in FIG. 23A.
Figure 23D:
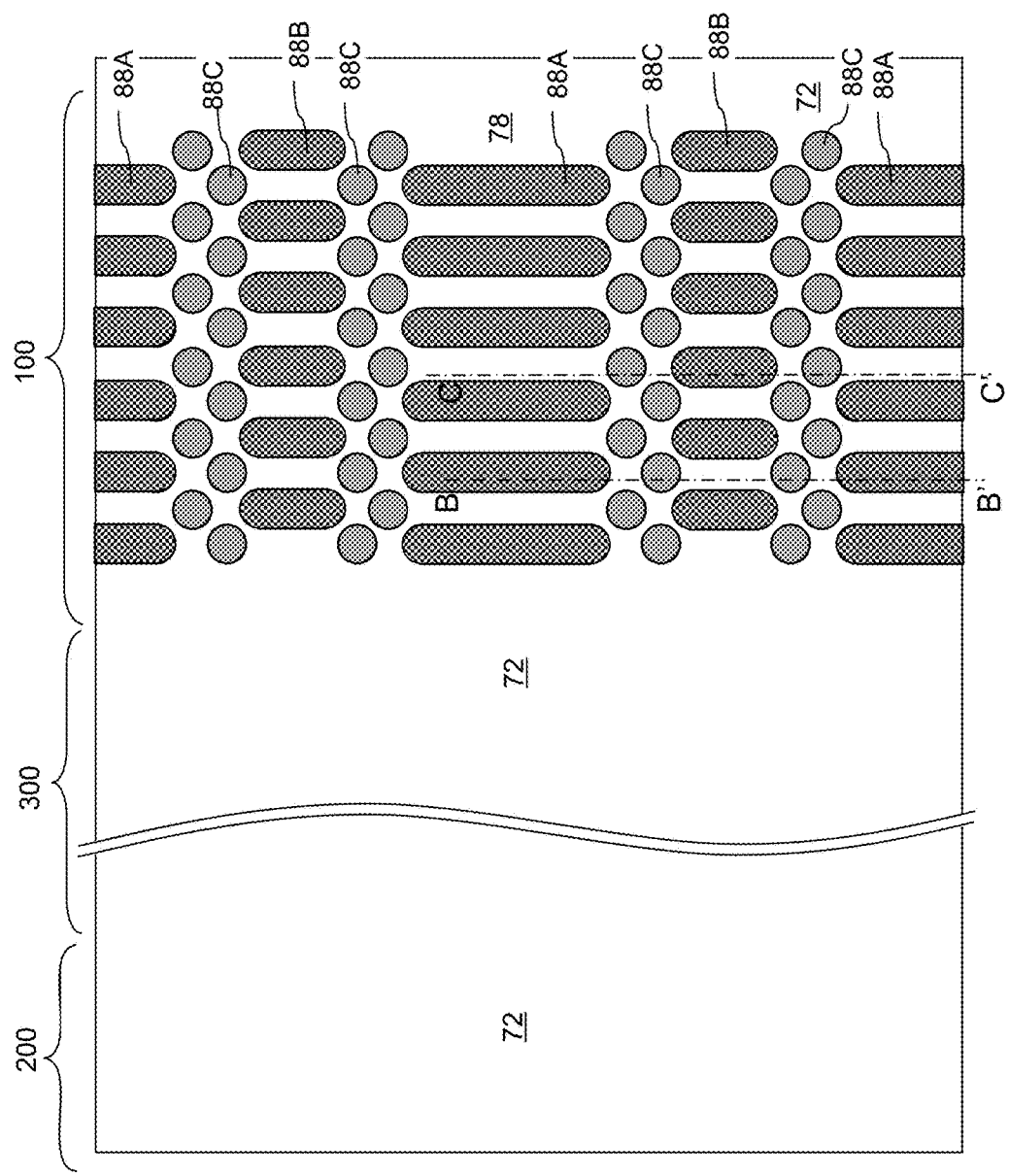
FIG. 23D is a top-down view of the second exemplary structure of FIGS. 23A-23C.
Figure 24B:
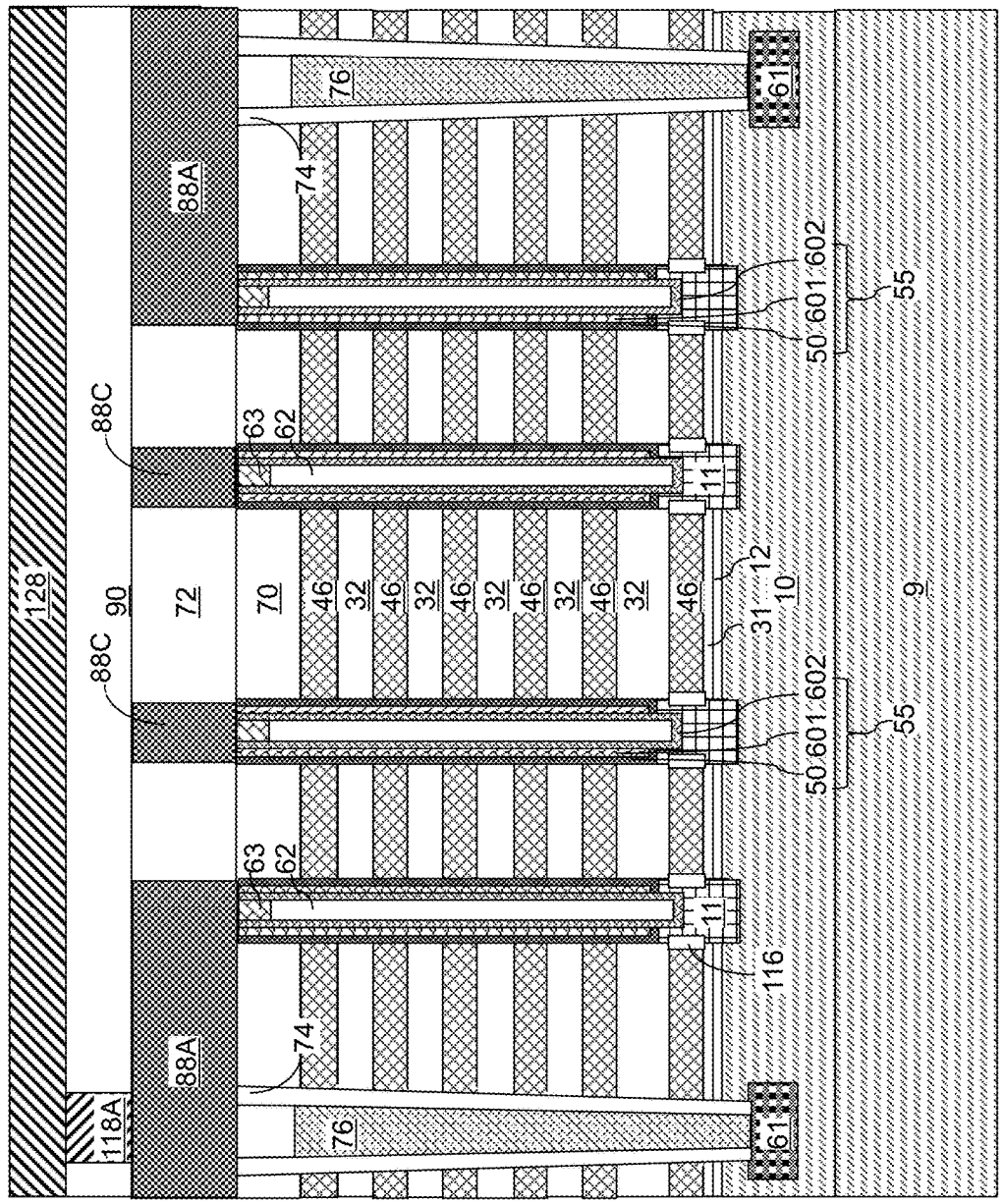
FIG. 24B is vertical cross-sectional views of the second exemplary structure along to the vertical plane of B-B' in FIG. 24A.
Figure 24C:
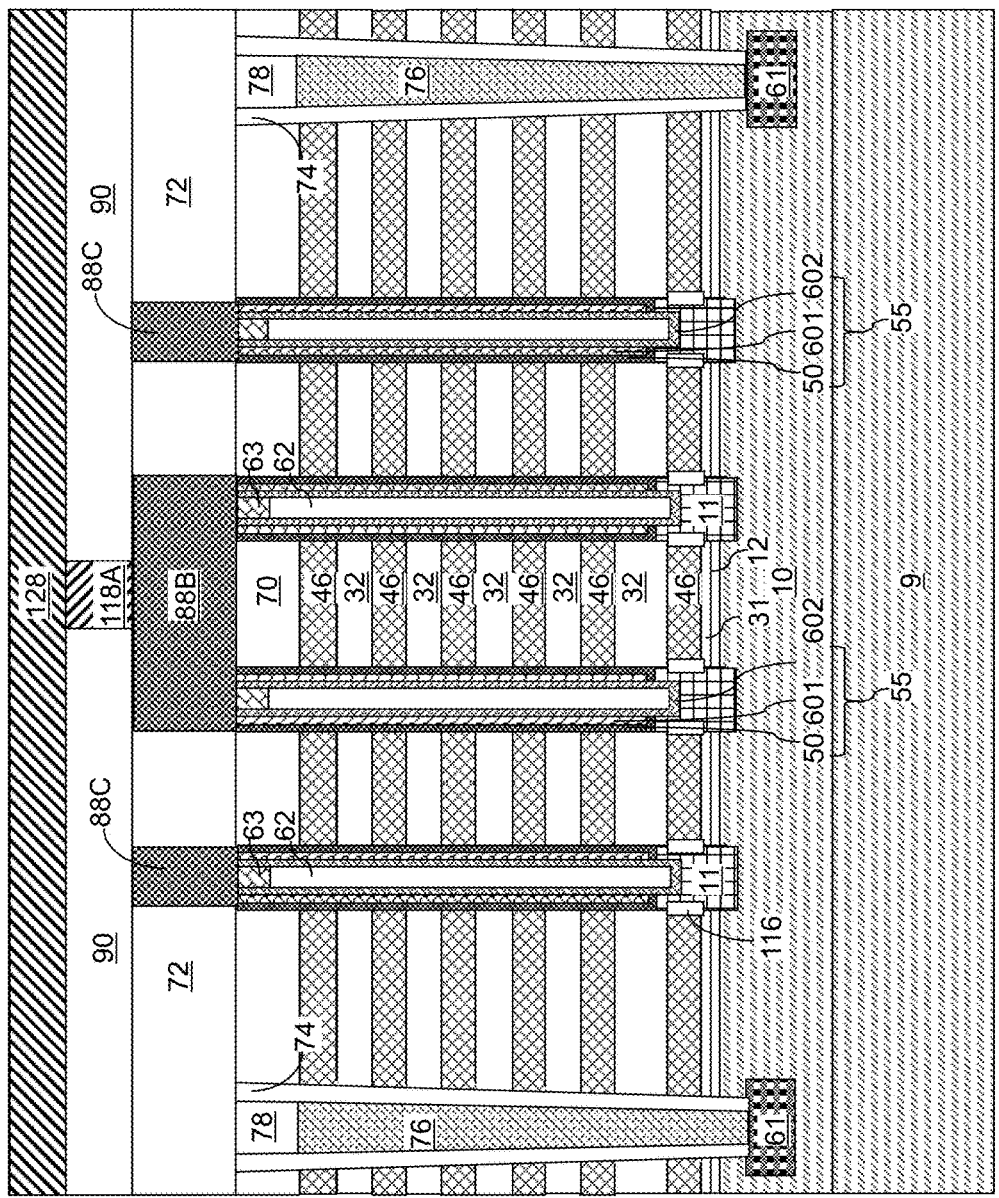
FIG. 24C is vertical cross-sectional views of the second exemplary structure along to the vertical plane of C-C' in FIG. 24A.
Figure 24D:
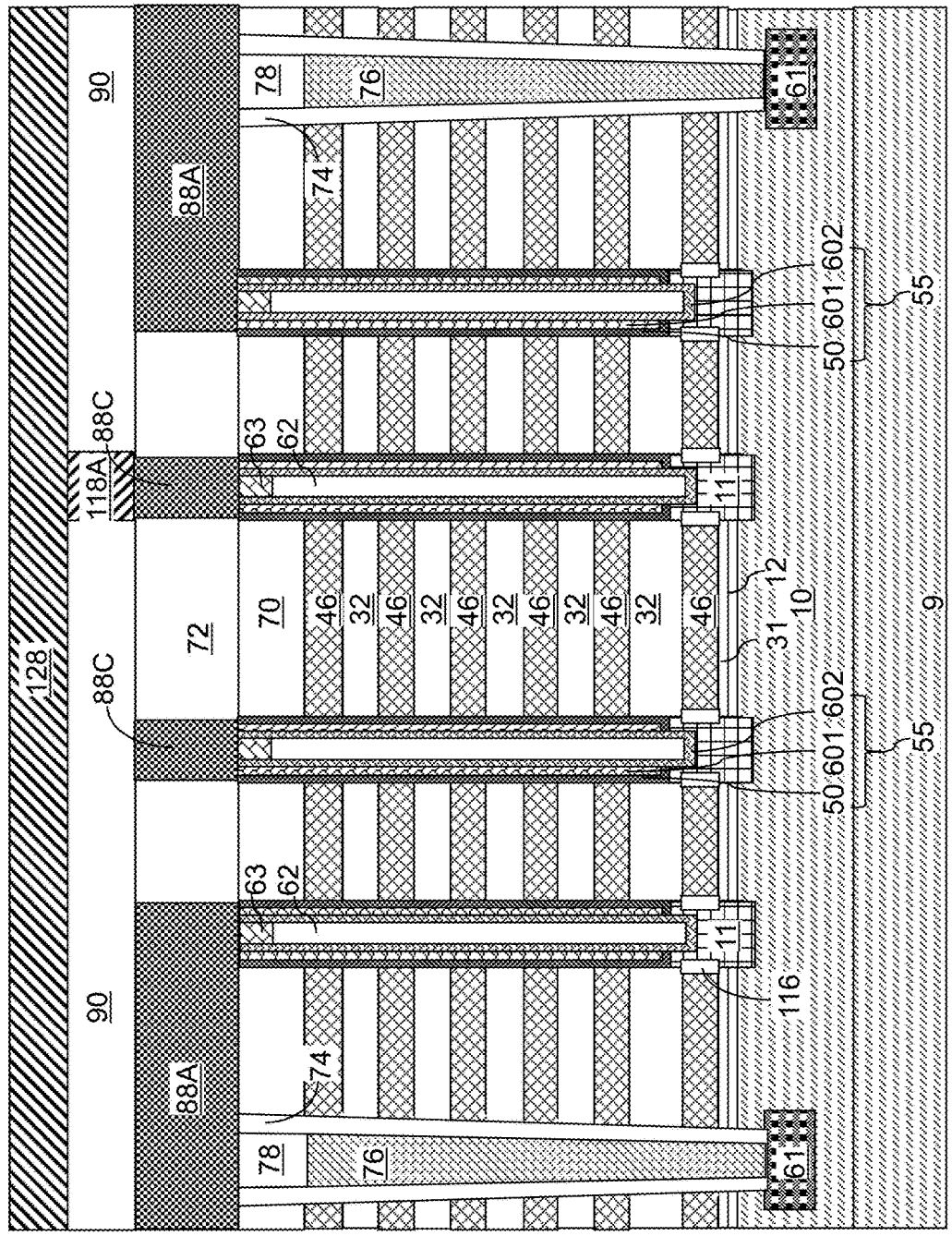
FIG. 24D is vertical cross-sectional views of the second exemplary structure along to the vertical plane of D-D' in FIG. 24A.
Figure 25B:
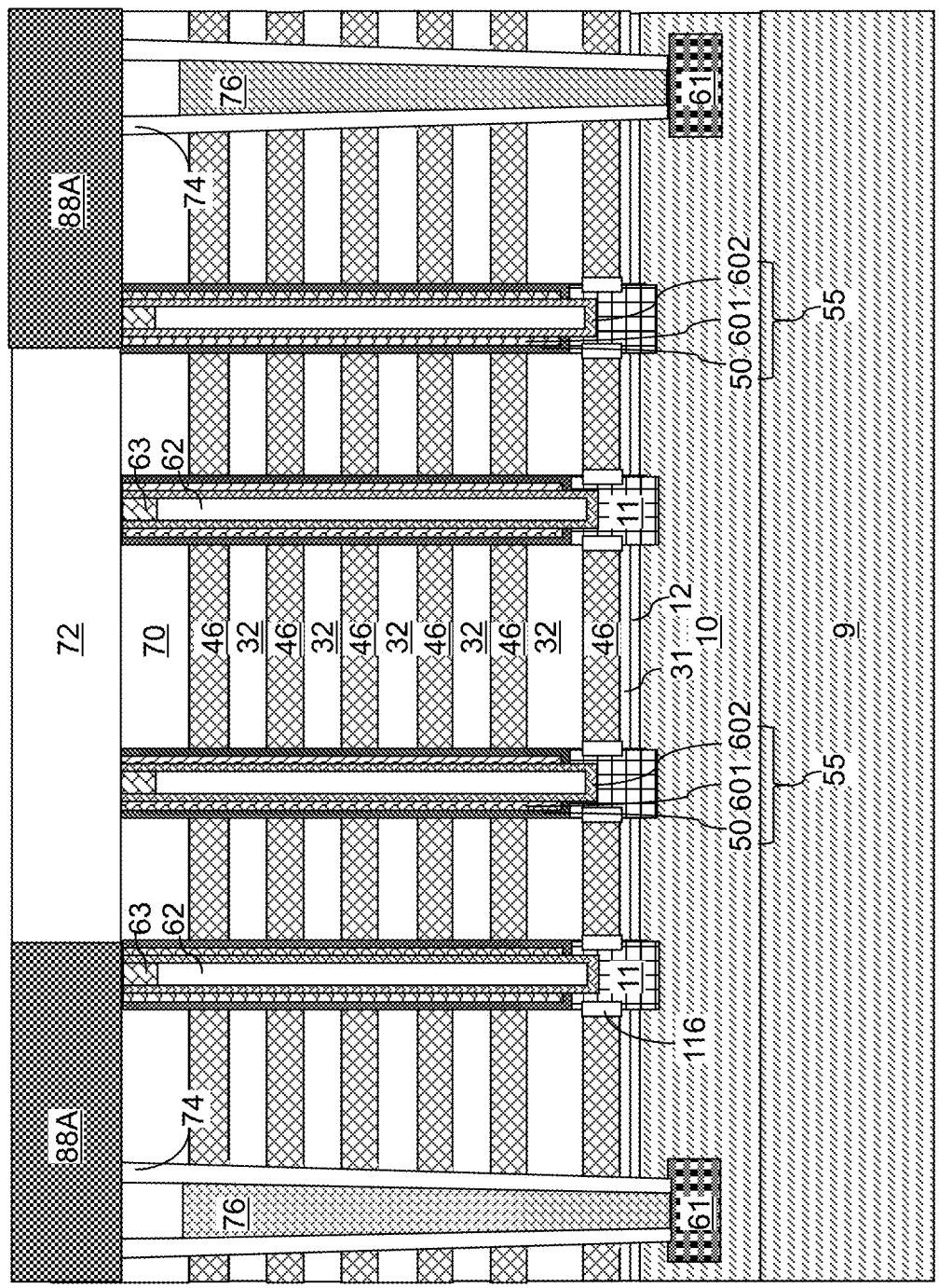
FIG. 25B is vertical cross-sectional views of the third exemplary structure along to the vertical plane of B-B' in FIG. 25A.
Figure 25C:
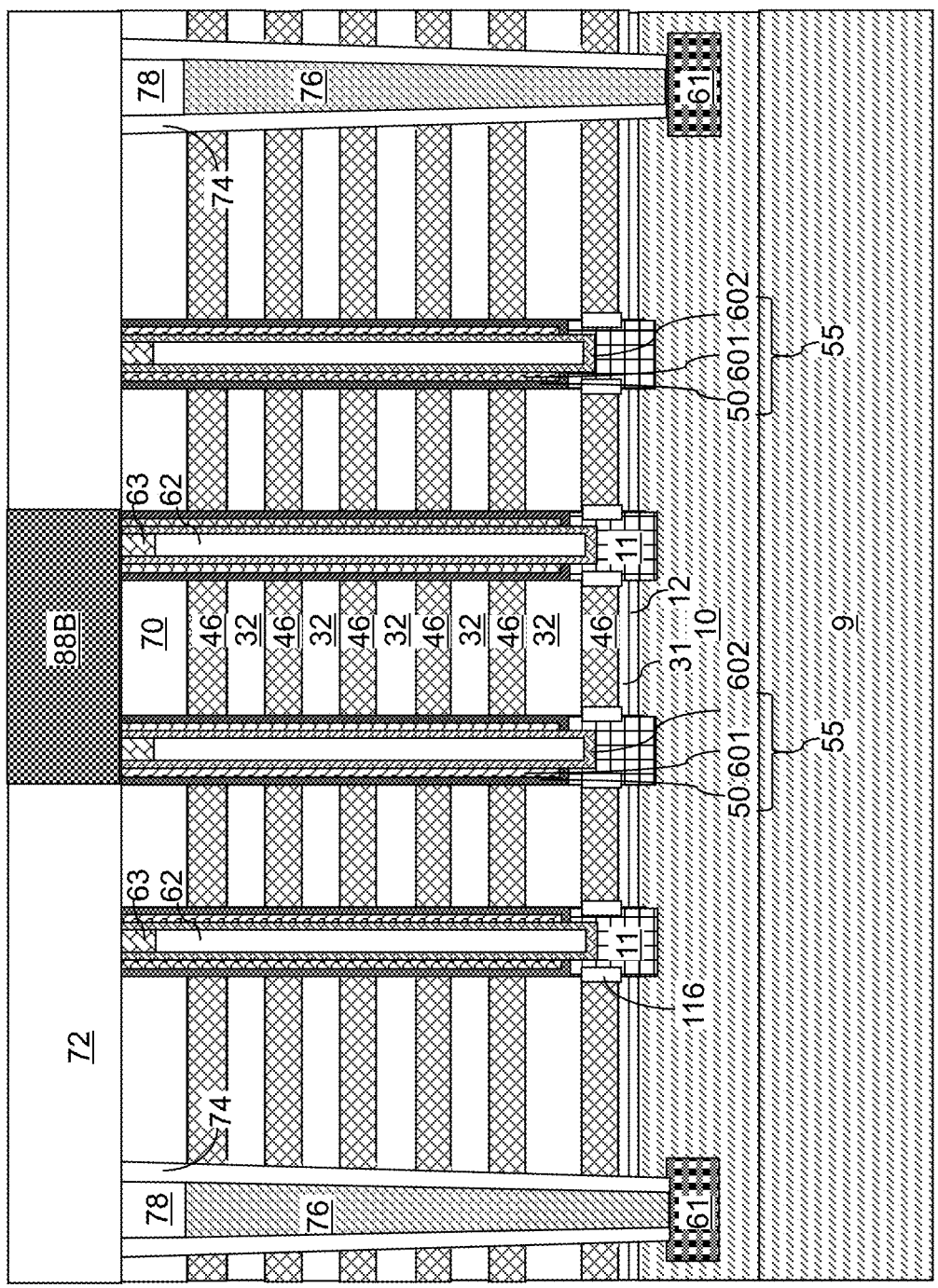
FIG. 25C is vertical cross-sectional views of the third exemplary structure along to the vertical plane of C-C' in FIG. 25A.
Figure 25D:
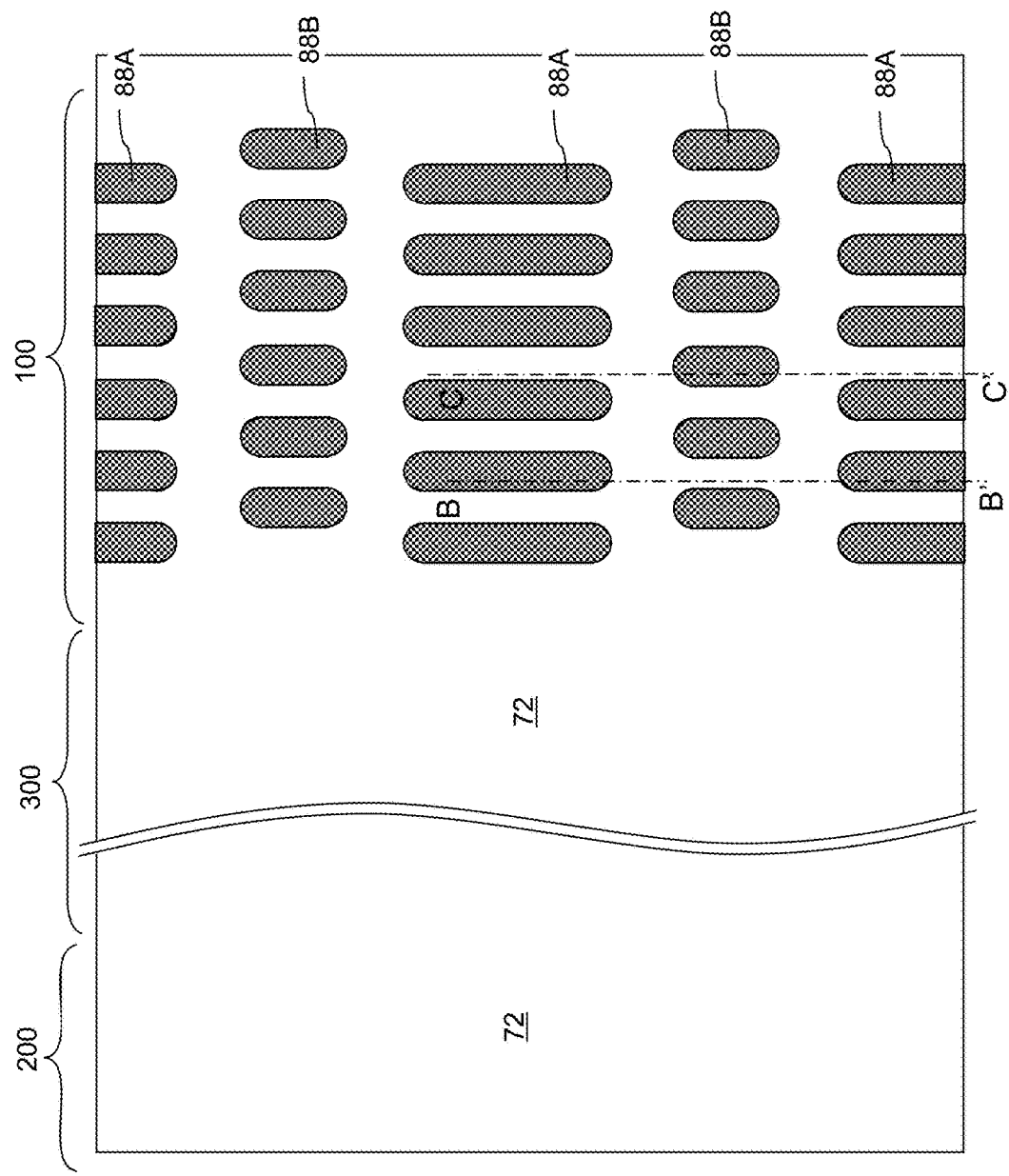
FIG. 25D is a top-down view of the third exemplary structure of FIGS. 25A-25C.
Figure 26B:
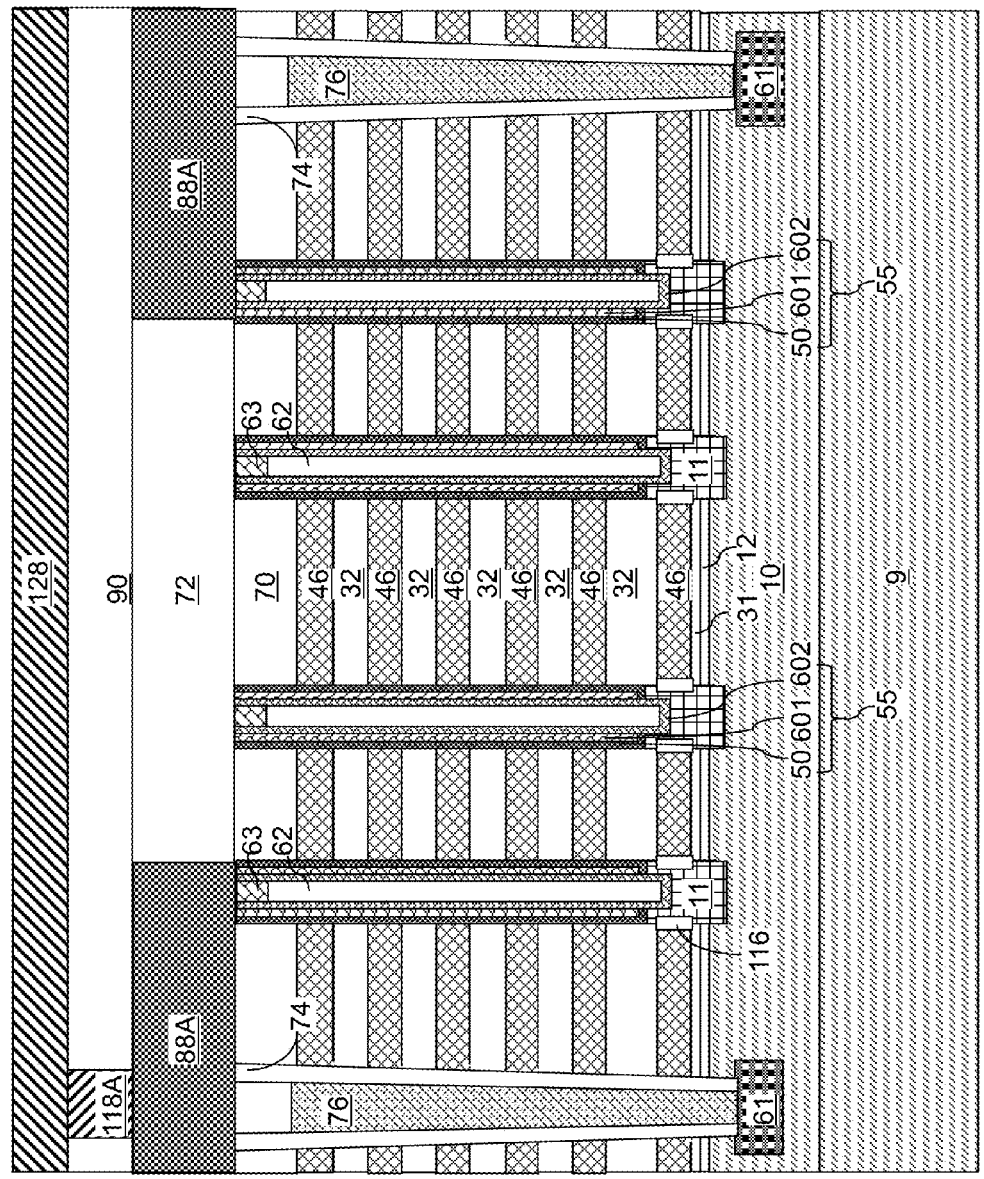
FIG. 26B is vertical cross-sectional views of the third exemplary structure along to the vertical plane of B-B' in FIG. 26A.
Figure 26C:
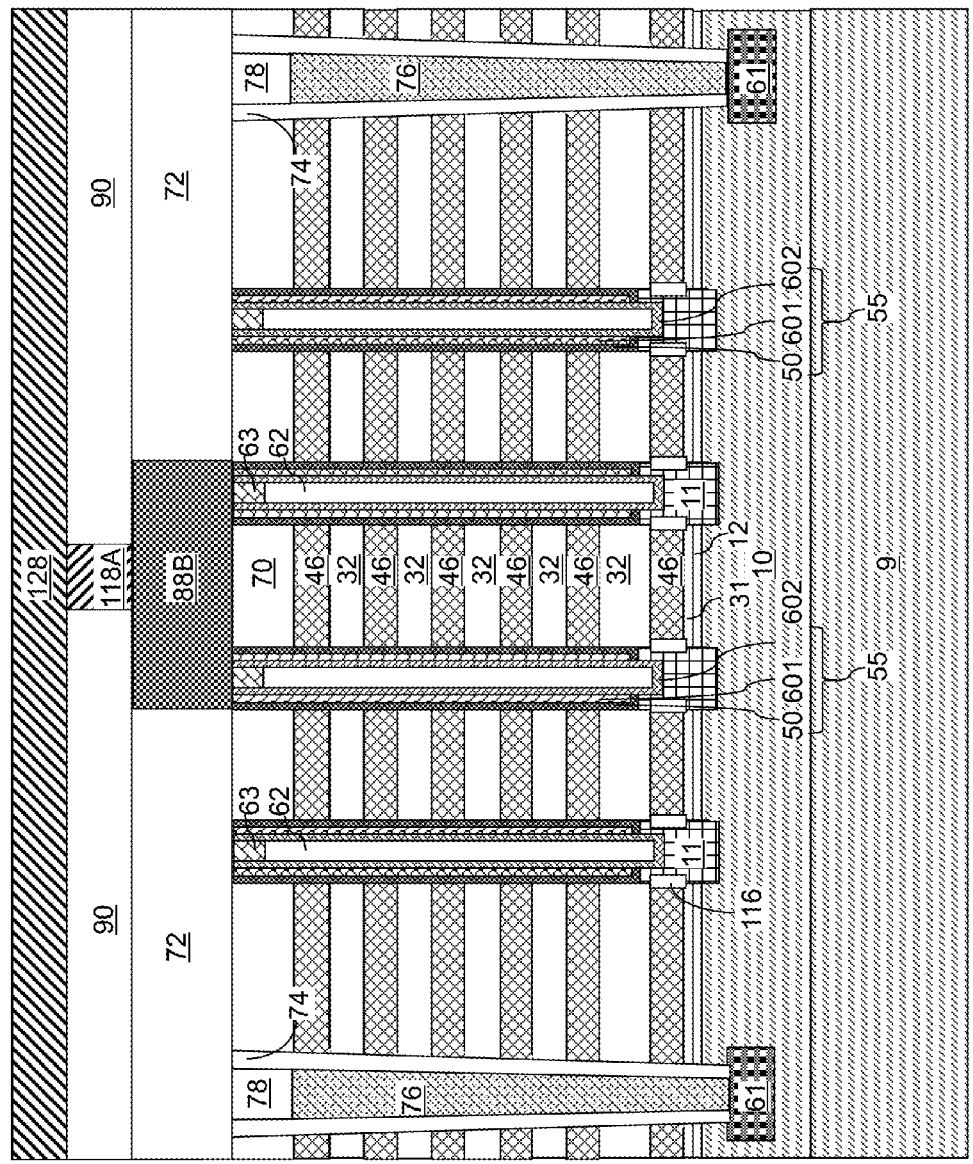
FIG. 26C is vertical cross-sectional views of the third exemplary structure along to the vertical plane of C-C' in FIG. 26A.
Figure 26D:
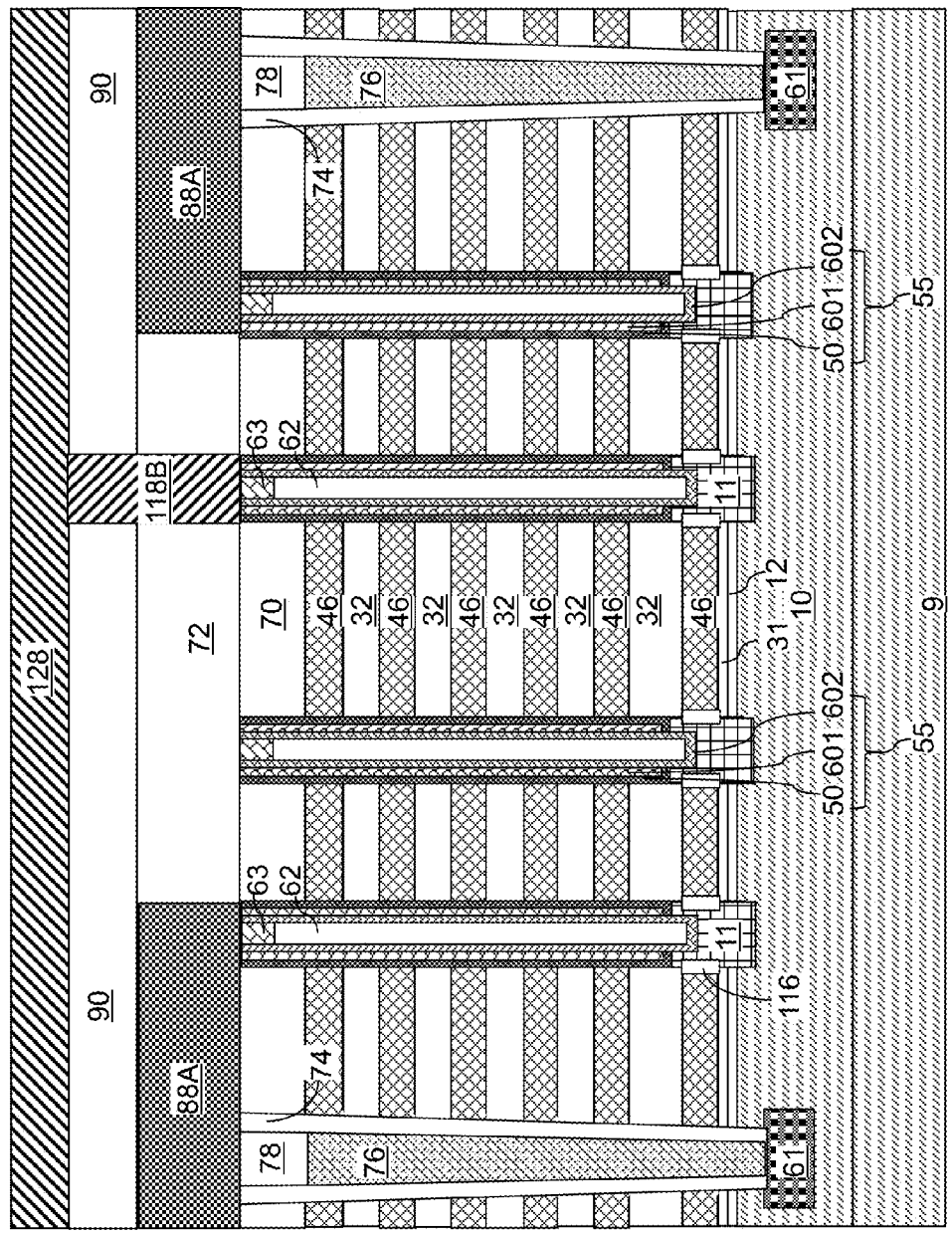
FIG. 26D is vertical cross-sectional views of the third exemplary structure along to the vertical plane of D-D' in FIG. 26A.

Referring to FIG. 22, the processing steps of FIG. 9 can be performed to form dielectric plugs 78 in cavities overlying recessed portions of the backside contact via structures 76.

Referring to FIGS. 23A-23D, a bridge level dielectric layer 72 can be formed over the insulating cap layer. The bridge level dielectric layer 72 comprises a dielectric material such as silicon oxide, silicon nitride, organosilicate glass, or a stack thereof. The bridge level dielectric layer 72 can be patterned to form openings having a composite pattern including the pattern of the bridge line structures (88A, 88B) illustrated in FIG. 10D of the first embodiment and the pattern of the second type contact via structures 118B (that contact a respective single memory stack structure 55) of the first embodiment. Thus, the pattern of the openings formed in the bridge level dielectric layer 72 includes a first pattern that replicates the pattern of the bridge line structures (88A, 88B) of the first embodiment, and a second pattern that replicates the pattern of the second type contact via structures 118B of the first embodiment. Top surfaces of a first subset of memory stack structures 55, a portion of the top surface of the insulating cap layer 70, a portion of a top surface of an insulating spacer 74, and a portion of a top surface of a dielectric plug 78 can be physically exposed within each opening in the bridge level dielectric layer 72 that corresponds to a pattern of a bridge line structure (88A, 88B) of the first embodiment. A top surface of no more than a single memory stack structure can be physically exposed within each opening corresponding to a pattern of a second type contact via structure 118B of the first embodiment.

The openings can be filled with at least one conductive material, and excess portions of the at least one conductive material can be removed from above the top surface of the bridge level dielectric layer 72, for example, by a planarization process. Remaining portions of the at least one conductive material within the openings in the first pattern constitute bridge line structures (88A, 88B), each of which contacts top surfaces of two or more memory stack structures. Remaining portions of the at least one conductive material within the openings in the second pattern constitute bridge level via structures 88C, each of which contacts a top surface of no more than a single memory stack structure 55. The bridge line structures (88A, 88B) and the bridge level via structures 88C can have the same composition.

Referring to FIGS. 24A-24D, the processing steps of FIGS. 11A-11D can be performed to form bit line contact via structures 118A and bit line structures 128. Each bit line contact via structure 118A can have the same thickness. In this case, each bottom surface of the bridge line structures (88A, 88B) and each bottom surface of the bridge level via structures 88C can be coplanar with top surfaces of the plurality of memory stack structures 55. In one embodiment, a horizontal surface of a portion of the backside contact via structure 76 that underlies first type bridge line structures 88A can be recessed below a horizontal plane including each bottom surface of the first type bridge line structures 88A. In one embodiment, each integrated line and via structure (128, 118A) can comprise a bit line structure 128 and at least one of a plurality of contact via structures 118A, which can be first type contact via structures 118A having the same height, i.e., the vertical distance between a first horizontal plane including the bottom surfaces of the bit line structures 128 and the top surfaces of the bridge line structures (88A, 88B) and the bridge level via structures 88C.

Referring to FIGS. 25A-25D, a third exemplary structure according to a third embodiment of the present disclosure is illustrated, which can be derived from the second exemplary structure of FIG. 22 by performing the processing steps of FIGS. 23A-23D with the modification that formation of the bridge level via structures 88C is omitted. In other words, the pattern of the openings in the bridge level dielectric layer 72 includes only the first pattern that replicates the pattern of the bridge line structures (88A, 88B) of the first embodiment, and does not include the second pattern employed in the second embodiment. Therefore, the pattern of the openings in the bridge level dielectric layer 72 in the third embodiment can be the same as the pattern of the bridge line structures (88A, 88B) that are formed at the processing steps of FIGS. 10A-10D.

Subsequently, at least one conductive material is deposited and excess portions of the deposited conductive material can be planarized above the top surface of the bridge level dielectric layer 72 to form the bridge line structures (88A, 88B), which can have the same pattern as the bridge line structures (88A, 88B) of the first embodiment.

Referring to FIGS. 26A-26D, the processing steps of FIGS. 11A-11D are performed to form bit line contact via structures (118A, 118B) and bit line structures 128. The bridge level dielectric layer 72 of the third embodiment is the functional equivalent of the at least one array contact level dielectric layer (71, 73). Thus, the geometrical relationship for the various elements of the first exemplary structure with respect to the at least one array contact level dielectric layer (71, 73) can be the same as the geometrical relationship for the corresponding elements of the third exemplary structure (i.e., elements having the same reference numeral) with respect to the bridge level dielectric layer 72.

Figure 27:
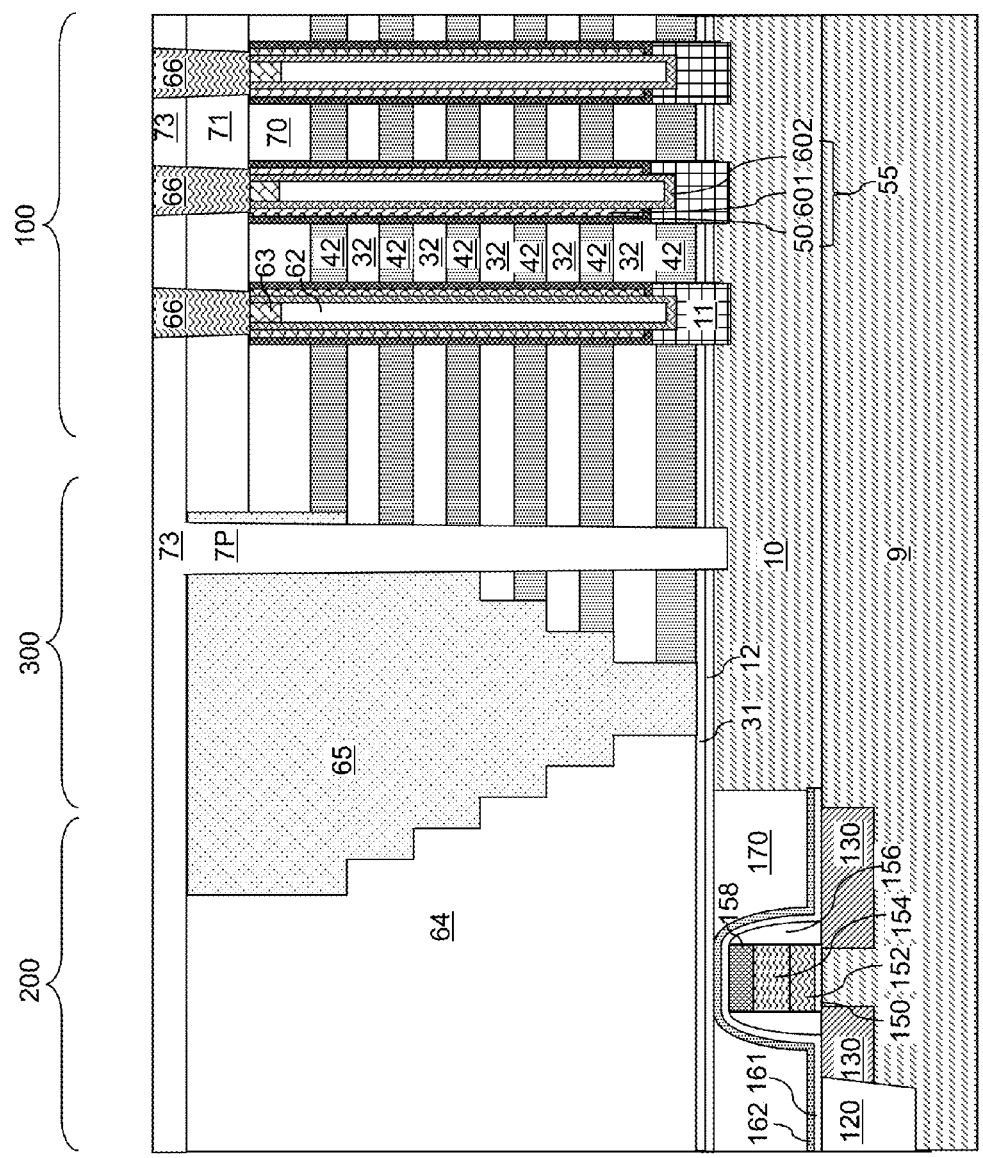
FIG. 27 is a vertical cross-sectional view of a fourth exemplary structure after formation of an array of memory contact via structures according to a fourth embodiment of the present disclosure.

Referring to FIG. 27, a fourth exemplary structure according to a fourth embodiment of the present disclosure can be derived from the first exemplary structure of FIG. 4 by forming the at least one dielectric support pillar 7P and an optional second array contact level dielectric layer 73 employing the same processing steps as in the first embodiment.

Figure 28A:
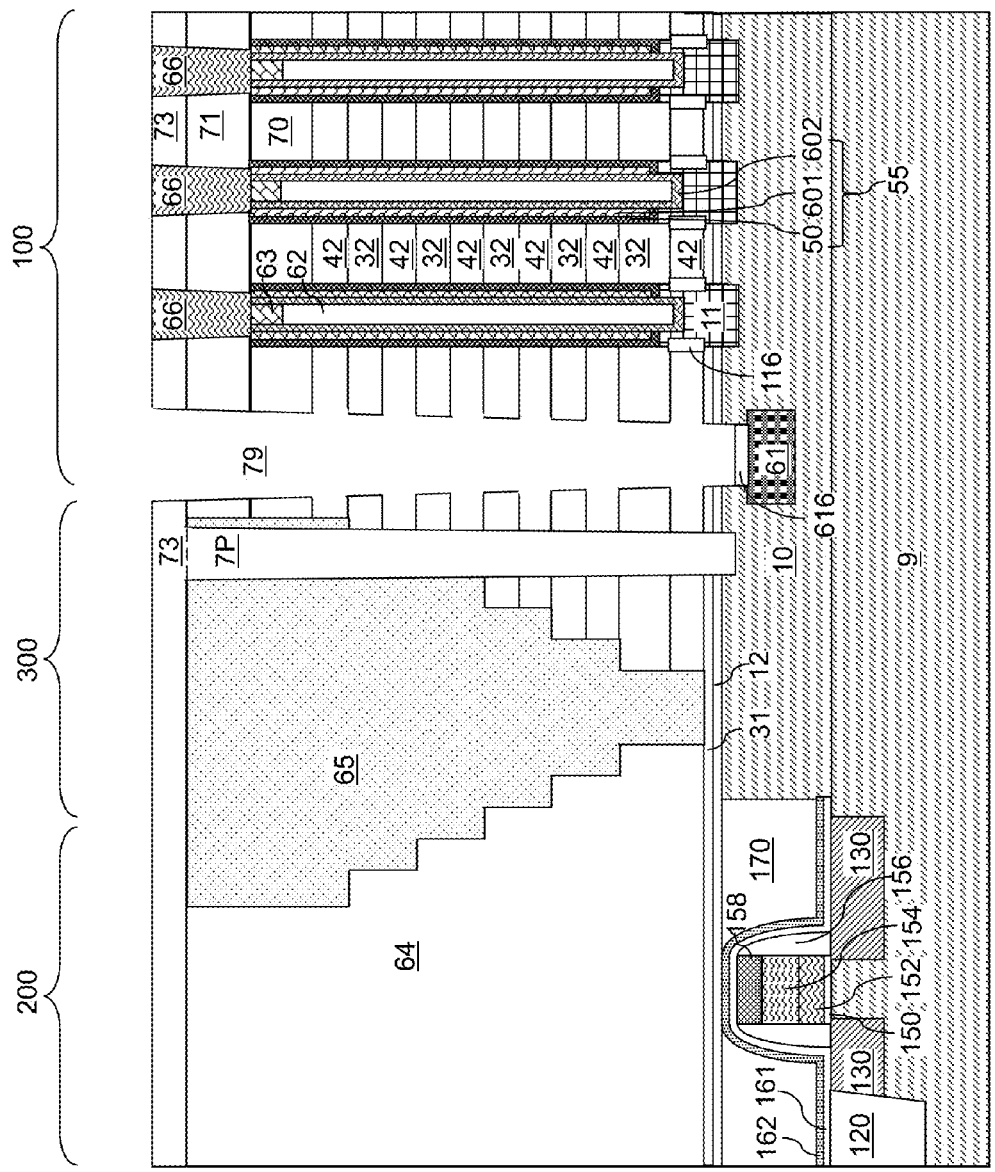
FIG. 28A is a vertical cross-sectional view of the fourth exemplary structure after formation of a backside contact trench and backside recesses according to the fourth embodiment of the present disclosure.
Figure 28B:
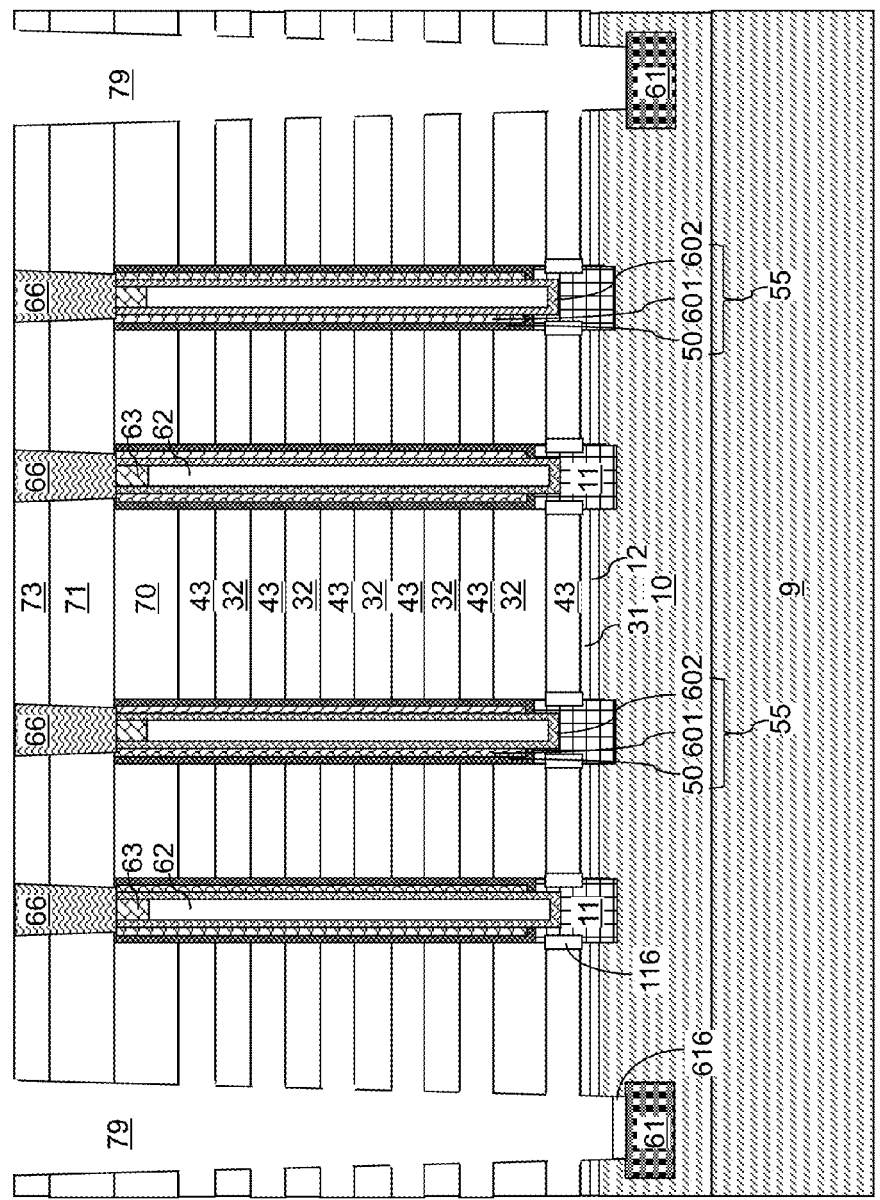
FIG. 28B is another vertical cross-sectional view of the fourth exemplary structure of FIG. 28A.
Figure 28C:
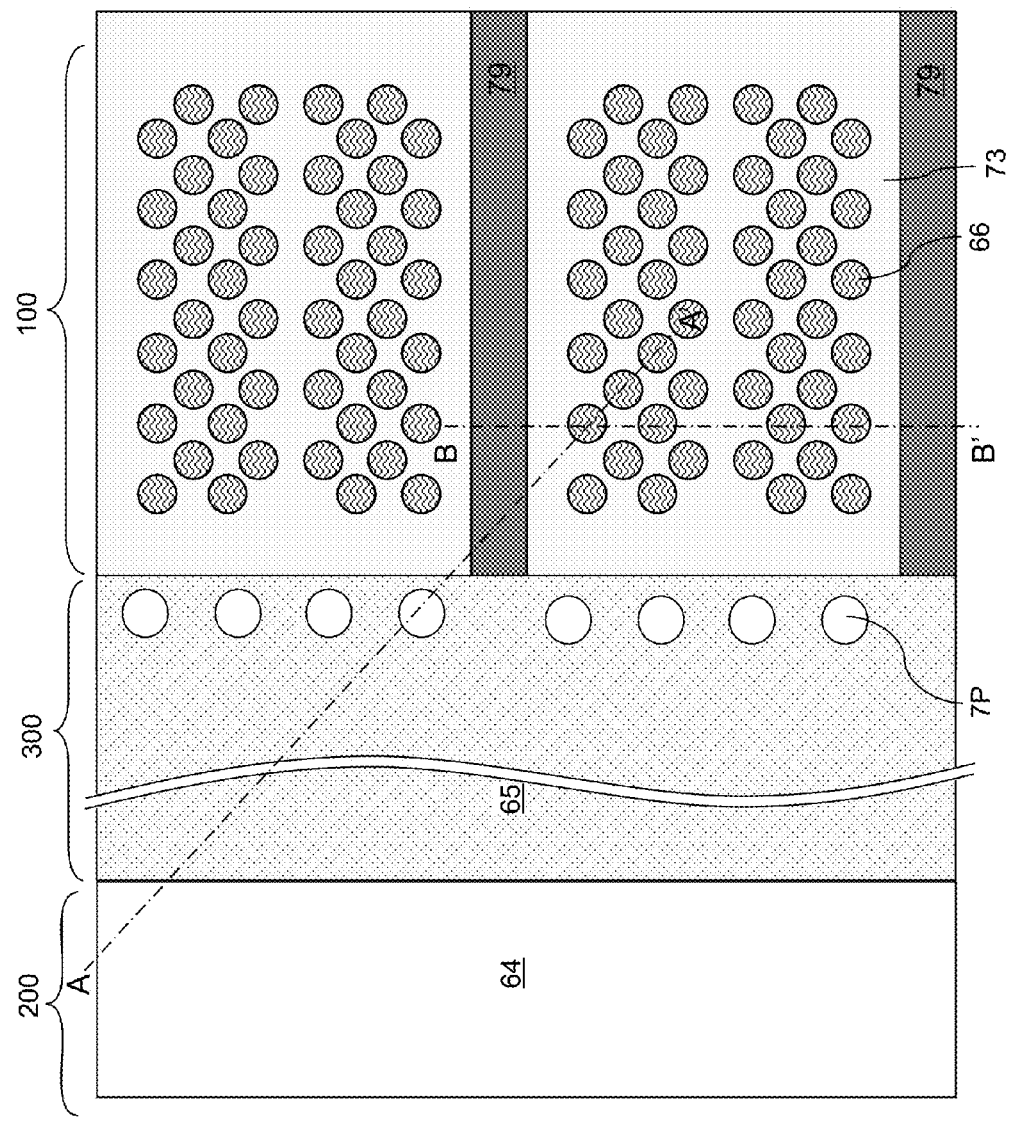
FIG. 28C is a see-through top-down view of the fourth exemplary structure of FIG. 28A. A second array contact level dielectric layer is not shown in this view. The vertical plane A-A' is the plane of the vertical cross-sectional view of FIG. 28A. The vertical plane B-B' is the plane of the vertical cross-sectional view of FIG. 28B.

Referring to FIG. 28A-28C, memory contact via structures 66 can be formed through the first and second array contact level dielectric layers (73, 71). For example, a photoresist layer can be applied over the second array contact level dielectric layer 73, and can be lithographically patterned to form openings overlying the drain structures 63. An anisotropic etch can be performed to transfer the pattern in the photoresist layer through the first and second array contact level dielectric layers (73, 71) to form memory contact via cavities that extend through the first and second array contact level dielectric layers (73, 71). The memory contact via cavities can be filled with at least one conductive material. Excess portions of the at least one conductive material can be removed from above a horizontal plane including a top surface of the second array contact level dielectric layer 73. Each remaining contiguous portion of the at least one conductive material constitutes a memory contact via structure 66, which contacts a top surface of an underlying drain region 63. The photoresist layer can be subsequently removed, for example, by ashing. Subsequently, at least one backside contact trench 79 and backside recesses 43 can be formed employing the same methods as in the first embodiment.

Figure 29:
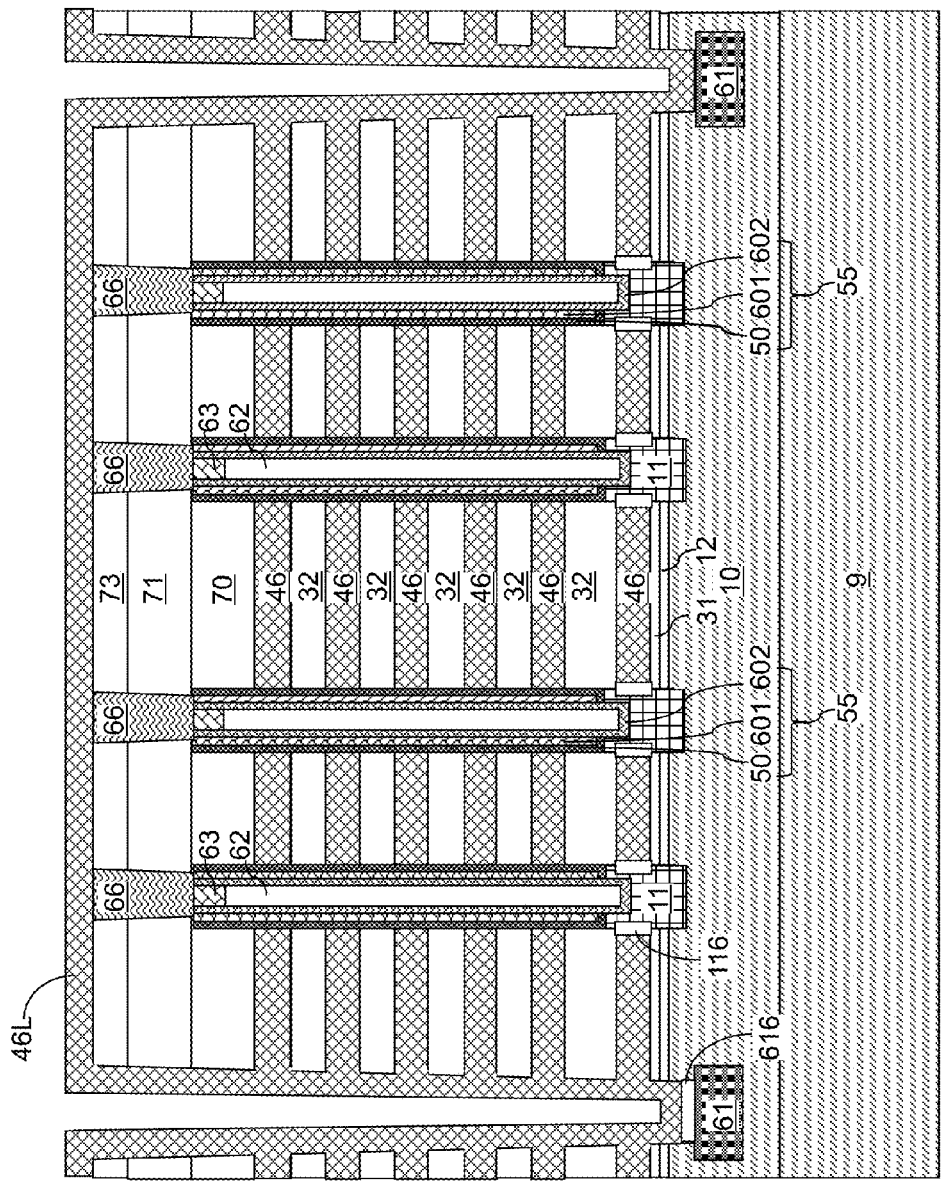
FIG. 29 is a vertical cross-sectional view of the fourth exemplary structure after formation of electrically conductive lines according to the fourth embodiment of the present disclosure.

Referring to FIG. 29, a plurality of electrically conductive layers 46 and a contiguous conductive material layer 46L can be formed by performing the processing steps of FIG. 6 of the first embodiment.

Figure 30:
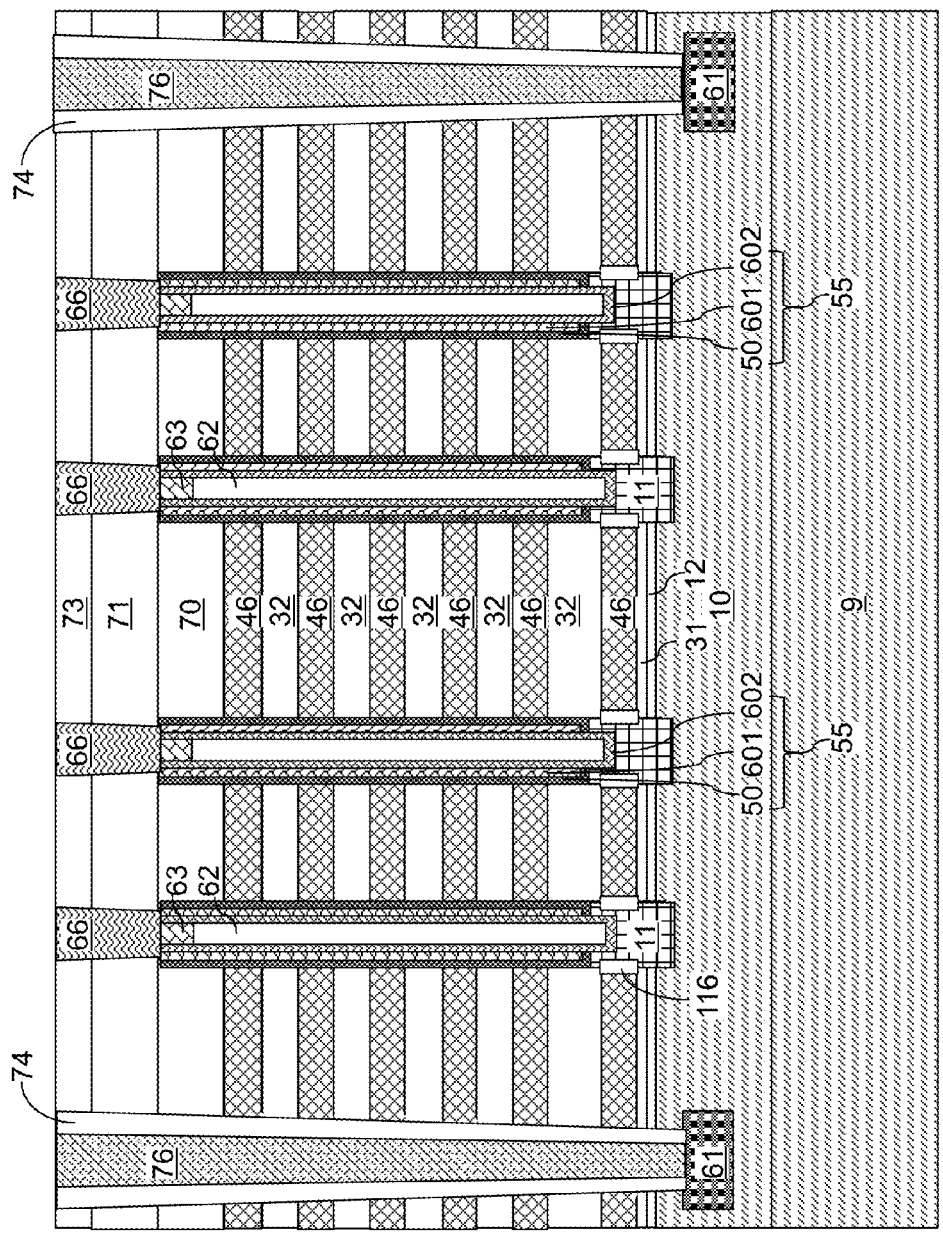
FIG. 30 is a vertical cross-sectional view of the fourth exemplary structure after formation of insulating spacers and backside contact via structures according to the fourth embodiment of the present disclosure.

Referring to FIG. 30, the processing steps of FIG. 7 of the first embodiment can be subsequently performed to remove the deposited conductive material of the contiguous conductive material layer 46L from the sidewalls of each backside contact trench 79 and from above the second array contact level dielectric layer 73, and to form an insulating spacer 74 and a backside contact via structure 76 within each backside contact trench 79.

Figure 31B:
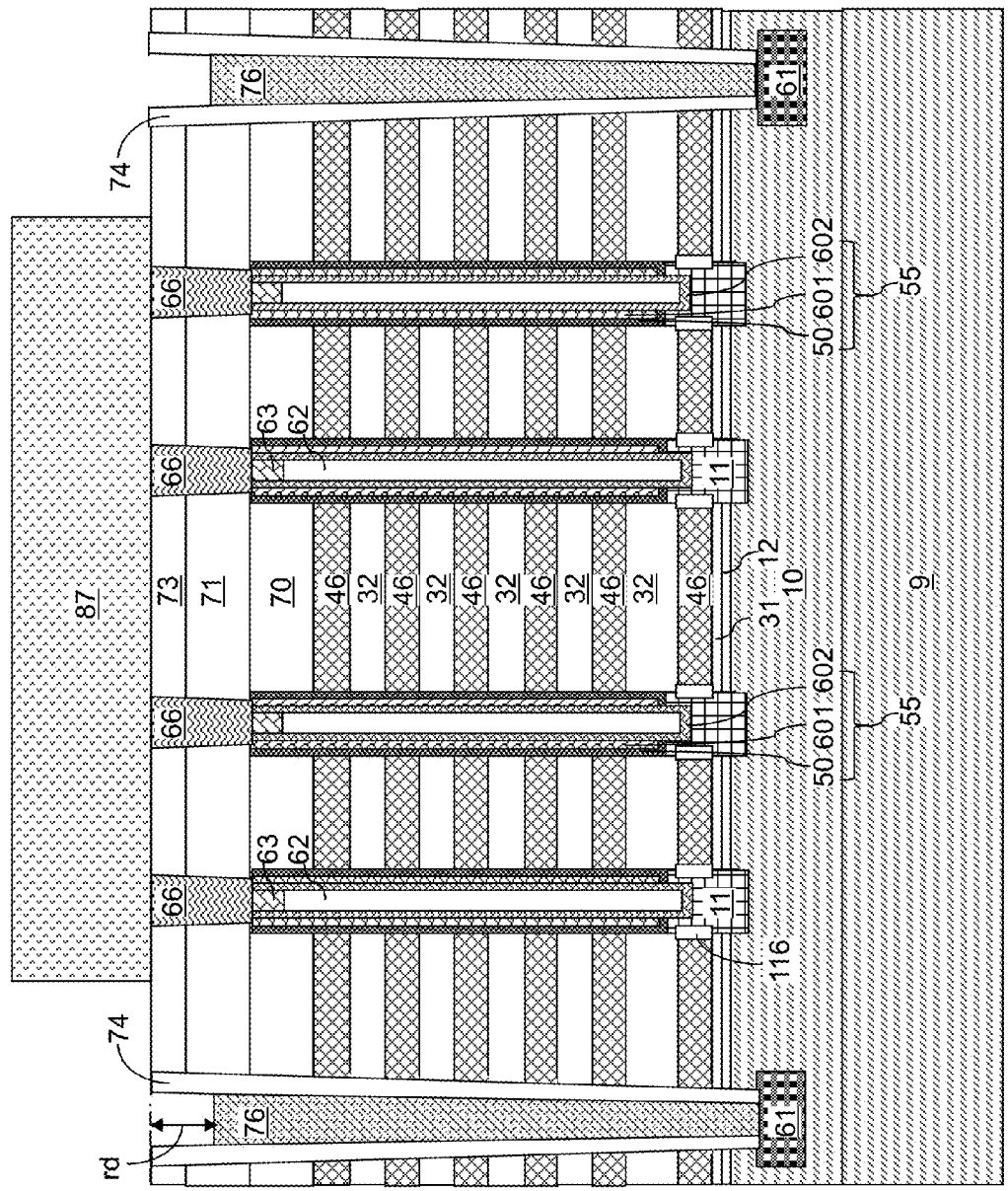
FIG. 31B is vertical cross-sectional views of the fourth exemplary structure along to the vertical plane of B-B' in FIG. 31A

Referring to FIGS. 31A and 31B, the processing steps of FIGS. 8A and 8B can be performed to vertically recess a first portion of the top surface of each backside contact via structures 76, while a second portion of the top surface of each backside contact via structure 76 is covered by the patterned photoresist layer 87, and thus, not recessed.

Figure 32:
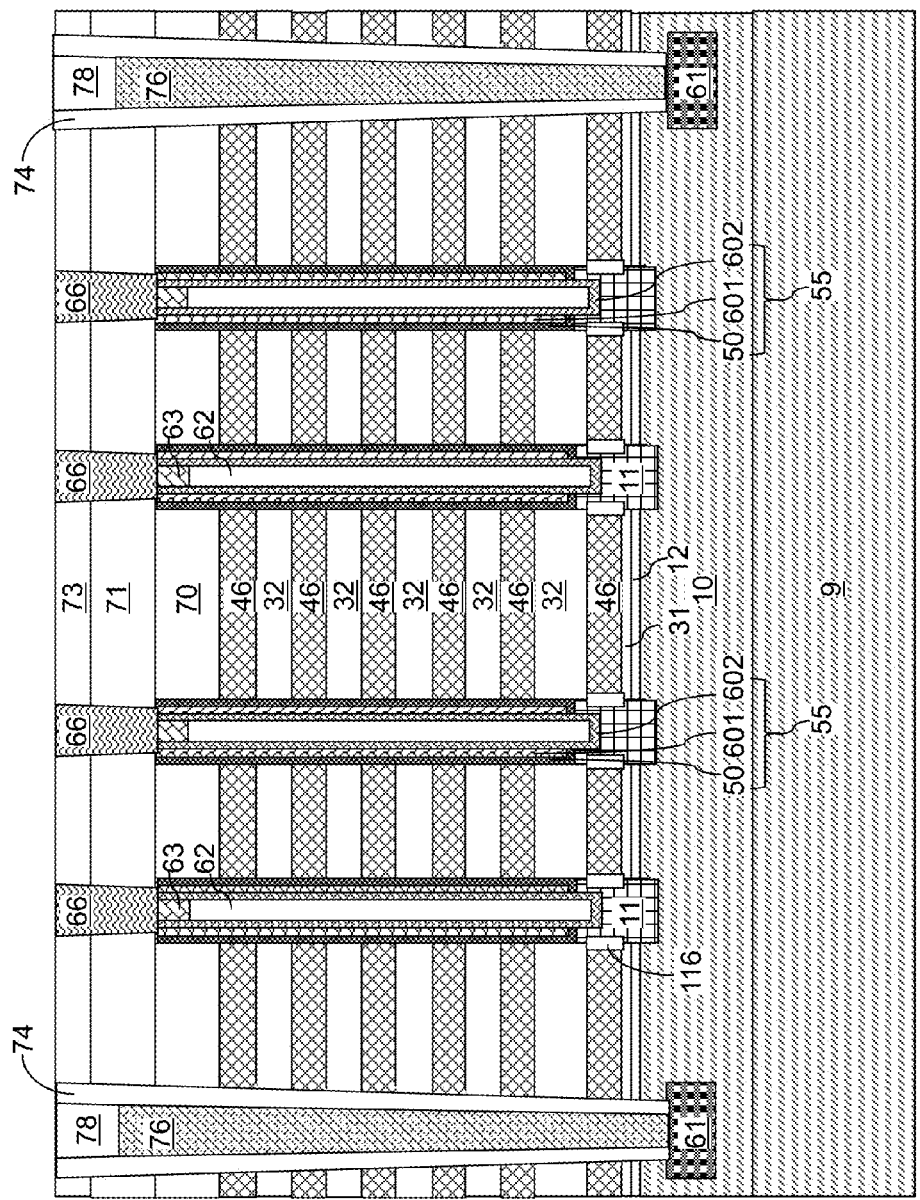
FIG. 32 is a vertical cross-sectional view of the fourth exemplary structure after formation of dielectric plugs in cavities overlying recessed backside contact via structures according to the fourth embodiment of the present disclosure.
Figure 33A:
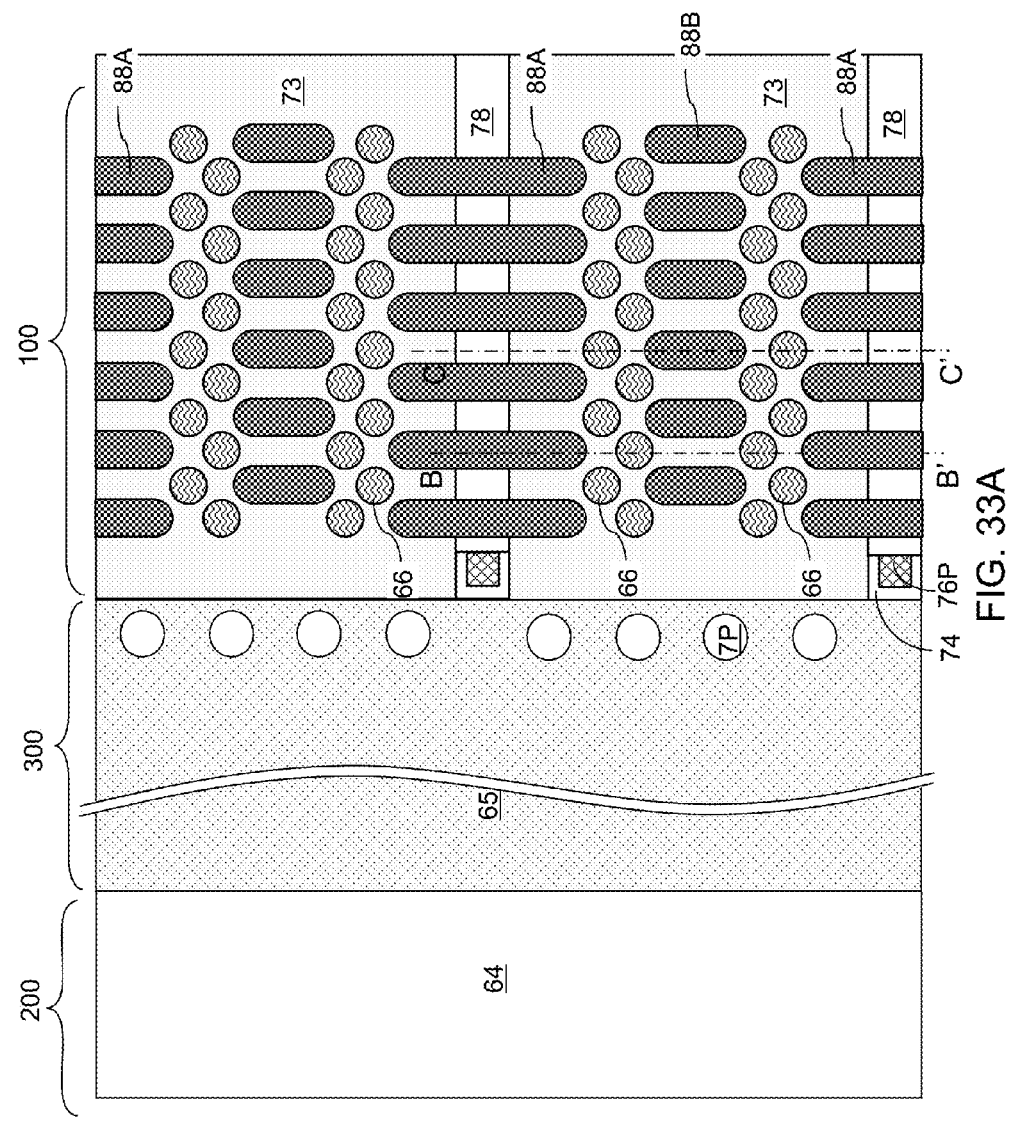
FIG. 33A is a see-through top-down view of the fourth exemplary structure after formation of bridge line structures connecting memory stack structures according to the fourth embodiment of the present disclosure. A bridge level dielectric layer is not shown in this see-through view.
Figure 33B:
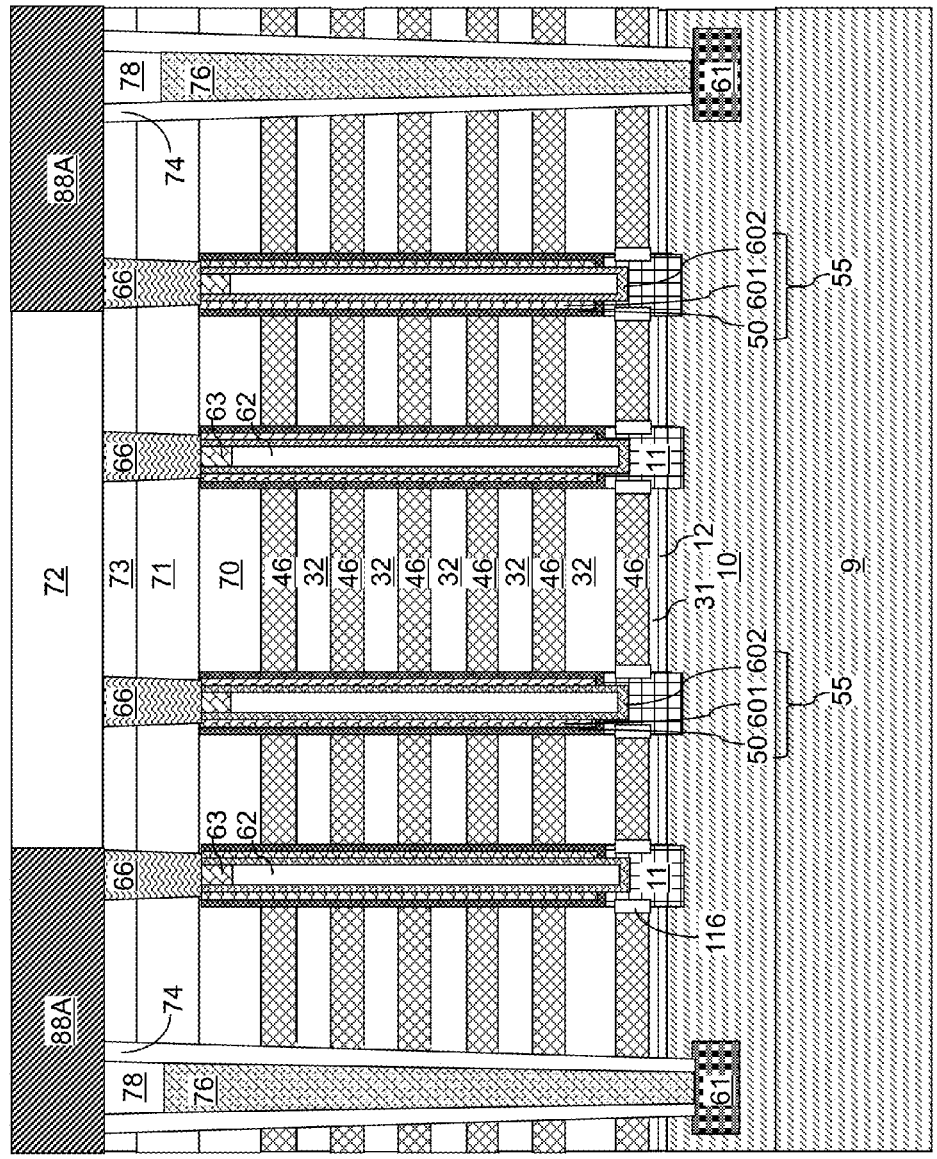
FIG. 33B is vertical cross-sectional views of the fourth exemplary structure along to the vertical plane of B-B' in FIG. 33A.
Figure 33C:
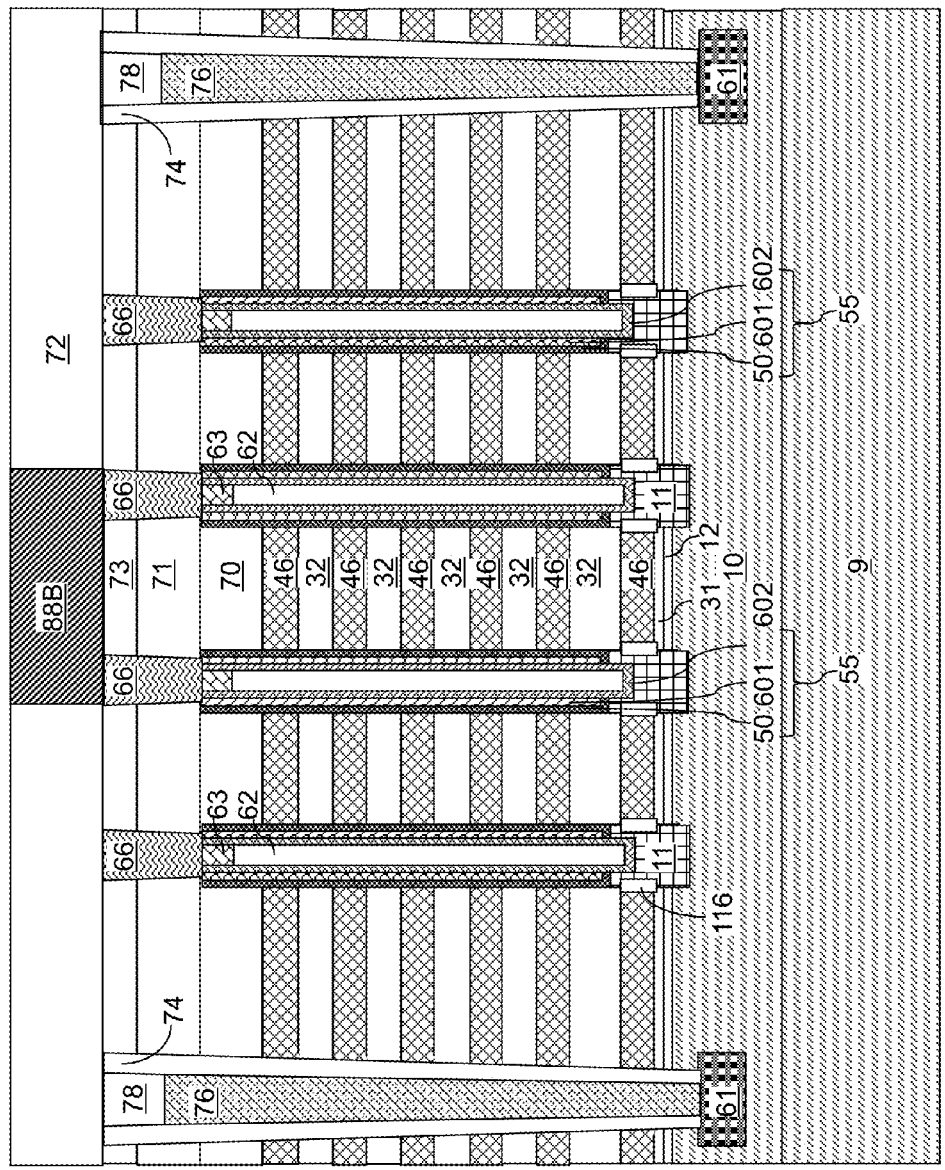
FIG. 33C is vertical cross-sectional views of the fourth exemplary structure along to the vertical plane of C-C' in FIG. 33A.
Figure 33D:
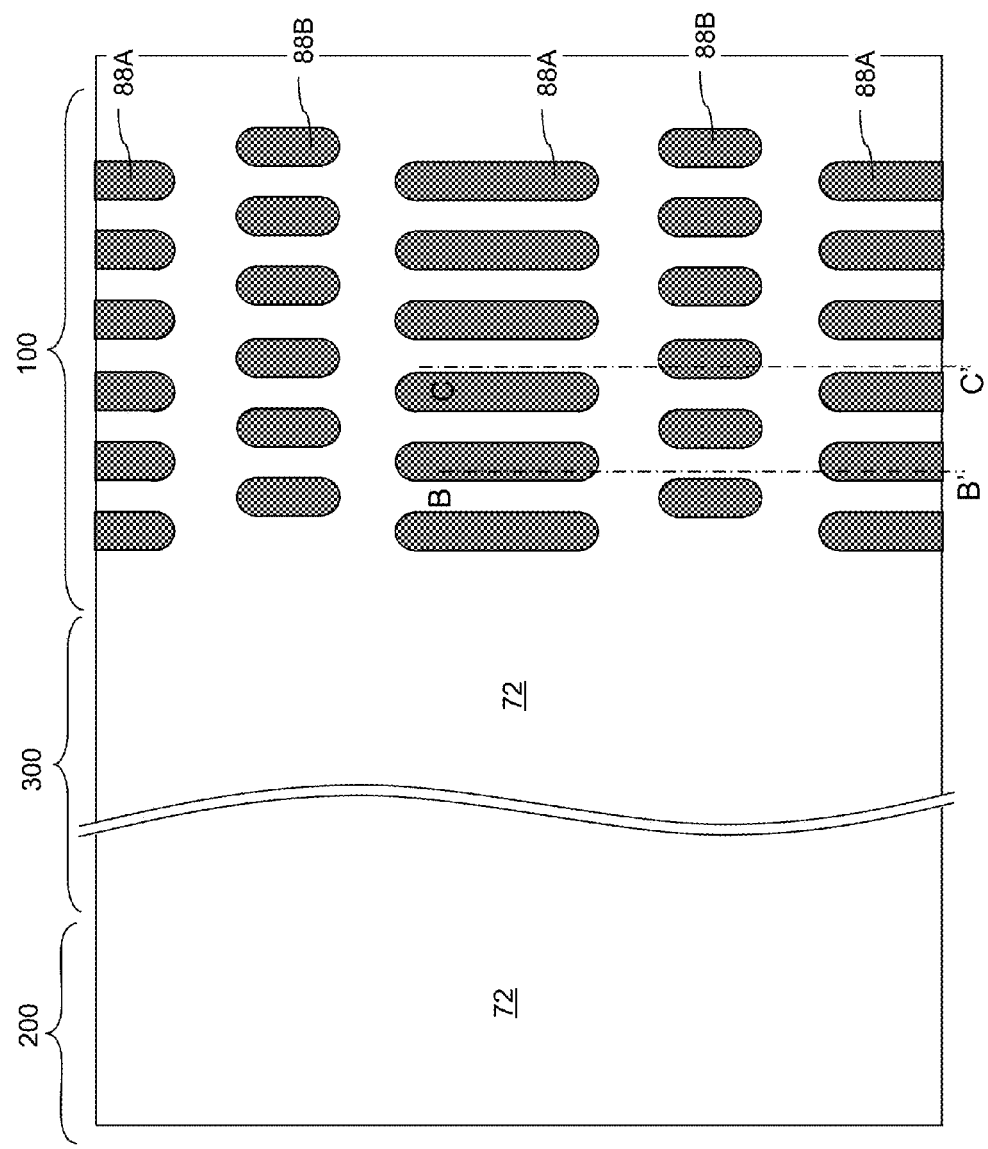
FIG. 33D is a top-down view of the fourth exemplary structure of FIGS. 33A-33C.
Figure 34B:
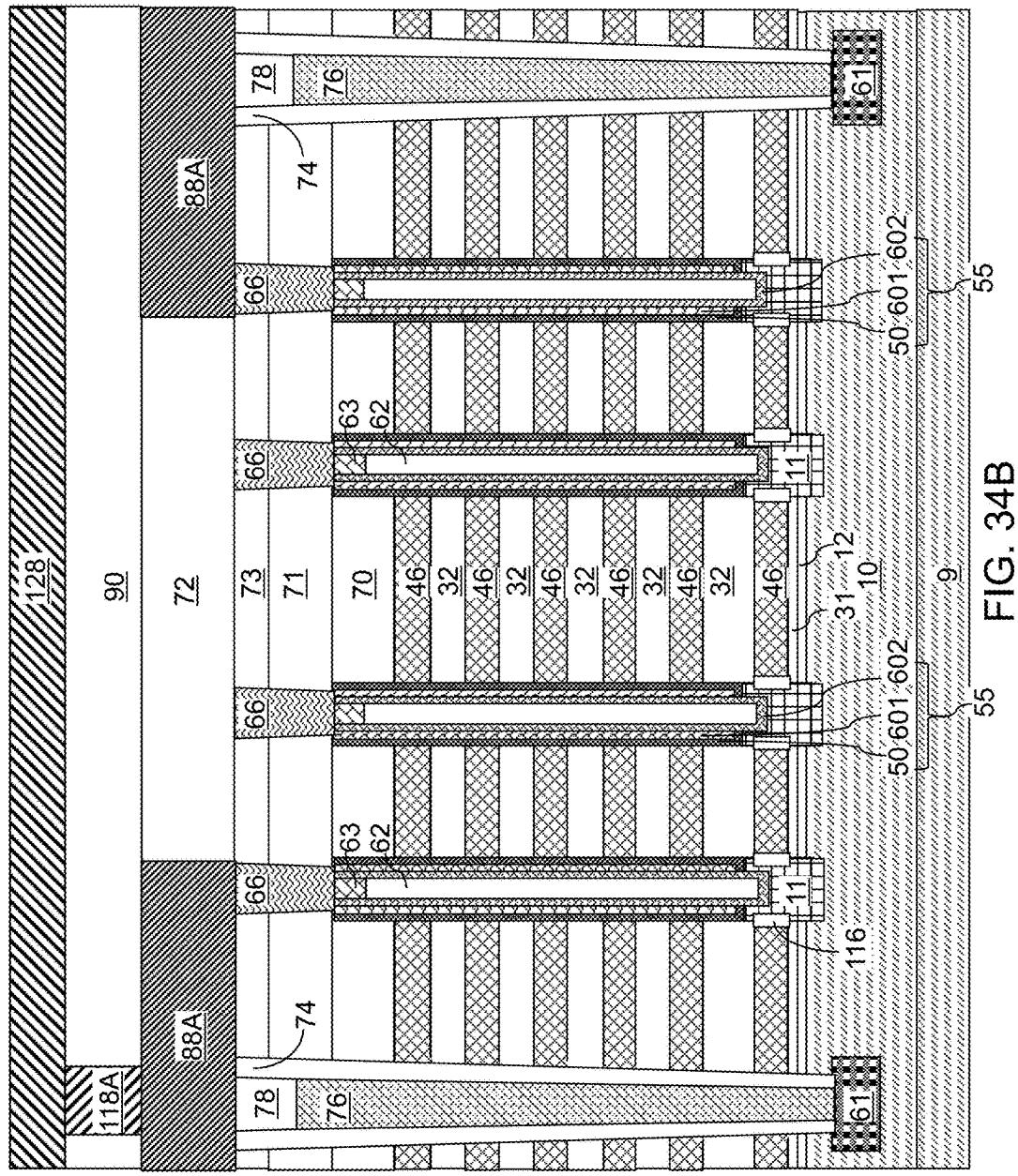
FIG. 34B is vertical cross-sectional views of the fourth exemplary structure along to the vertical plane of B-B' in FIG. 34A.
Figure 34C:
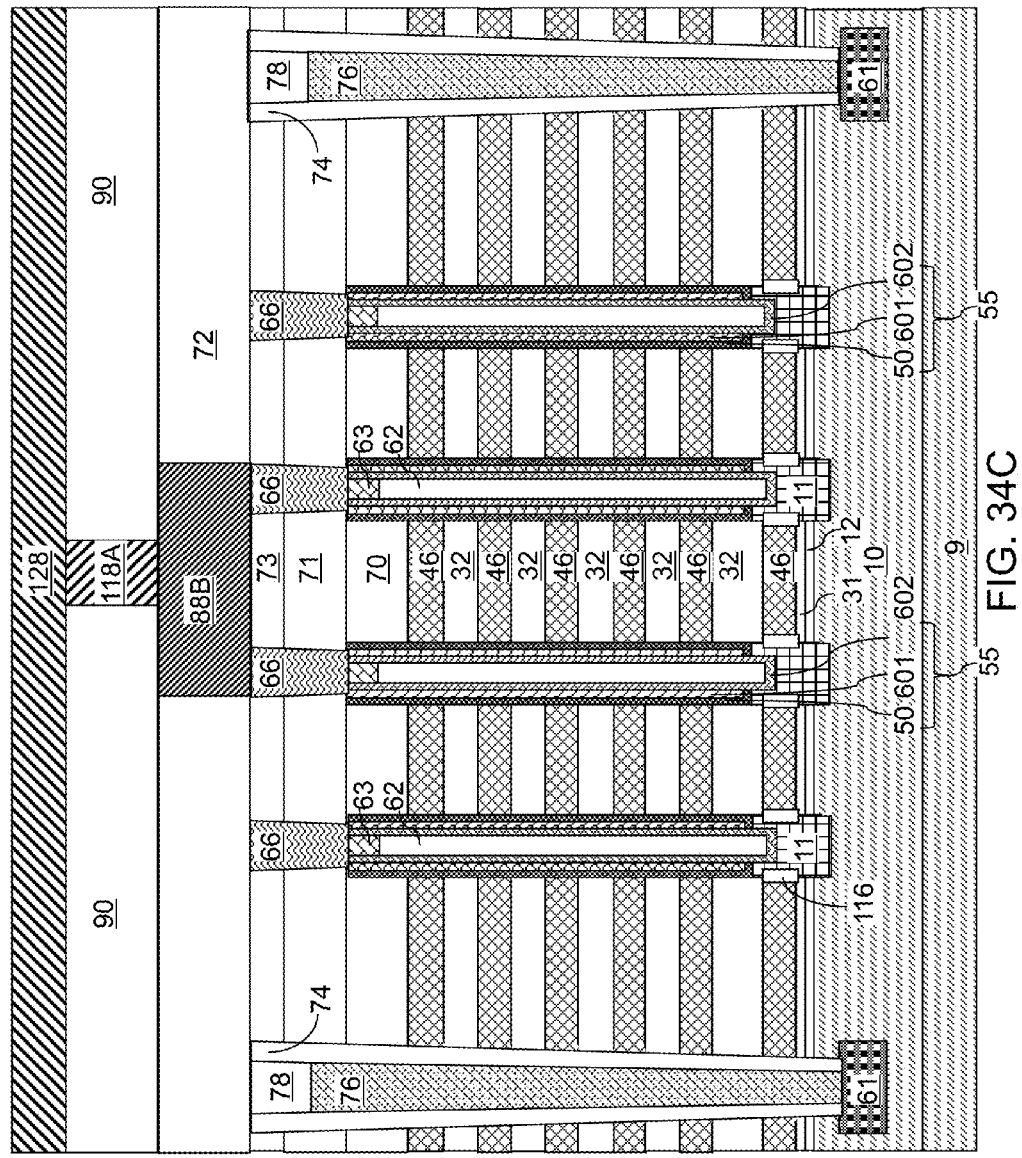
FIG. 34C is vertical cross-sectional views of the fourth exemplary structure along to the vertical plane of C-C' in FIG. 34A.
Figure 34D:
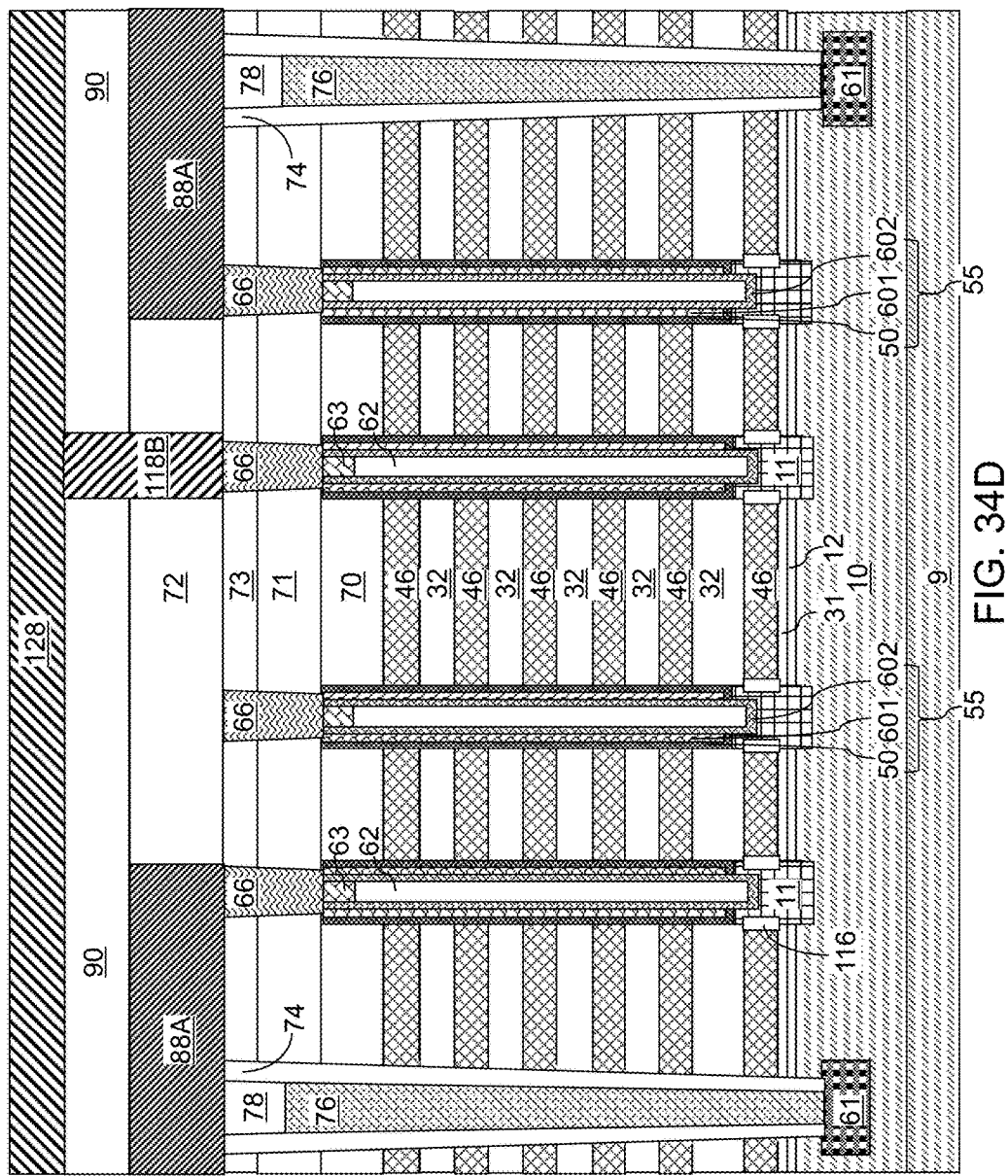
FIG. 34D is vertical cross-sectional views of the fourth exemplary structure along to the vertical plane of D-D' in FIG. 34A.

Referring to FIG. 32, the processing steps of FIG. 9 can be performed to form a dielectric plug 78 within each recessed region overlying a backside contact via structure 76 having stepped surfaces including two horizontal top surfaces located at different heights.

Referring to FIGS. 33A-33D, the processing steps of FIGS. 25A-25D can be performed to form a bridge level dielectric layer 72 over the at least one array contact level dielectric layer (71, 73), and to form bridge line structures (88A, 88B). The pattern of the bridge line structures (88A, 88B) can be any pattern discussed above. In one embodiment, bridge level via structures 88C are not formed as in the third embodiment. In this case, the processing steps can be the same as the processing steps of FIGS. 25A-25D. In another embodiment, bridge level via structures 88C can be formed as in the second embodiment. In this case, the processing steps can be the same as the processing steps of FIGS. 23A-23D.

Referring to FIGS. 34A-34D, the processing steps of FIGS. 26A-26D of the third embodiment can be performed in case the processing steps of FIGS. 25A-25D are previously performed. Alternatively, the processing steps of FIGS. 24A-24D of the second embodiment can be performed in case the processing steps of FIGS. 23A-23D are previously performed.

Each memory structure between a neighboring pair of backside contact via structures 76 can be electrically connected to a distinct bit line structure 128. Since the bit line structures 128 are laterally offset from one another along a direction perpendicular to the vertical cross-sectional views of FIGS. 34B, 34C, and 34D, only one first contact via structure 118A or only one second contact via structures 118B is illustrated in each of FIGS. 34B, 34C, and 34D. Every memory stack structure 55 may be electrically shorted to one of the bit line structures 128 by laterally staggering the contact via structures (118A, 118B) as illustrated in FIG. 11F and/or FIGS. 13-16.

While all vertical cross-sectional shapes of memory stack structures are illustrated as if the vertical cross-sectional plane cut through the geometrical center of each memory stack structure in the drawings, it is to be understood that the shapes of memory stack structures that are not cut through the geometrical centers thereof would have a narrower cross-sectional area, and may not show all components within a memory stack structure if the vertical cross-sectional plane is sufficiently offset from the geometrical center of a respective memory stack structure. Thus, the vertical cross-sectional views of the drawings are to be understood with proper modification to the components within the memory stack structures to be shown in true vertical cross-sectional views.

In one embodiment, the fourth exemplary structure can comprise a monolithic three-dimensional memory device. The monolithic three-dimensional memory device can include a stack of alternating layers comprising insulating layers 32 and electrically conductive layers 46 and located over a substrate (9, 10); a plurality of memory stack structures 55 extending through the stack (32, 46); an array of memory contact via structures 66 overlying each of the plurality of memory stack structures 55; at least one bridge line structure (88A, 88B) contacting top surfaces of a respective subset of memory contact via structures 66; an array of bit line structures 128 overlying the at least one bridge line structure (88A, 88B); at least one first contact via structure 118A contacting a respective bit line structure 128 within the array of bit line structures and contacting a respective bridge line structure (88A, 88B); and second contact via structures 118B contacting a respective bit line structure 128 within the array of bit line structures and contacting a respective memory contact via structure 66.

In one embodiment, each bottom surface of the at least one bridge line structure (88A, 88B) can be coplanar with top surfaces of the array of memory contact via structures 66. In one embodiment, each bottom surface of the at least one first contact via structure 118A can be located above a horizontal plane including top surfaces of the memory contact via structures 66. In one embodiment, each bottom surface of the at least one first contact via structure 118A can be located above a horizontal plane including bottom surfaces of the second contact via structures 118B. In one embodiment, the height of the second contact via structures 118B can be the same as the sum of the height of the at least one bridge line structure (88A, 88B) and the height of the at least one first contact via structure 118A.

In one embodiment, each of the at least one first contact via structure 118A and the at least one second contact via structure 118B comprises a conductive metallic liner (218A, 218B) having a first metallic composition and a conductive fill material portion (318A, 318B) having a second metallic composition as illustrated in FIG. 12. In one embodiment, the at least one first contact via structure 118A and the at least one second contact via structure 118B are elongated along a lengthwise direction of the bit line structures 128 within the array of bit line structures.

In one embodiment, a backside contact via structure 76 can extend through the stack (32, 46) and can contact a portion of the substrate (9, 10, 61). A first type bridge line structure 88A straddles the backside contact via structure 76 without contacting the backside contact via structure 76. The horizontal surface of a portion of the backside contact via structure 76 that underlies a first type bridge line structure 88A can be recessed below the horizontal plane including each bottom surface of the first type bridge line structures 88A.

In one embodiment, a topmost surface of the backside contact via structure 76 (i.e., the unrecessed peripheral portion 76P of the backside contact via structure 76) can be coplanar with the horizontal plane including each bottom surface of the at least one bridge line structure (88A, 88B). A plurality of bridge line structures (88A, 88B) can laterally extend along a direction parallel to the array of bit line structures 128, i.e., along the second horizontal direction, and can straddle the backside contact via structure 76.

A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In one embodiment, a set of memory stack structures 55 can form a one-dimensional array extending along the first horizontal direction hd1, i.e., the lengthwise direction of the backside contact via structure 76. The pitch of the one-dimensional array of memory stack structures 55 is herein referred to as a memory hole pitch p0. The memory contact via structures 66 can have the same pitch as the underlying memory stack structures 55. Thus, a set of memory contact via structures 66 can form a one-dimensional array extending along the first horizontal direction hd1.

Figure 35:
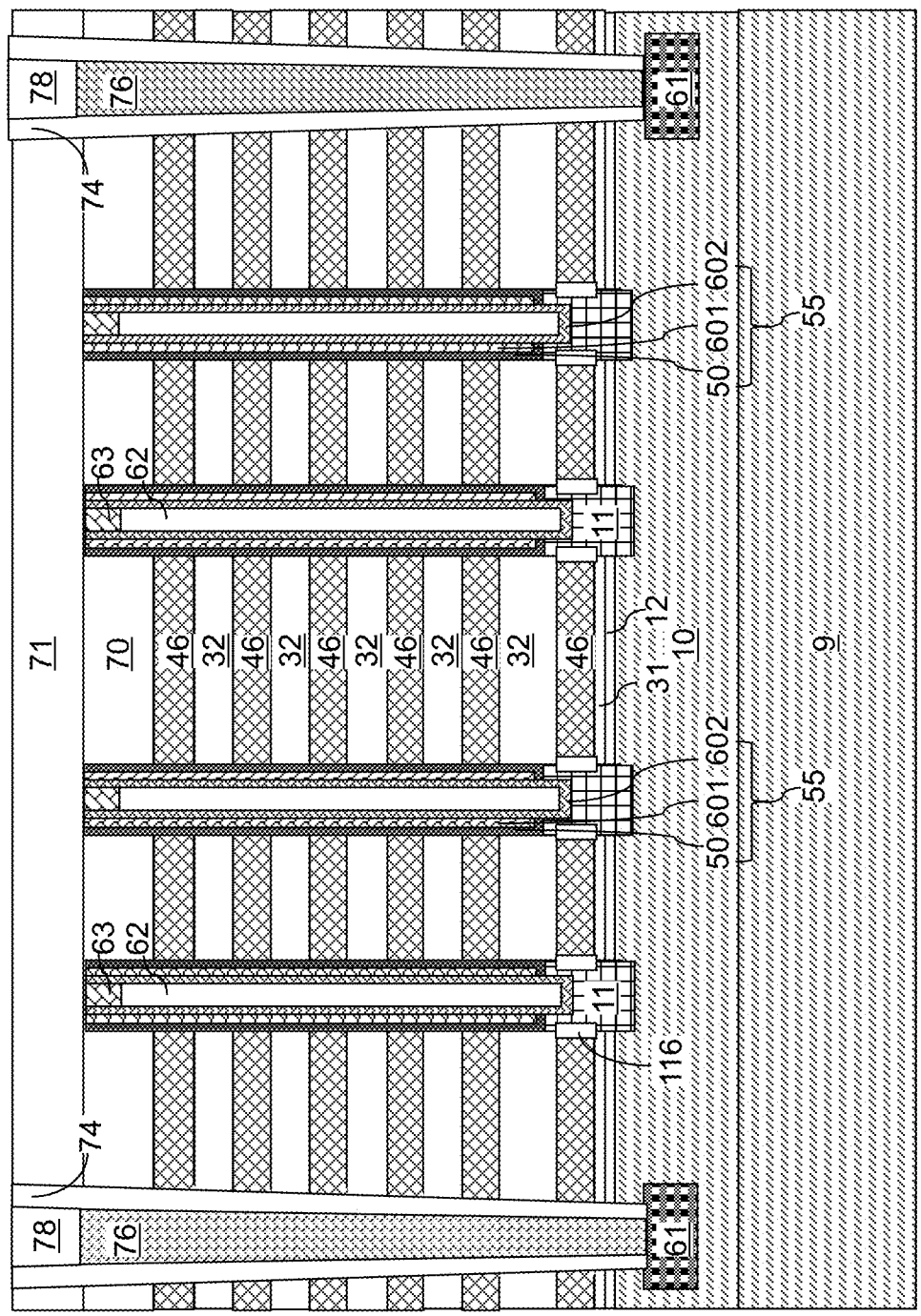
FIG. 35 is vertical cross-sectional views of an alternate embodiment the fourth exemplary structure after formation of dielectric plugs.

Referring to FIG. 35, an alternate embodiment of the fourth exemplary structure is illustrated, which is derived from the fourth exemplary structure of FIG. 4 by postponing formation of the second array contact level dielectric layer 73 and at least one dielectric support pillar 7P until after formation of the dielectric plugs 78. In other words, after the processing steps of FIG. 4, the processing steps for formation of the second array contact level dielectric layer 73 and at least one dielectric support pillar 7P are not performed, and then the rest of the processing steps of FIGS. 5A and 5B is performed. Subsequently, the processing steps of FIGS. 6, 7, 8A and 8B, and 9 are performed to provide the structure illustrated in FIG. 35. The first array contact level dielectric layer 73 can be employed as a stopping layer during planarization of a dielectric material that forms the dielectric plugs 78.

Figure 36:
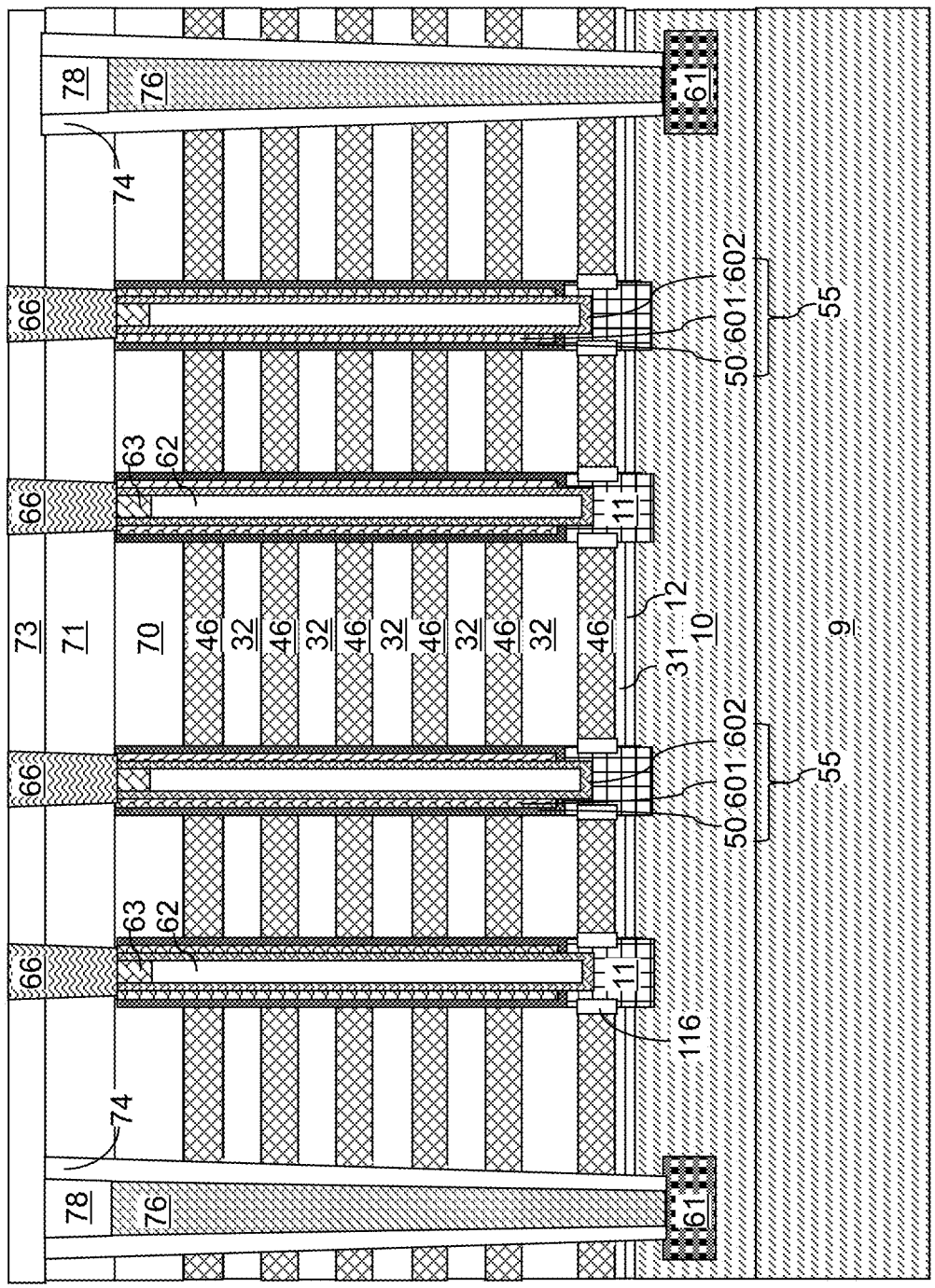
FIG. 36 is vertical cross-sectional views of the alternate embodiment the fourth exemplary structure after formation of memory contact via structures.

Referring to FIG. 36, at least one dielectric support pillar 7P and the second array contact level dielectric layer 73 can be formed employing the same processing steps as in the first embodiment (e.g., a subset of the processing steps of FIG. 5 as applied to the at least one dielectric support pillar 7P and the second array contact level dielectric layer 73).

Subsequently, memory contact via structures 66 can be formed employing the processing steps of FIGS. 28A-28D.

Figure 37:
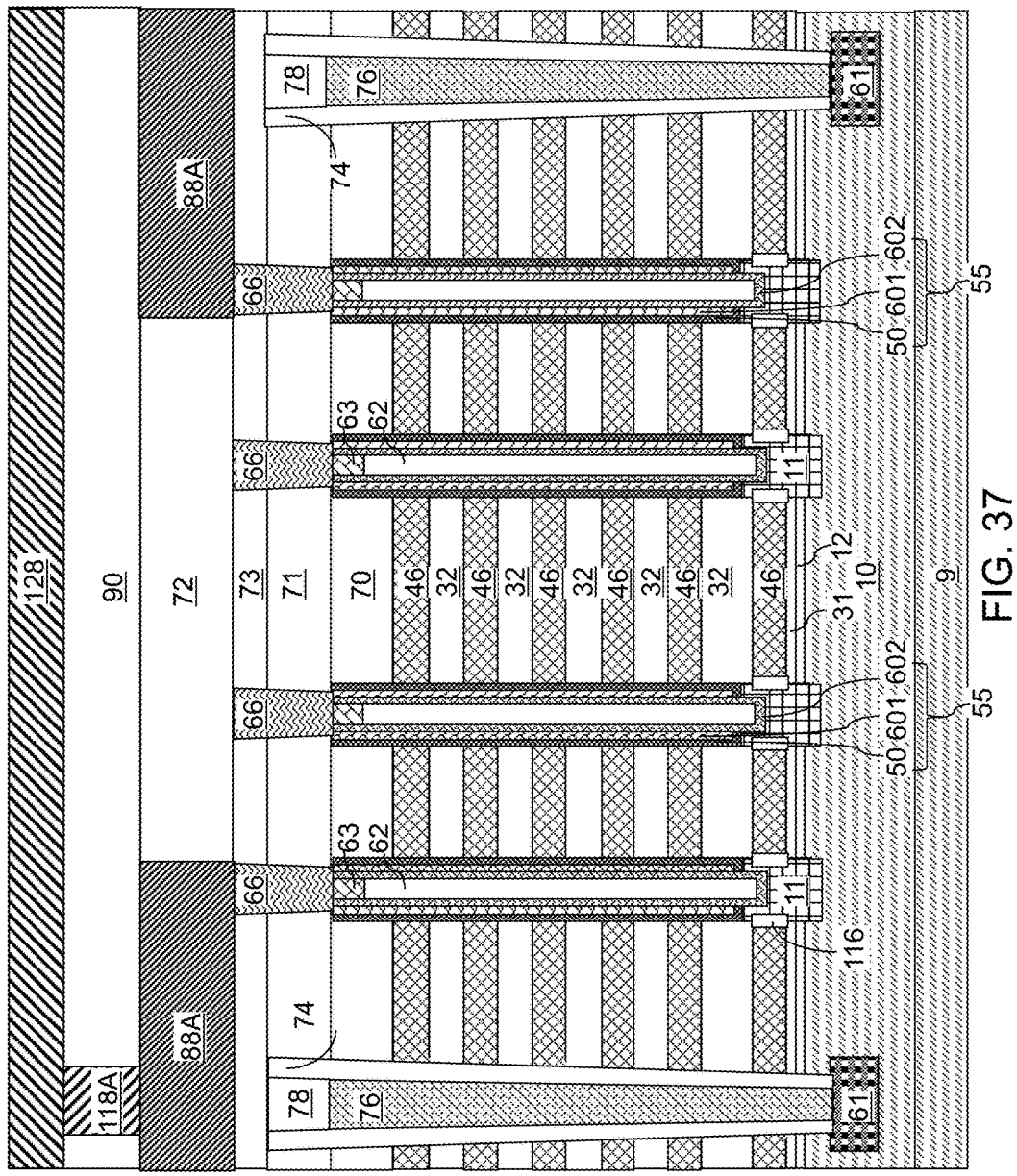
FIG. 37 is vertical cross-sectional views of the alternate embodiment the fourth exemplary structure after formation of bit line structures.

Referring to FIG. 37, subsequent processing steps of the fourth embodiment can be performed to provide an alternate embodiment of the fourth exemplary structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   a stack of alternating layers comprising insulating layers and electrically conductive layers and located over a substrate;
   a plurality of memory stack structures extending through the stack;
   at least one bridge line structure contacting top surfaces of a respective subset of the plurality of memory stack structures;
   an array of bit line structures overlying the at least one bridge line structure;
   at least one first contact via structure contacting a respective bit line structure within the array of bit line structures and contacting a respective bridge line structure; and
   second contact via structures contacting a respective bit line structure within the array of bit line structures and contacting a respective memory stack structure,
   wherein the monolithic three-dimensional memory device has at least one feature selected from:
   a first feature that each bottom surface of the at least one first contact via structure is located above a horizontal plane including top surfaces of the plurality of memory stack structures;
   a second feature that a height of the second contact via structures is the same as a sum of a height of the at least one bridge line structure and a height of the at least one first contact via structure;
   a third feature that each of the at least one first contact via structure and the at least one second contact via structure comprises a conductive metallic liner having a first metallic composition and a conductive fill material portion having a second metallic composition, and the at least one first contact via structure and the at least one second contact via structure are elongated along a lengthwise direction of the bit line structures within the array of bit line structures; or
   a fourth feature that the monolithic three-dimensional memory device further comprises a backside contact via structure extending through the stack and contacting a portion of the substrate, wherein the at least one bridge line structure straddles the backside contact via structure without contacting the backside contact via structure.

2. The monolithic three-dimensional memory device of claim 1, wherein each bottom surface of the at least one bridge line structure is coplanar with top surfaces of the plurality of memory stack structures.

3. The monolithic three-dimensional memory device of claim 1, wherein the monolithic three-dimensional memory device has the first feature.

4. The monolithic three-dimensional memory device of claim 1, wherein each bottom surface of the at least one first contact via structure is located above a horizontal plane including bottom surfaces of the second contact via structures.

5. The monolithic three-dimensional memory device of Claim 1, wherein the monolithic three-dimensional memory device has the second feature.

6. The monolithic three-dimensional memory device of claim 1, wherein the monolithic three-dimensional memory device has the third feature.

7. The monolithic three-dimensional memory device of claim 1, wherein the monolithic three-dimensional memory device has the fourth feature.

8. The monolithic three-dimensional memory device of claim 7, wherein:
   a horizontal surface of a portion of the backside contact via structure that underlies the at least one bridge line structure is recessed below a horizontal plane including each bottom surface of the at least one bridge line structure; and
   a topmost surface of the backside contact via structure is coplanar with the horizontal plane including each bottom surface of the at least one bridge line structure.

9. The monolithic three-dimensional memory device of claim 7, wherein:
   the at least one bridge line structure comprises a plurality of bridge line structures that laterally extend along a direction parallel to the array of bit line structures; and
   one or more of the plurality of bridge line structures straddle the backside contact via structure.

10. The monolithic three-dimensional memory device of claim 7, further comprising:
    a source region comprising a doped semiconductor material, located within, or on, the substrate, and contacting a bottom surface of the backside contact via structure;
    a plurality of vertical semiconductor channels located within the memory stack structures; and
    a horizontal semiconductor channel contacting the source region and electrically shorted to the plurality of vertical semiconductor channels.

11. The monolithic three-dimensional memory device of claim 1, wherein each memory stack structure within the plurality of memory stack structures has a greater lateral width along a horizontal direction that is perpendicular to a lengthwise direction of the array of bit line structures.

12. A monolithic three-dimensional memory device comprising:
    a stack of alternating layers comprising insulating layers and electrically conductive layers and located over a substrate;
    a plurality of memory stack structures extending through the stack;
    at least one bridge line structure contacting top surfaces of a respective subset of the plurality of memory stack structures;
    an array of bit line structures overlying the at least one bridge line structure;
    at least one first contact via structure contacting a respective bit line structure within the array of bit line structures and contacting a respective bridge line structure; and
    second contact via structures contacting a respective bit line structure within the array of bit line structures and contacting a respective memory stack structure,
   wherein:
    each memory stack structure comprises a plurality of vertically stacked memory elements and a vertical semiconductor channel; and
    each memory stack structure within the plurality of memory stack structures is electrically connected to a respective vertical semiconductor channel,
   wherein:
    each memory stack structure comprises, from outside to inside:
      at least one blocking dielectric;
      a memory material layer;
      a tunneling dielectric; and
      a respective vertical semiconductor channel;
    the monolithic three-dimensional memory device further comprises an array of drain regions contacting a respective vertical semiconductor channel; and
    a conductive element selected from a bit line structure and a second contact via structure contacts a top surface of a respective drain region within the array of drain regions.

13. A monolithic three-dimensional memory device comprising:
    a stack of alternating layers comprising insulating layers and electrically conductive layers and located over a substrate;
    a plurality of memory stack structures extending through the stack;
    at least one bridge line structure contacting top surfaces of a respective subset of the plurality of memory stack structures;
    an array of bit line structures overlying the at least one bridge line structure;
    at least one first contact via structure contacting a respective bit line structure within the array of bit line structures and contacting a respective bridge line structure; and
    second contact via structures contacting a respective bit line structure within the array of bit line structures and contacting a respective memory stack structure,
   wherein:
    the monolithic three-dimensional memory device comprises a vertical NAND device located over the substrate;
    the electrically conductive layers comprise, or are electrically connected to, a respective word line of the vertical NAND device;
    the substrate comprises a silicon substrate;
    the vertical NAND device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon; and the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

14. A monolithic three-dimensional memory device comprising:
- a stack of alternating layers comprising insulating layers and electrically conductive layers and located over a substrate;
- a plurality of memory stack structures extending through the stack;
- at least one bridge line structure contacting top surfaces of a respective subset of the plurality of memory stack structures;
- bridge level via structures located at a same level as the at least one bridge line structure, wherein each of the bridge level via structures contacts no more than a respective single memory stack structure among the plurality of memory stack structures;
- an array of bit line structures overlying the at least one bridge line structure;
- at least one first contact via structure contacting a respective bit line structure within the array of bit line structures and contacting a respective bridge line structure; and
- second contact via structures contacting a respective bit line structure within the array of bit line structures and contacting a respective bridge level via structure, wherein the monolithic three-dimensional memory device has at least one feature selected from:
- a first feature that each bottom surface of the at least one bridge line structure and each bottom surface of the bridge level via structures are coplanar with top surfaces of the plurality of memory stack structures;
- a second feature that the monolithic three-dimensional memory device further comprises a backside contact via structure extending through the stack and contacting a portion of the substrate, wherein the at least one bridge line structure straddles the backside contact via structure without contacting the backside contact via structure; or
- a third feature that:
  - the monolithic three-dimensional memory device comprises a vertical NAND device located over the substrate;
  - the electrically conductive layers comprise, or are electrically connected to, a respective word line of the vertical NAND device;
  - the substrate comprises a silicon substrate;
  - the vertical NAND device comprises an array of monolithic three-dimensional NAND strings over the silicon substrate;
  - at least one memory cell in a first device level of the array of monolithic three-dimensional NAND strings is located over another memory cell in a second device level of the array of monolithic three-dimensional NAND strings;
  - the silicon substrate contains an integrated circuit comprising a driver circuit for the memory device located thereon; and
  - the array of monolithic three-dimensional NAND strings comprises:
    - a plurality of semiconductor channels, wherein at least one end portion of each of the plurality of semiconductor channels extends substantially perpendicular to a top surface of the substrate;
    - a plurality of charge storage elements, each charge storage element located adjacent to a respective one of the plurality of semiconductor channels; and
    - a plurality of control gate electrodes having a strip shape extending substantially parallel to the top surface of the substrate, the plurality of control gate electrodes comprise at least a first control gate electrode located in the first device level and a second control gate electrode located in the second device level.

15. The monolithic three-dimensional memory device of claim 14, wherein the monolithic three-dimensional memory device has the first feature.

16. The monolithic three-dimensional memory device of claim 14, wherein the monolithic three-dimensional memory device has the second feature.

17. The monolithic three-dimensional memory device of claim 16, wherein:
- a horizontal surface of a portion of the backside contact via structure that underlies the at least one bridge line structure is recessed below a horizontal plane including each bottom surface of the at least one bridge line structure; and
- a topmost surface of the backside contact via structure is coplanar with the horizontal plane including each bottom surface of the at least one bridge line structure.

18. The monolithic three-dimensional memory device of claim 14, wherein the monolithic three-dimensional memory device has the third feature.

19. A monolithic three-dimensional memory device comprising:
- a stack of alternating layers comprising insulating layers and electrically conductive layers and located over a substrate;
- a plurality of memory stack structures extending through the stack;
- an array of memory contact via structures overlying each of the plurality of memory stack structures;
- at least one bridge line structure contacting top surfaces of a respective subset of memory contact via structures;
- an array of bit line structures overlying the at least one bridge line structure;
- at least one first contact via structure contacting a respective bit line structure within the array of bit line structures and contacting a respective bridge line structure; and
- second contact via structures contacting a respective bit line structure within the array of bit line structures and contacting a respective memory contact via structure, wherein the monolithic three-dimensional memory device has at least one feature selected from:
- a first feature that each bottom surface of the at least one first contact via structure is located above a horizontal plane including top surfaces of the memory contact via structures; or a second feature that the monolithic three-dimensional memory device further comprises a backside contact via structure extending through the stack and contacting a portion of the substrate, wherein the at least one bridge line structure straddles the backside contact via structure without contacting the backside contact via structure, and a horizontal surface of a portion of the backside contact via structure that underlies the at least one bridge line structure is recessed below a horizontal plane including each bottom surface of the at least one bridge line structure, and a topmost surface of the backside contact via structure is coplanar with the horizontal plane including each bottom surface of the at least one bridge line structure.

20. The monolithic three-dimensional memory device of claim 19, wherein each bottom surface of the at least one bridge line structure is coplanar with top surfaces of the array of memory contact via structures.

21. The monolithic three-dimensional memory device of claim 19, wherein the monolithic three-dimensional memory device has the first feature.

22. The monolithic three-dimensional memory device of claim 19, wherein the monolithic three-dimensional memory device has the second feature.

23. A monolithic three-dimensional memory device comprising:
   a stack of alternating layers comprising insulating layers and electrically conductive layers and located over a substrate;
   a plurality of memory stack structures extending through the stack;
   an array of memory contact via structures overlying each of the plurality of memory stack structures;
   at least one bridge line structure contacting top surfaces of a respective subset of memory contact via structures;
   an array of bit line structures overlying the at least one bridge line structure;
   at least one first contact via structure contacting a respective bit line structure within the array of bit line structures and contacting a respective bridge line structure; and
   second contact via structures contacting a respective bit line structure within the array of bit line structures and contacting a respective memory contact via structure,
wherein:
   the monolithic three-dimensional memory device comprises a vertical NAND device located over the substrate;
   the electrically conductive layers comprise, or are electrically connected to, a respective word line of the vertical NAND device;
   the substrate comprises a silicon substrate;
   the vertical NAND device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
      a plurality of semiconductor channels, wherein at least one end portion of each of the plurality of semiconductor channels extends substantially perpendicular to a top surface of the substrate;
      a plurality of charge storage elements, each charge storage element located adjacent to a respective one of the plurality of semiconductor channels; and
      a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *